United States Patent
Kamoshida et al.

(10) Patent No.: US 7,233,513 B2
(45) Date of Patent: Jun. 19, 2007

(54) SEMICONDUCTOR MEMORY DEVICE WITH MOS TRANSISTORS EACH HAVING FLOATING GATE AND CONTROL GATE

(75) Inventors: Masahiro Kamoshida, Yokohama (JP); Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 11/153,531

(22) Filed: Jun. 16, 2005

(65) Prior Publication Data

US 2006/0083045 A1    Apr. 20, 2006

(30) Foreign Application Priority Data

Oct. 14, 2004   (JP)   ............... 2004-300791

(51) Int. Cl.
*G11C 5/06* (2006.01)
(52) U.S. Cl. .................................. 365/63; 365/185.13
(58) Field of Classification Search .................. 365/63, 365/185.13; 257/316
See application file for complete search history.

(56) References Cited

U.S. PATENT DOCUMENTS 6,570,214 B1 * 5/2003 Wu .............................. 257/315
6,853,029 B2 * 2/2005 Ichige et al. .................. 257/316

OTHER PUBLICATIONS

Wei-Hua Liu, et al., "A 2-Transistor Source-select (2TS) Flash EEPROM for 1.8V-Only Applications" Non-Volatile Semiconductor Memory Workshop 4.1, Feb. 1997, pp. 1-3.

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor memory device includes memory cells, a memory cell array, word lines, a row decoder, first metal wiring layers, and metal wiring lines. The memory cell includes a first MOS transistor having a charge accumulation layer and a control gate. Each word line is formed by connecting commonly the control gates in a same row. The row decoder selects any one of the word lines. The first metal wiring layers are provided for the word lines in a one-to-one correspondence. The first metal wiring layers are electrically connected to the corresponding ones of the word lines and transmit a first row select signal for the row decoder to select one of the word lines. The metal wiring lines are formed at a plurality of levels. The first metal wiring layers are made of the metal wiring lines located at the level of the lowest layer.

19 Claims, 55 Drawing Sheets

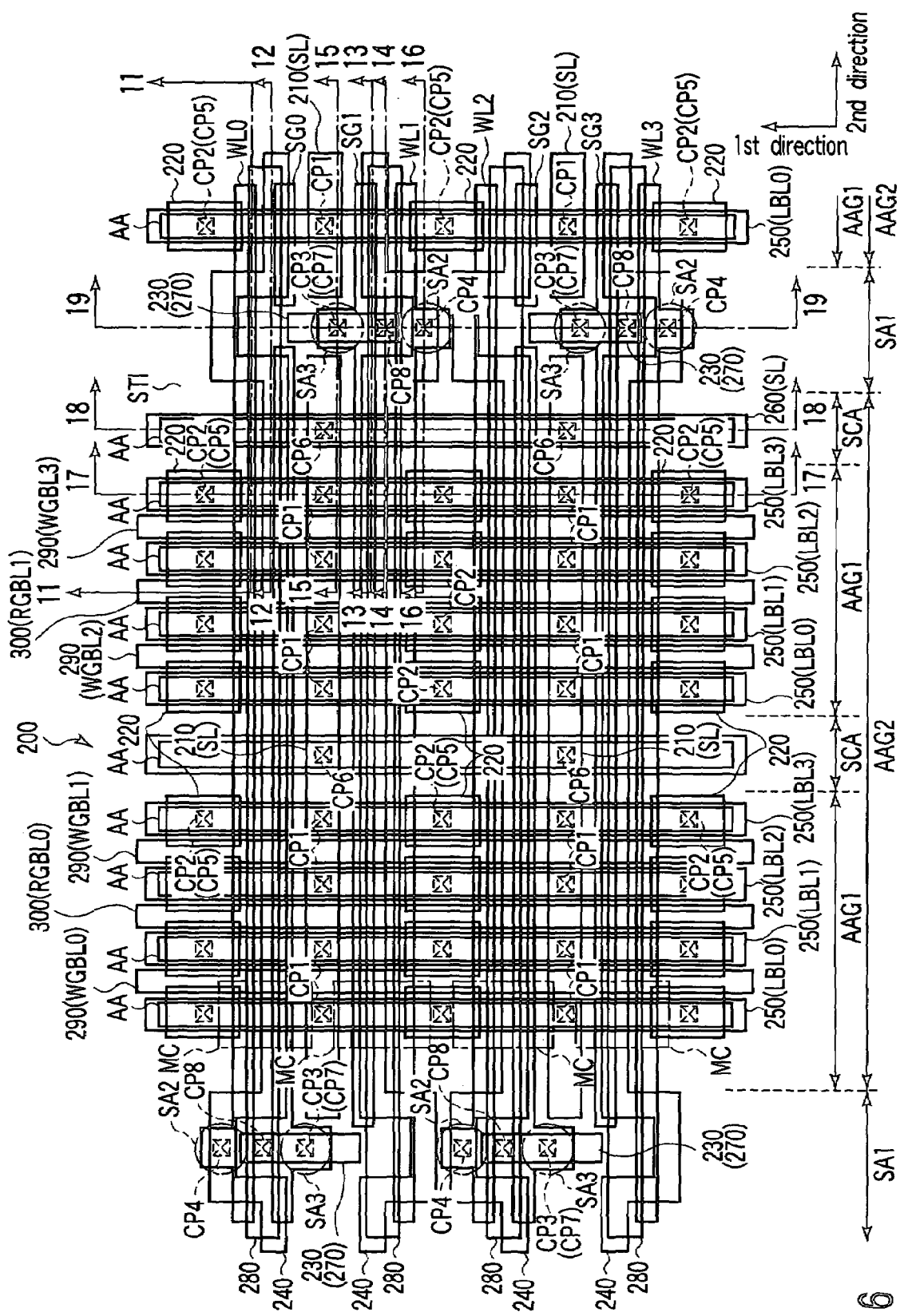
F I G. 6

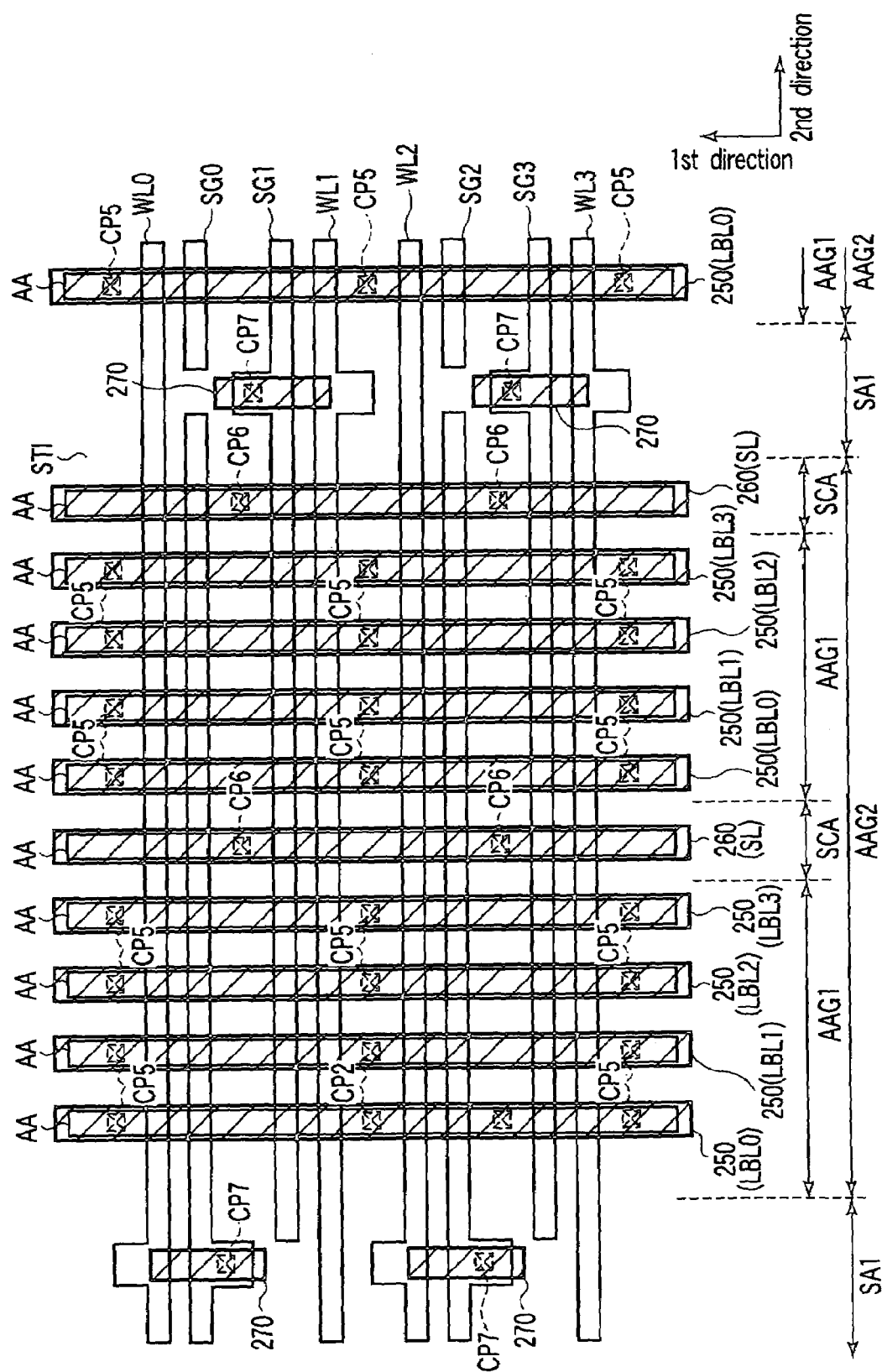
F I G. 8

READ OPERATION

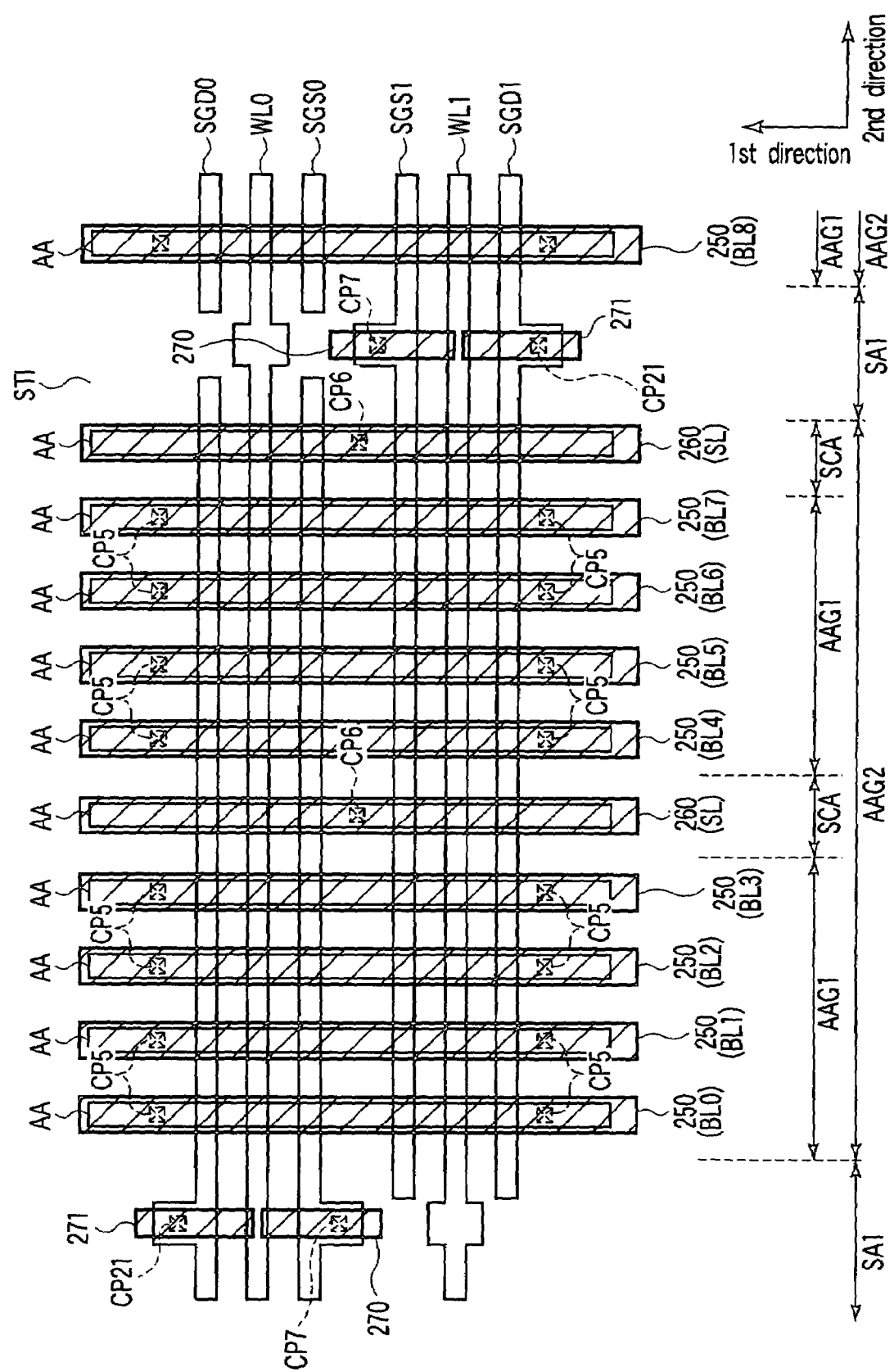
F I G. 37

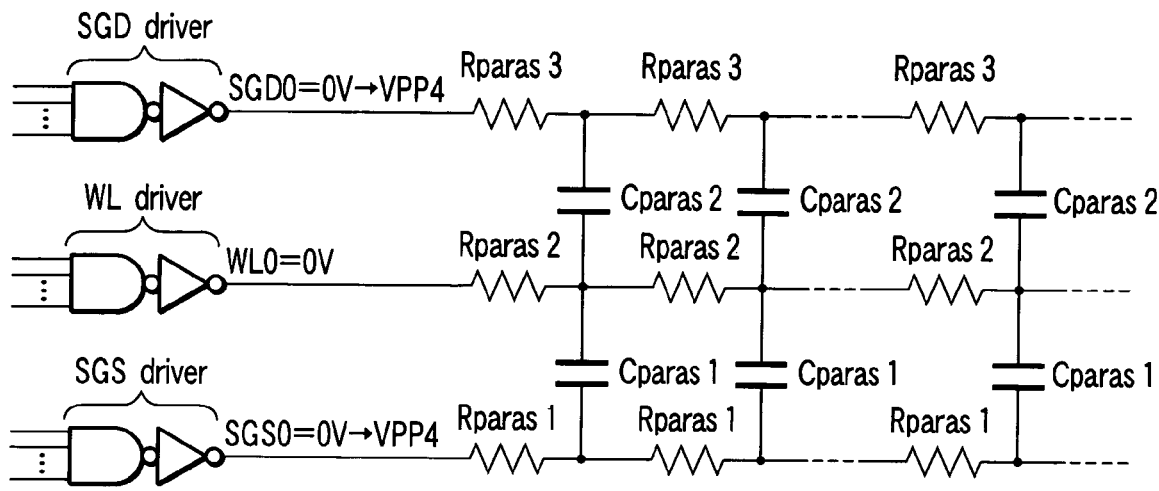
F I G. 4 5
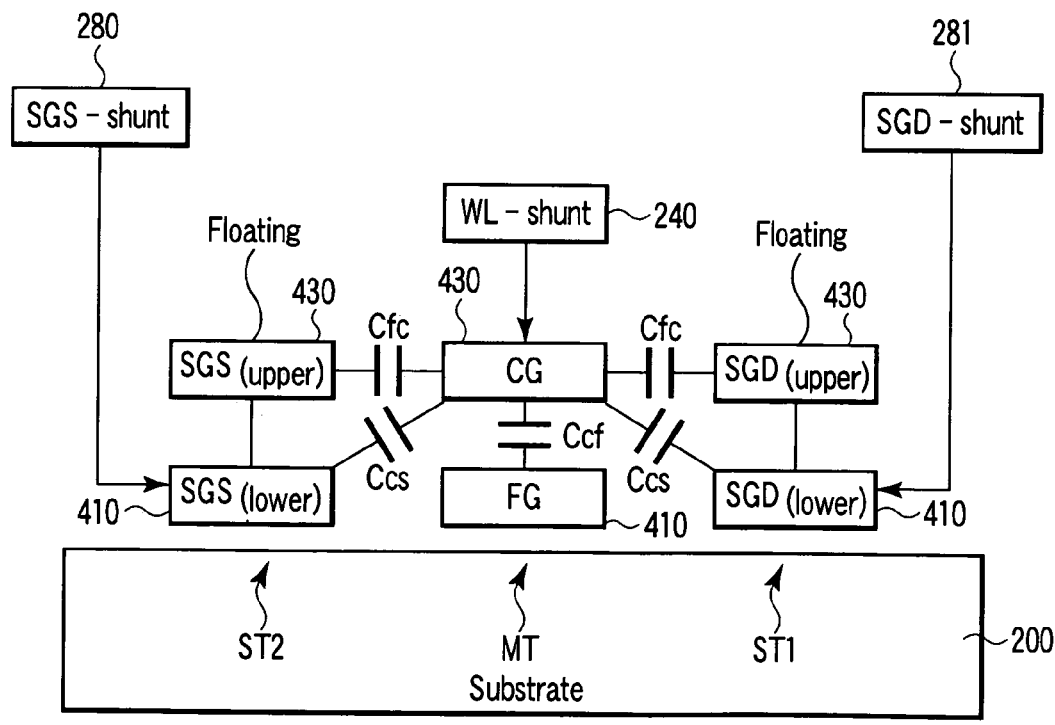
F I G. 4 6

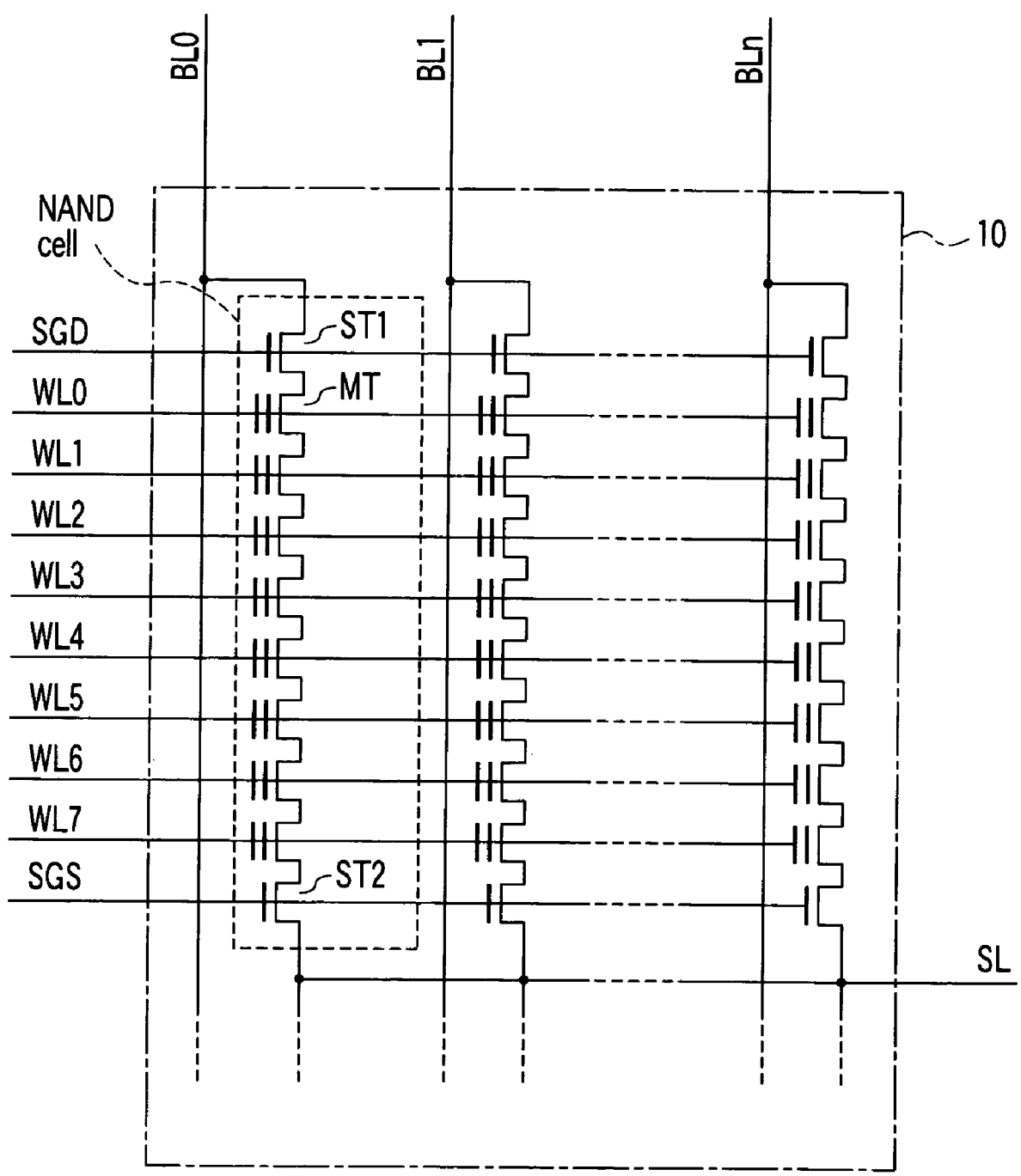
F I G. 49

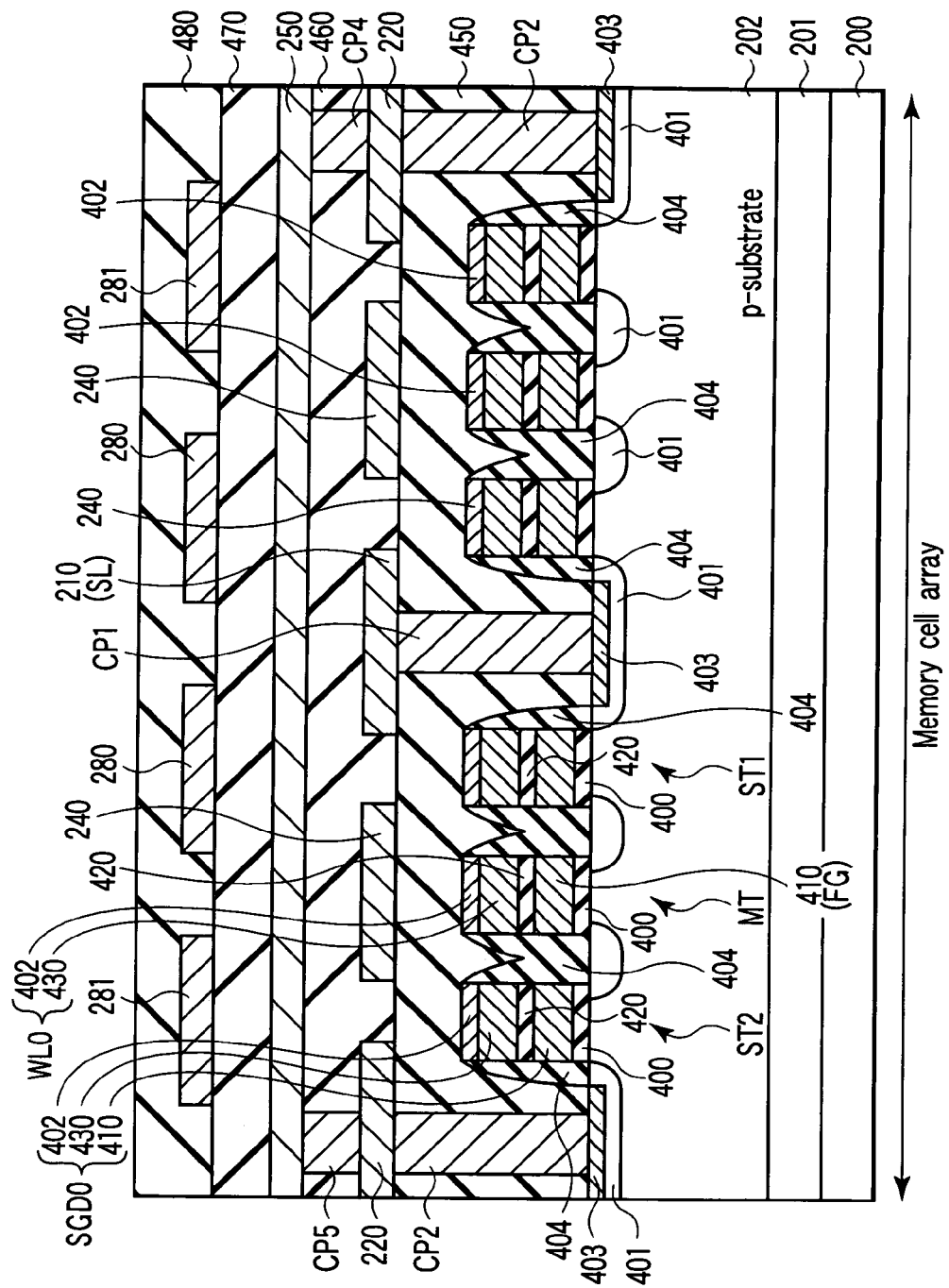
F I G. 51

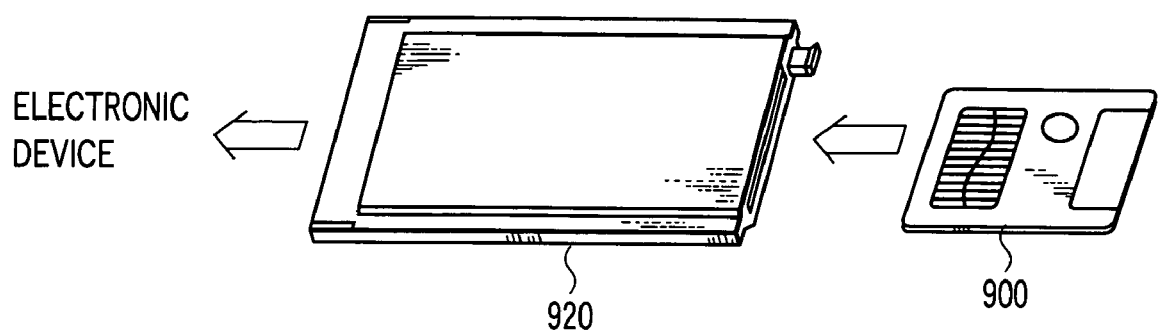
F I G. 5 8
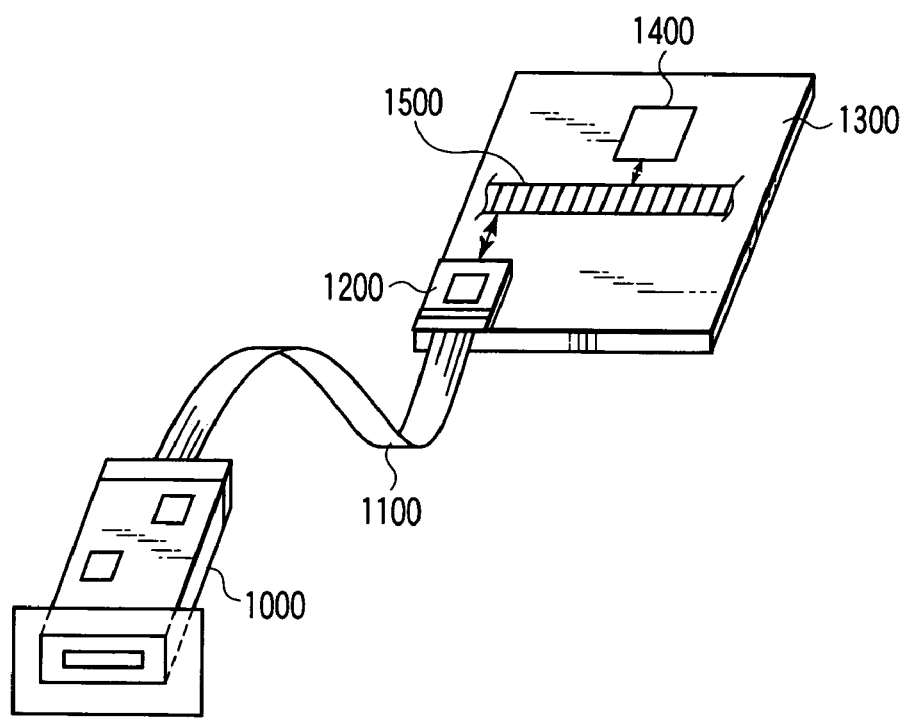
F I G. 5 9

SEMICONDUCTOR MEMORY DEVICE WITH MOS TRANSISTORS EACH HAVING FLOATING GATE AND CONTROL GATE

CROSS-REFERENCE TO RELATED APPLICATIONS

This application is based upon and claims the benefit of priority from prior Japanese Patent Application No. 2004-300791, filed Oct. 14, 2004, the entire contents of which are incorporated herein by reference.

BACKGROUND OF THE INVENTION

1. Field of the Invention

This invention relates to a semiconductor memory device. More specifically, this invention relates to a nonvolatile semiconductor memory device with MOS transistors each having a floating gate and a control gate.

2. Description of the Related Art

NOR and NAND flash memories have been widely used as nonvolatile semiconductor memory devices.

In recent years, a flash memory combining the features of the NOR flash memory and the NAND flash memory has been proposed. This type of flash memory has been disclosed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type (hereinafter, referred to as a 2Tr flash memory) has memory cells each of which includes two MOS transistors. In such a memory cell, one MOS transistor, which functions as a nonvolatile memory section, includes a control gate and a floating gate and is connected to a bit line. The other MOS transistor, which is connected to a source line, is used to select a memory cell.

In a 2Tr flash memory, the gate voltage of the MOS transistor in the nonvolatile memory section is set to 0V and a voltage is applied to the gate of the select MOS transistor, thereby reading the data.

BRIEF SUMMARY OF THE INVENTION

A semiconductor memory device according to an aspect of the present invention includes:

a plurality of memory cells each of which includes a first MOS transistor having a charge accumulation layer and a control gate and a second MOS transistor having a drain connected to a source of the first MOS transistor;

a memory cell array in which the memory cells are arranged in a matrix on a semiconductor substrate;

bit lines each of which connects the drains of the first MOS transistors in a same column;

word lines each of which is formed by connecting commonly the control gates of the first MOS transistors in a same row;

select gate lines each of which is formed by connecting commonly the gates of the second MOS transistors in a same row;

a row decoder which selects any one of the word lines and any one of the select gate lines;

first metal wiring layers which are provided for the word lines in a one-to-one correspondence and which are electrically connected to the corresponding ones of the word lines and transmit a first row select signal for the row decoder to select one of the word lines;

an interlayer insulating film which is formed on the semiconductor substrate so as to cover the memory cells; and metal wiring lines which are formed at a plurality of levels in the interlayer insulating film, the first metal wiring layers being made of the metal wiring lines located at the level of the lowest layer.

A memory card according to an aspect of the present invention includes a semiconductor memory device, the device including:

a plurality of memory cells each of which includes a first MOS transistor having a charge accumulation layer and a control gate and a second MOS transistor having a drain connected to a source of the first MOS transistor;

a memory cell array in which the memory cells are arranged in a matrix on a semiconductor substrate;

bit lines each of which connects the drains of the first MOS transistors in a same column;

word lines each of which is formed by connecting commonly the control gates of the first MOS transistors in a same row;

select gate lines each of which is formed by connecting commonly the gates of the second MOS transistors in a same row;

a row decoder which selects any one of the word lines and any one of the select gate lines;

first metal wiring layers which are provided for the word lines in a one-to-one correspondence and which are electrically connected to the corresponding ones of the word lines and transmit a first row select signal for the row decoder to select one of the word lines;

an interlayer insulating film which is formed on the semiconductor substrate so as to cover the memory cells; and metal wiring lines which are formed at a plurality of levels in the interlayer insulating film, the first metal wiring layers being made of the metal wiring lines located at the level of the lowest layer.

BRIEF DESCRIPTION OF THE SEVERAL VIEWS OF THE DRAWING

FIG. 6 is a plan view of the memory cell array included in the 2Tr flash memory according to the first embodiment;

FIG. 8 is a plan view of the memory cell array included in the 2Tr flash memory according to the first embodiment, showing a plane pattern of a metal wiring layer of a second layer;

FIG. 37 is a plan view of the memory cell array included in the 3Tr-NAND flash memory according to the third embodiment, showing a plane pattern of a metal wiring layer of a second layer;

FIG. 45 is an equivalent circuit of the row decoder, a select gate line, and a word line included in the 3Tr-NAND flash memory;

FIG. 46 is a sectional view schematically showing a memory cell included in the 3Tr-NAND flash memory according to the third embodiment;

FIG. 49 is a circuit diagram of the memory cell array of a NAND flash memory according to the fifth embodiment;

FIG. 51 is a circuit diagram of the memory cell array of a 3Tr-NAND flash memory according to the fifth embodiment;

FIG. 58 is the outward appearance of a memory card including a flash memory according to the first to sixth embodiments and a card holder;

FIG. 59 is the outward appearance of a connection unit which enables connection with a memory card including a flash memory according to the first to sixth embodiments;

DETAILED DESCRIPTION OF THE INVENTION

Figure 1:
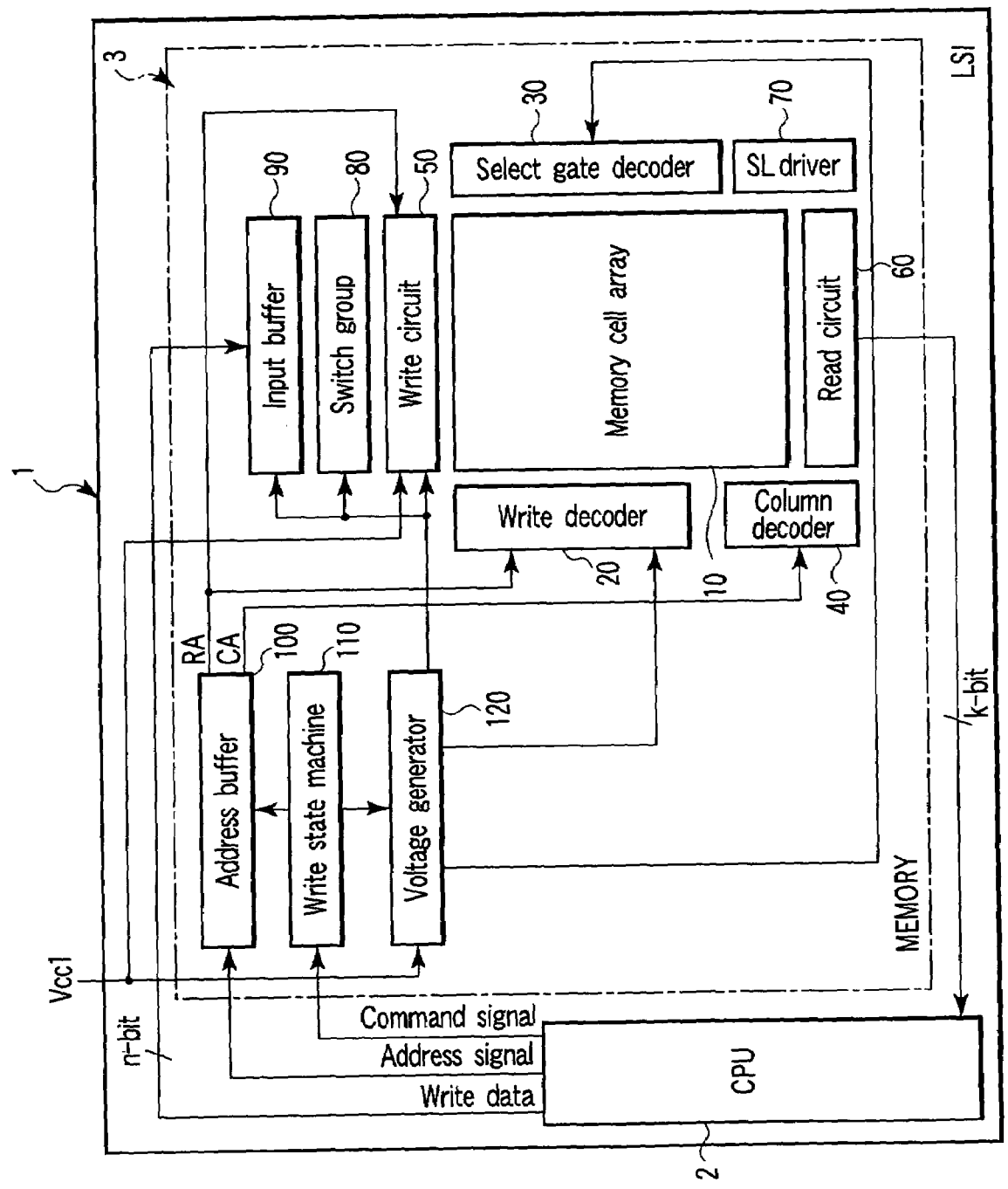
FIG. 1 is a block diagram of a system LSI according to a first embodiment of the present invention.

A semiconductor memory device according to a first embodiment of the present invention will be explained. FIG. 1 is a block diagram of a system LSI according to the first embodiment.

As shown in FIG. 1, the system LSI 1 comprises a CPU 2 and a 2Tr flash memory 3. The CPU 2 exchanges data with the flash memory 3. The flash memory 3 comprises a memory cell array 10, a write decoder 20, a select gate decoder 30, a column decoder 40, a write circuit 50, a read circuit 60, a source line driver 70, switch group 80, an input buffer 90, an address buffer 100, a write state machine 110, and a voltage generator 120. A voltage of Vcc1 (1.25 to 1.65V) is externally applied to the LSI 1. The voltage Vcc1 is applied to the LSI 1.

Figure 2:
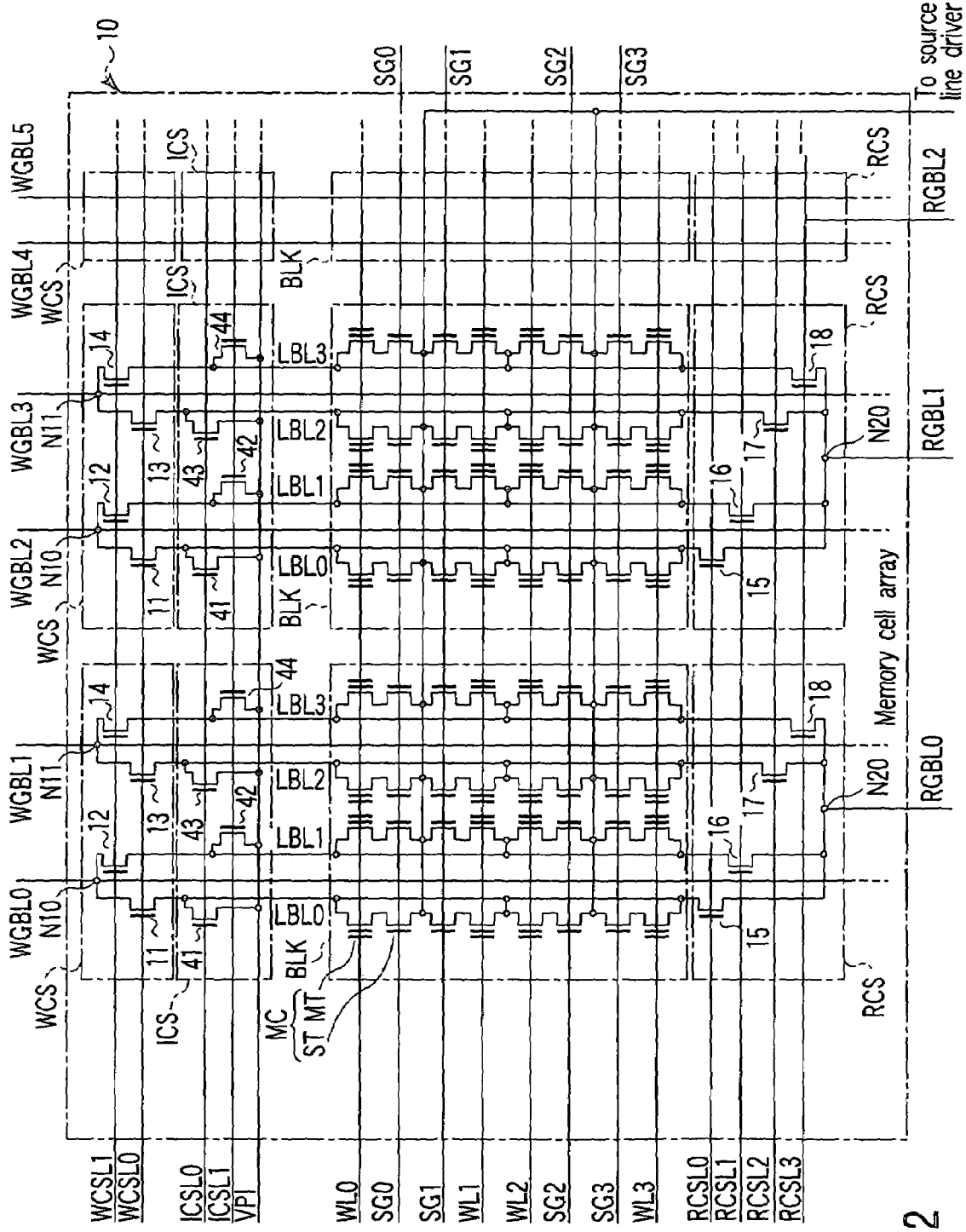
FIG. 2 is a circuit diagram of the memory cell array of a 2Tr flash memory according to the first embodiment.

The memory cell array 10 has a plurality of memory cells arranged in a matrix. The configuration of the memory cell array 10 will be explained with reference to FIG. 2. FIG. 2 is a circuit diagram of a part of the memory cell array 10.

As shown in FIG. 2, the memory cell array 10 has (m+1)×(n+1) memory cell blocks BLK (m and n are natural numbers). The memory cell array 10 further has write column selectors WCS, read column selectors RCS, and write inhibit column selectors ICS, which are provided for the memory cell blocks BLK in a one-to-one correspondence.

Each of the memory cell blocks BLK includes a plurality of memory cells MC. The memory cells MC is the memory cells of a 2Tr flash memory. Specifically, each of the memory cells MC includes a memory cell transistor MT and a select transistor ST. The source of the memory cell transistor MT is connected to the drain of the select transistor ST. The memory cell transistor MT has a stacked gate structure that includes a floating gate on a semiconductor substrate with a gate insulating film interposed therebetween and a control gate on the floating gate with an inter-gate insulating film interposed therebetween. Memory cells MC adjoining each other in the column direction share the drain region of the memory cell transistor MT or the source region of the select transistor ST. Each of the memory cell blocks BLK includes (4×4) memory cells MC. Although the number of memory cells MC arranged in the column direction is 4 in FIG. 2, this is illustrative and not restrictive. For instance, the number of memory cells MC may be 8 or 16. The drain regions of the memory cell transistors MT arranged in four columns are connected to four local bit lines LBL0 to LBL3 in a one-to-one correspondence. One end of each of local bit lines LBL0 to LBL3 is connected to a write column selector WCS and the other end is connected to a read column selector RCS.

In the memory cell array 10, the control gates of the memory cell transistors MT in a same row are connected commonly to any one of word lines WL0 to WL(4m+3). The gates of the select transistors ST in a same row are connected commonly to any one of select gate lines SG0 to SG(4m+3). Local bit lines LBL0 to LBL3 connect the memory cell transistors to one another in each of the memory cell blocks BLK, whereas the word lines WL and select gate lines SG connect the memory cell transistors and select transistors in a same row to one another even across the memory cell blocks.

Word lines WL0 to WL(4m+3) are connected to the write decoder 20. One end of each of the select gate lines SG0 to SG(4m+3) is connected to the select gate decoder 30 and the other end is connected to the write decoder 20. The source region of a select transistor ST is shared by a plurality of memory cell blocks BLK and then is connected to the source line driver 70.

Next, the configuration of a write column selector WCS will be explained. Each of the write column selectors WCS includes four MOS transistors 11 to 14. One end of the current path of each of the MOS transistors 11 to 14 is connected to one end of the corresponding one of local bit lines LBL0 to LBL3. The other ends of the current paths of the MOS transistors 11 and 12 are connected to each other and the other ends of the current paths of the MOS transistors 13 and 14 are connected to each other. Hereinafter, the common junction node of the MOS transistors 11 and 12 is called node N10 and the common junction node of the MOS transistors 13 and 14 is called node N11. The gates of the MOS transistors 11 to 14 are connected to any one of write column select lines WCSL0 to WCSL(2m+1). The MOS transistors 11, 13 included in the write column selectors WCS in a same row are connected to the same one of the write column select lines WCSL(h−1) (h: 1, 3, 5, . . . ). The MOS transistors 12, 14 included in the write column selectors WCS in the same row are connected to the same one of the write column select lines WCSLh. One of the write column select lines WCSL0 to WCSL(2m+1) is selected by the column decoder 40 in a write operation.

Each of the nodes N10, N11 in the write column selector WCS is connected to any one of write global bit lines WGBL0 to WGBL(2n+1). Each of the write global bit lines WGBL0 to WGBL(2n+1) is connected commonly to the nodes N10 or nodes N11 of the write column selectors WCS in a same column. Write global bit lines WGBL0 to WGBL(2n+1) are connected to the write circuit 50.

Next, the configuration of a read column selector RCS will be explained. Each of the read column selectors RCS includes four MOS transistors 15 to 18. One end of the current path of each of the MOS transistors 15 to 18 is connected to one end of the corresponding one of the local bit lines LBL0 to LBL3. The other ends of the current paths of the MOS transistors 15 to 18 are connected to each other. Hereinafter, the common junction node of the MOS transistors 15 to 18 is called node N20. Each of the gates of the MOS transistors 15 to 18 is connected to a different one of the read column select lines RCSL0 to RCSL(4m+3). Each of the MOS transistors 15 to 18 included in the read column selectors RCS in a same row is connected to the same one of the read column select lines RCSL0 to RCSL(4m+3). One of the read column select lines RCSL0 to RCSL(4m+3) is selected by the column decoder 40 in a read operation.

Node 20 in the read column selector RCS is connected to any one of the read global bit lines RGBL0 to RGBLn. Each of the read global bit lines RGBL0 to RGBLn is connected commonly to the nodes N20 in the read column selectors RCS in a same column. Read global bit lines RGBL0 to RGBLn are connected to the read circuit 70 via the column selector 60.

Next, the configuration of a write inhibit column selector ICS will be explained. Each of the write inhibit column selectors ICS includes four MOS transistors 41 to 44. One end of the current path of each of the MOS transistors 41 to 44 is connected to one end of the corresponding one of the local bit lines LBL0 to LBL3. A write inhibit voltage VPI is applied commonly to the other ends of the current paths of the MOS transistors 41 and 44. The write inhibit voltage VPI is generated by the voltage generator 130. The gates of the MOS transistors 41 to 44 are connected to any one of the write inhibit column select lines ICSL0 to ICSL(2m+1). The MOS transistors 41, 43 included in the write inhibit column selectors ICS in a same row are connected to the same one of the write column select lines WCSL(h−1) (h: 1, 3, 5, . . . ). The MOS transistors 42, 44 included in the write column selectors ICS in the same row are connected to the same one of the write column select lines WCSLh. One of the write inhibit column select lines ICSL0 to ICSL(2m+1) are selected by the column decoder 40 in a write operation.

The configuration of the memory cell array 10 can also be explained as follows. In the memory cell array 10, a plurality of memory cells MC are arranged in a matrix. The control gates of the memory cell transistors MC of the memory cell MCs in a same row are connected commonly to a word line. The gates of the select transistors of the memory cells in the same row are connected to a select gate line. The drains of the memory cell transistors MT of four memory cells MC in a same column are connected commonly to any one of the local bit lines LBL0 to LBL3. Specifically, the memory cells MC in the memory cell array 10 are connected to a different one of the different local bit lines LBL0 to LBL3 in units of four memory cells MC arranged in a line. Then, one end of each of the local bit lines LBL0 in a same column and one end of each of the local bit lines LBL1 in a same column are connected commonly to any one of the write global bit lines WGBL0 to WGBL(2n+1) via the MOS transistors 11, 12, respectively. Moreover, one end of each of the local bit lines LBL2 in a same column and one end of each of the local bit lines LBL3 in a same column are connected commonly to any one of the write global bit lines WGBL- to WGBL(2n+1) via the MOS transistors 13, 14, respectively. The other ends of local bit lines LBL0 to LBL3 in the same column are connected equally to any one of the read global bit lines RGBL0 to RGBLn via the MOS transistors 15 to 18. Furthermore, local bit lines LBL0 to LBL3 are connected via the MOS transistors 41 to 44 to write inhibit nodes, respectively. Then, the sources of the select transistors ST of the memory cells MC are connected to one another and then are connected to the source line driver. In the memory cell array with the above configuration, four columns of four memory cells MC connected to the same local bit line makes a single memory block BLK. The memory cell blocks in a same column are connected to a common write global bit line and a common read global bit line. The memory cell blocks BLK in a different column are connected to a different write global bit line and a different read global bit line. The number of memory cells in a memory cell block, the number of read global bit lines RGBL, and the number of write global bit lines WGBL are not limited to those in the embodiment.

Referring to FIG. 1, the explanation will be continued. The write circuit 50 not only latches write data but also resets the write global bit lines WGBL.

The input buffer 90 holds the write data given by the CPU 2.

The switch group 80 transfers the write data held in the input buffer 90 to the write circuit 50.

Figure 3:
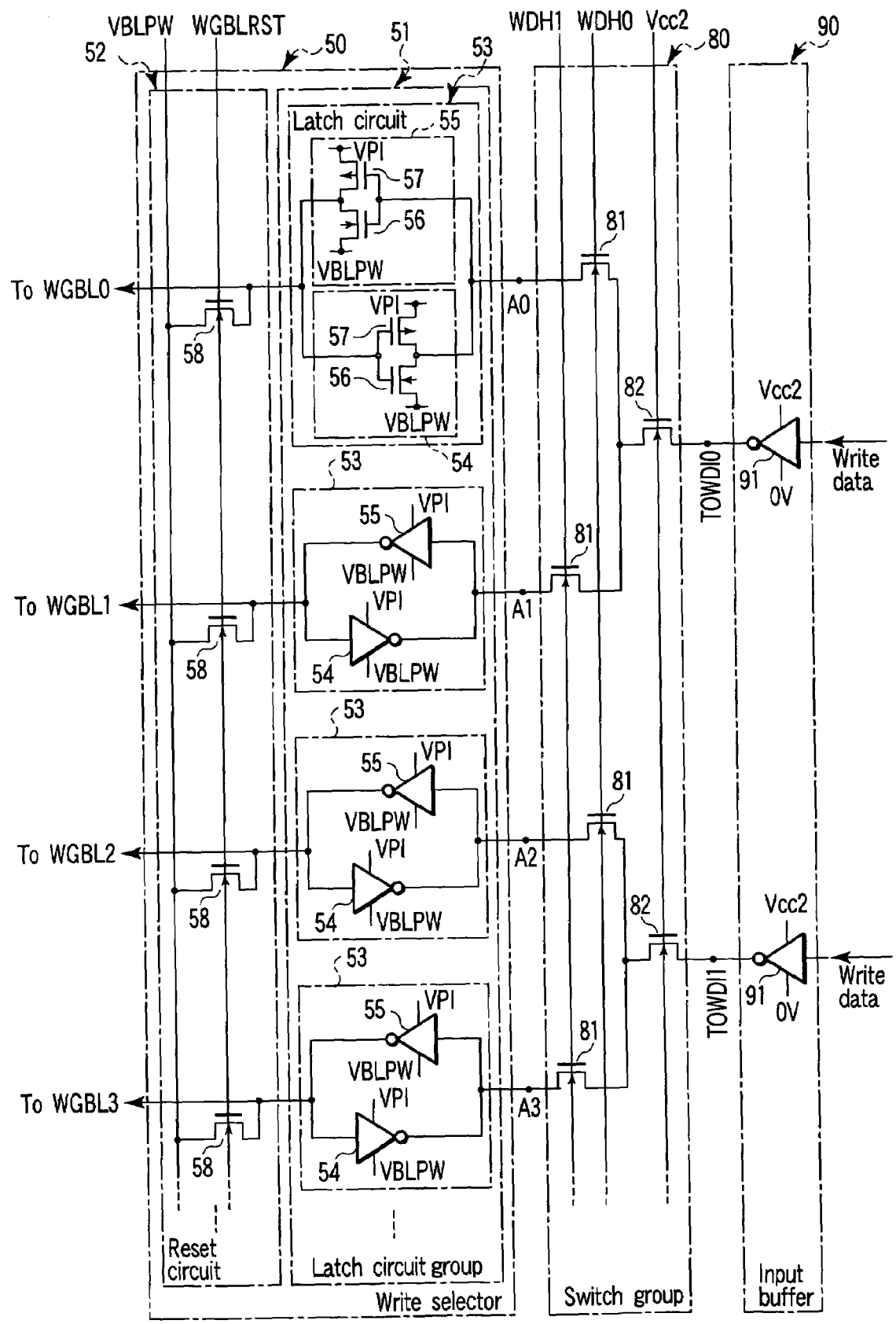
FIG. 3 is a circuit diagram of the write circuit, switch group, and input buffer of the 2Tr flash memory according to the first embodiment.

The configuration of the write circuit 50, switch group 80, and input buffer 90 will be explained with reference to FIG. 3. FIG. 3 is a circuit diagram of the write circuit 50, switch group 80, and input buffer 90.

First, the write circuit 50 will be explained. The write circuit 50 includes a latch circuit group 51 and a reset circuit 52. The latch circuit group 51 includes latch circuits 53 provided for write global bit lines WGBL0 to WGBL(2n+1) in a one-to-one correspondence. Each of the latch circuits 53 has two inverters 54, 55. The input terminal of the inverter 54 is connected to the output terminal of the inverter 55. The output terminal of the inverter 54 is connected to the input terminal of the inverter 55. The junction node of the input terminal of the inverter 54 and the output terminal of the inverter 55 makes the output node of the latch circuit 53, which is connected to the corresponding write global bit line. Each of the inverters 54, 55 has an n-channel MOS transistor 56 and a p-channel MOS transistor 57 whose current paths are connected in series. The source of the n-channel MOS transistor 56 is connected to VBLPW node and the source of the p-channel MOS transistor is connected to the write inhibit voltage node VPI. The gate of the n-channel MOS transistor 56 and the gate of the p-channel MOS transistor 57 are connected to one another. Then, the junction node of the drain of the p-channel MOS transistor 57 and the drain of the n-channel MOS transistor 56 in the inverter 55 is connected to the junction node of the gate of p-channel MOS transistor 57 and the gate of n-channel MOS transistor 56 in the inverter 54 and is further connected to a write global bit line. In addition, the junction node of the drain of the p-channel MOS transistor 57 and the drain of the n-channel MOS transistor 56 in the inverter 54 is connected to the junction node of the gate of the p-channel MOS transistor 57 and the gate of the n-channel MOS transistor 56 in the inverter 55. This junction node makes the input node of the latch circuit 53.

The reset circuit 52 includes n-channel MOS transistors 58 provided for write global bit lines WGBL0 to WGBL (2n+1) in a one-to-one correspondence. The drains of the n-channel MOS transistors 58 are connected to the corresponding write global bit lines. Their sources are connected commonly to VBLPW node and their gates are connected commonly to WGBLRST node.

The switch group 80 includes n-channel MOS transistors 81 provided for the latch circuits 53 in a one-to-one correspondence and n-channel MOS transistors 82. One end of each of the MOS transistors 81 is connected to the input node of the corresponding latch circuit 53. The other ends of the current paths of the two MOS transistors 81 each connected to adjacent latch circuits are connected to each other. That is, the MOS transistors 81 connected to the latch circuits 53 each corresponding to write global bit lines WGBL0, WGBL1 share the other end of their current path. The same holds true for the MOS transistors 81 connected to the latch circuits 53 each corresponding to write global bit lines WGBL2, WGBL3. The gates of the MOS transistors 81 connected to the latch circuits 53 corresponding to write global bit lines WGBL(h−1) (h=1, 3, 5, . . . ) are connected commonly to WDH0 node. The gates of the MOS transistors 81 connected to the latch circuits 53 corresponding to write global bit lines WGBLh are connected commonly to WDH1 node. The other ends of the current paths of the MOS transistors 81 connected to one another are connected to one end of the current path of a MOS transistor 82. A positive voltage Vcc2 (about 3V) is applied to the gates of the MOS transistors 82 at the same time. The positive voltage Vcc2 is, for example, generated by the voltage generator 120. Hereinafter, the junction nodes of the MOS transistors 81 and the input nodes of the latch circuits 53 are referred to as nodes A0 to A(2n+1).

Next, the input buffer 90 will be explained. The input buffer 90 includes inverters 91 provided for the MOS transistors 82 in the switch group 80 in a one-to-one correspondence. The write data supplied from the CPU2 is input to the input node of the inverter 91. The output node of the inverter 91 is connected to the other end of the current path of the MOS transistor 82. The inverter 91 operates with a high-voltage power supply potential of Vcc2 and a low-voltage power supply potential of 0V. Hereinafter, the junction nodes of the output nodes of the inverters 181 and the MOS transistors 82 are called nodes TOWDI0 to TOWDI ((2n+1)/2).

Referring to FIG. 1, the explanation will be continued.

The column decoder 40 decodes a column address signal, thereby producing a column address decode signal. On the basis of the column address decode signal, the column select lines WCSL, RCSL, ICSL are selected.

Figure 4:
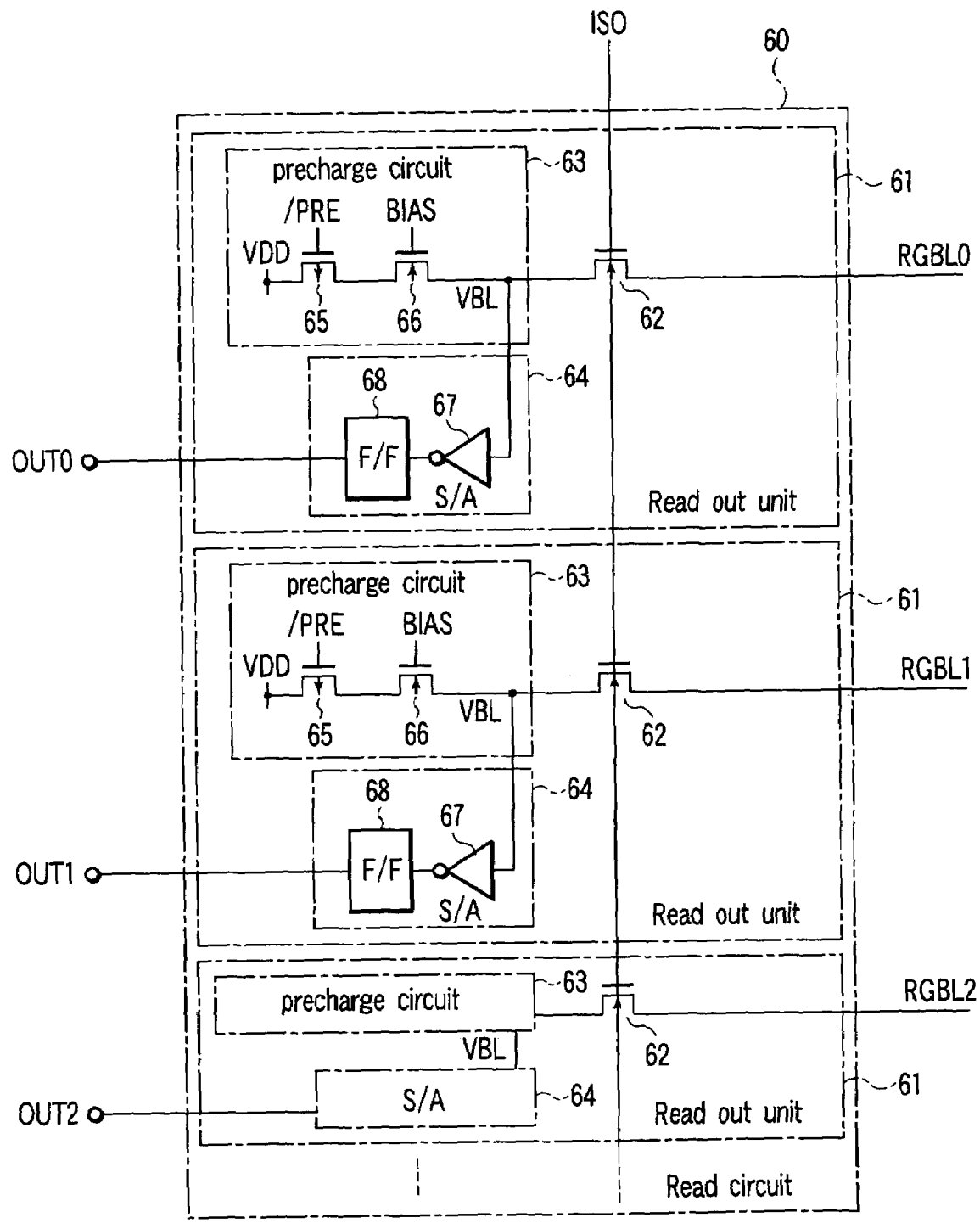
FIG. 4 is a circuit diagram of the read circuit of the 2Tr flash memory according to the first embodiment.

In a read operation, the read circuit 60 precharges read global bit lines RGBL0 to RGBLn and amplifies the data read onto read global bit lines RGBL0 to RGBLn. Using FIG. 4, the configuration of the read circuit 60 will be explained. FIG. 4 is a circuit diagram of the read circuit 60.

The read circuit 60 includes read units 61 provided for read global bit lines RGBL0 to RGBLn in a one-to-one correspondence. Each of the read units 61 includes an isolating MOS transistor 62, a precharge circuit 63, and a sense amplifier 64.

Each of the precharge circuits 63 precharges the corresponding one of the read global bit lines RGBL0 to RGBLn in a read operation. The precharge circuit 63 includes a p-channel MOS transistor 65 and an n-channel MOS transistor 66. The source of the p-channel MOS transistor 65 is connected to a power supply voltage VDD (e.g., 1.3V). A precharge signal /PRE is input to its gate. The drain of the n-channel MOS transistor 66 is connected to the drain of the MOS transistor 65. A bias signal BIAS is input to its gate.

The sense amplifier 64 amplifies the data read onto the corresponding one of the read global bit lines RGBL0 to RGBLn in a read operation. The sense amplifier 64 includes an inverter 67 and a flip-flop 68. The input node of the inverter 67 is connected to the source of the MOS transistor 66. The output node of the inverter 67 is connected to the input node of the flip-flop 68. The amplified read data is output at the corresponding one of the output nodes OUT0 to OUTn of the flip-flops 68.

One end of the current path of the isolating MOS transistor 62 is connected to the corresponding one of the read global bit lines RGBL0 to RGBLn. The other end of its current path is connected to the source of the MOS transistor 66 and the input node of the inverter 67. The n-channel MOS transistor is used as isolating MOS transistor 62. That is, the precharge circuit 63 and sense amplifier 64 are connected to the corresponding one of the read global bit lines RGBL0 to RGBLn via the isolating MOS transistor 62. Then, the gates of all of the MOS transistors 62 are connected to one another. A signal ISO is input to the common junction of the gates.

Referring to FIG. 1, the explanation will be continued.

The source line driver 70 supplies a voltage to the source lines SL.

The address buffer 100 holds an address signal supplied from the CPU 2. Then, the address buffer 100 supplies a column address signal CA to the column decoder 40 and a row address signal RA to the write decoder 20 and select gate decoder 30.

The write state machine 110 controls the operation of each circuit included in the flash memory 3 on the basis of a command signal supplied from the CPU 2, thereby performing timing control in writing, erasing, or reading data, and executing a specific algorithm determined for each operation.

The voltage generator 120 generates a plurality of internal voltages on the basis of the voltage Vcc1 (about 1.25 to 1.65V) externally input. The voltage generator 120 has a negative charge pump circuit and a positive charge pump circuit. Then, the voltage generator 120 generates a negative voltage VBB1 (=−7V), VBB2 (=−8V) and positive voltages and VPP (=12V).

The write decoder 20 not only selects any one of the word lines WL0 to WL(4m+3) and applies a positive potential VPP (12V) to the selected word line but also a negative potential VBB1 (−7V) to the p-well region where the memory cell array has been formed and to all of the select gate lines SG0 to SG(4m+3), in a write operation. The write decoder 20 applies not only a negative potential VBB (−8V) to all of the word lines but also the positive voltage VPP to the p-well region where the memory cell array has been formed, in an erase operation.

The select gate decoder 30 selects any one of the select gate lines SG0 to SG(4m+3) and applies a positive potential Vcc2 to the selected select gate line in a read operation. The select gate decoder 30 further controls a signal ISO, thereby controlling the operation of the isolating MOS transistor 62.

Figure 5:
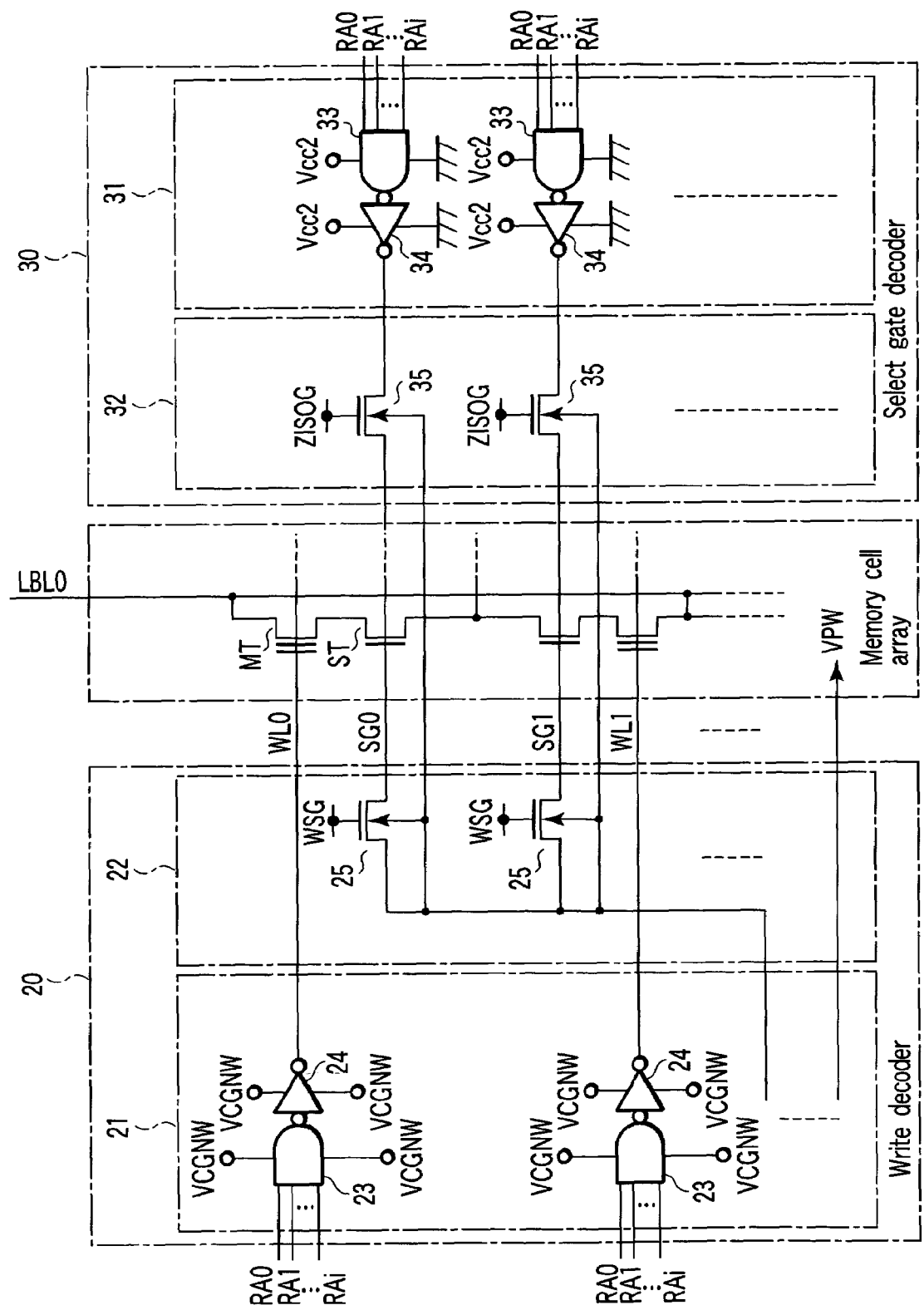
FIG. 5 is a circuit diagram of the write decoder and select gate decoder of the 2Tr flash memory according to the first embodiment.

Using FIG. 5, the configuration of the write decoder 20 and select gate decoder 30 will be explained. First, the configuration of the select gate decoder 30 will be explained. The select gate decoder 30 includes a row address decode circuit 31 and a switch element group 32. The row address decode circuit 31, which operates on a power supply voltage Vcc2, decodes (i+1)-bit row address signals RA0 to RAi, thereby producing a row address decode signal. The row address decode circuit 31 has NAND circuits 33 and inverters 34 provided for select gate lines SG0 to SG(4m+3) in a one-to-one correspondence. The NAND circuit 33 carries out the NAND operation of each bit in the row address signals RA0 to RAi. Then, the inverter 34 inverts the result of the NAND operation and outputs the resulting signal as a row address decode signal.

The switch element group 32 has n-channel MOS transistors 35. The n-channel MOS transistors 35 are provided for select gate lines SG0 to SG(4m+3) in a one-to-one correspondence. Then, the outputs of the inverters 34 are supplied to select gate lines SG0 to SG(4m+3) via the current paths of the n-channel MOS transistors 35 in a one-to-one correspondence. A control signal ZISOG is input to the gates of the n-channel MOS transistors 35. The control signal ZISOG brings the MOS transistors into the off state in a write and an erase operation and into the on state in a read operation.

Next, the configuration of the write decoder 20 will be explained. The write decoder 20 includes a row address decode circuit 21 and a switch element group 22. The row address decode circuit 21 decodes (i+1)-bit row address signals RA0 to RAi, thereby producing a row address decode signal. The row address decode signal is supplied to word lines WL0 to WL(4m+3). The row address decode circuit 21 has NAND circuits 23 and inverters 24 provided for word lines WL0 to WL(4m+3) in a one-to-one correspondence. The NAND circuit 23 and inverter 24 have their high-voltage-side power supply voltage nodes connected to VCGNW node and their low-voltage-side power supply voltage nodes connected to VCGPW node. The NAND circuit 23 carries out the NAND operation of each bit in the row address signals RA0 to RAi. Any one of Vcc1, 0V, and the positive voltage VPP and the negative voltage VBB1, VBB2 generated by the voltage generator 120 is applied to the power-supply voltage nodes VCGNW, VCGPW. Then, the inverter 24 inverts the result of the NAND operation and outputs the resulting signal as a row address decode signal.

The switch element group 22 has n-channel MOS transistors 25. The MOS transistors 25 are provided for select gate lines SG0 to SG(4m+3) in a one-to-one correspondence. The current path of each of the MOS transistors 25 is connected to the corresponding one of the select gate lines SG0 to SG(4m+3). The negative potential VBB1 or positive potential VPP is applied to the other ends of the current paths. Control signal WSG is input to the gates of the MOS transistors 25. Control signal WSG turns on the MOS transistors 25 in a write and an erase operation. Furthermore, the write decoder 20 applies voltage VPW to the semiconductor substrate (well region) in which the memory cell array 10 has been formed.

Next, using FIGS. 6 to 10, a plane structure of the memory cell array 10 included in the 2Tr flash memory 3 will be explained. FIG. 6 is a plan view of a part of the memory cell array 10. FIGS. 7 to 10 are plan views showing plane patterns of metal wiring layers of a first to a fourth layer, respectively, together with element regions, word lines, and select gate lines. In FIGS. 7 to 10, the regions shown correspond to those in FIG. 6.

As shown in FIGS. 6 to 10, in the semiconductor substrate (p-well region) 200, a plurality of stripe-shaped element regions AA extending in a first direction are formed in a second direction perpendicular to the first direction. Stripe-shaped word lines WL0 to WL(4m+3) and select gate lines SG0 to SG(4m+3), which extend in the second direction, are formed so as to cross the element regions AA. In the regions where word lines WL0 to WL(4m+3) cross the element regions AA, memory cell transistors MT are formed. In the regions where select gate lines SG0 to SG(4m+3) cross the element regions AA, select transistors ST are formed.

The memory cell transistors MT, which are formed in the regions where word lines WL0 to WL(4m+3) cross the element regions AA, have floating gates (not shown) separated from one another on a memory cell transistor MT basis. Like the memory cell transistors MT, the select gate transistors ST have control gates and floating gates. Unlike the memory cell transistors MT, the select transistors ST have their floating gates connected in such a manner that select transistors ST adjoining in the second direction share a floating gate. Adjacent memory cells have their select gate lines SG or word lines WL adjoining each other.

Hereinafter, a group of four columns of element regions AA in the memory cell array 10 is referred to as a first element region group AAG1. A region where a column of element regions AA is formed between adjacent first element region groups AAG1 is referred to as a source contact region SCA. The memory cells MC formed in the first element region groups AAG1 are used for storing data. The memory cells MC in the source contact region SCA are dummy memory cells and are not used for storing data. A stitch region SA1 is formed in units of two columns of first element region groups AAG1. In the first embodiment, no element region AA is formed in the stitch region SA1. The width of the stitch region SA1 is almost equal to the sum of the width of an element region AA and the width of the element isolating region STI formed between element regions AA. On the stitch region SA1, too, word lines WL0 to WL(4m+3) and select gate lines SG0 to SG(4m+3) are formed. However, word lines WL0 to WL(4m+3) and select gate lines SG0 to SG(4m+3) existing in the stitch region SA1 do not practically constitute the memory cells. In the stitch regions SA1, a part of each of the word lines WL0 to WL(4m+3) and select gate lines SG0 to SG(4m+3) is made wider. The region made wider in a word line is referred to as a shunt region SA2 and the region made wider in a select gate line is referred to as a shunt region SA3. The shunt regions SA2, SA3 are provided in word lines WL0 to WL(4m+3) and select gate line SG0 to SG(4m+3) alternately in the second direction. Specifically, in a stitch region SA1, a shunt region SA2 is formed in each of the word lines WL0, WL2, WL4, . . . and a shunt region SA3 is formed in each of the select gate lines SG0, SG2, SG4, . . . . In another stitch region SA1 adjacent to the stitch region, a shunt region SA2 is formed in each of the word lines WL1, WL3, WL5, . . . and a shunt region SA3 is formed in each of the select gate lines SG1, SG3, SG5, . . . . The select gate lines where no shunt region SA3 is formed are partially removed in the stitch regions SA1. A shunt region SA3 is formed so as to project toward the adjacent select gate lines and a shunt region SA2 is formed so as project toward the adjacent word lines. Hereinafter, a region obtained by combining a first element region group AAG1 and a source contact region SCA is referred to as a second element region group AAG2.

Figure 7:
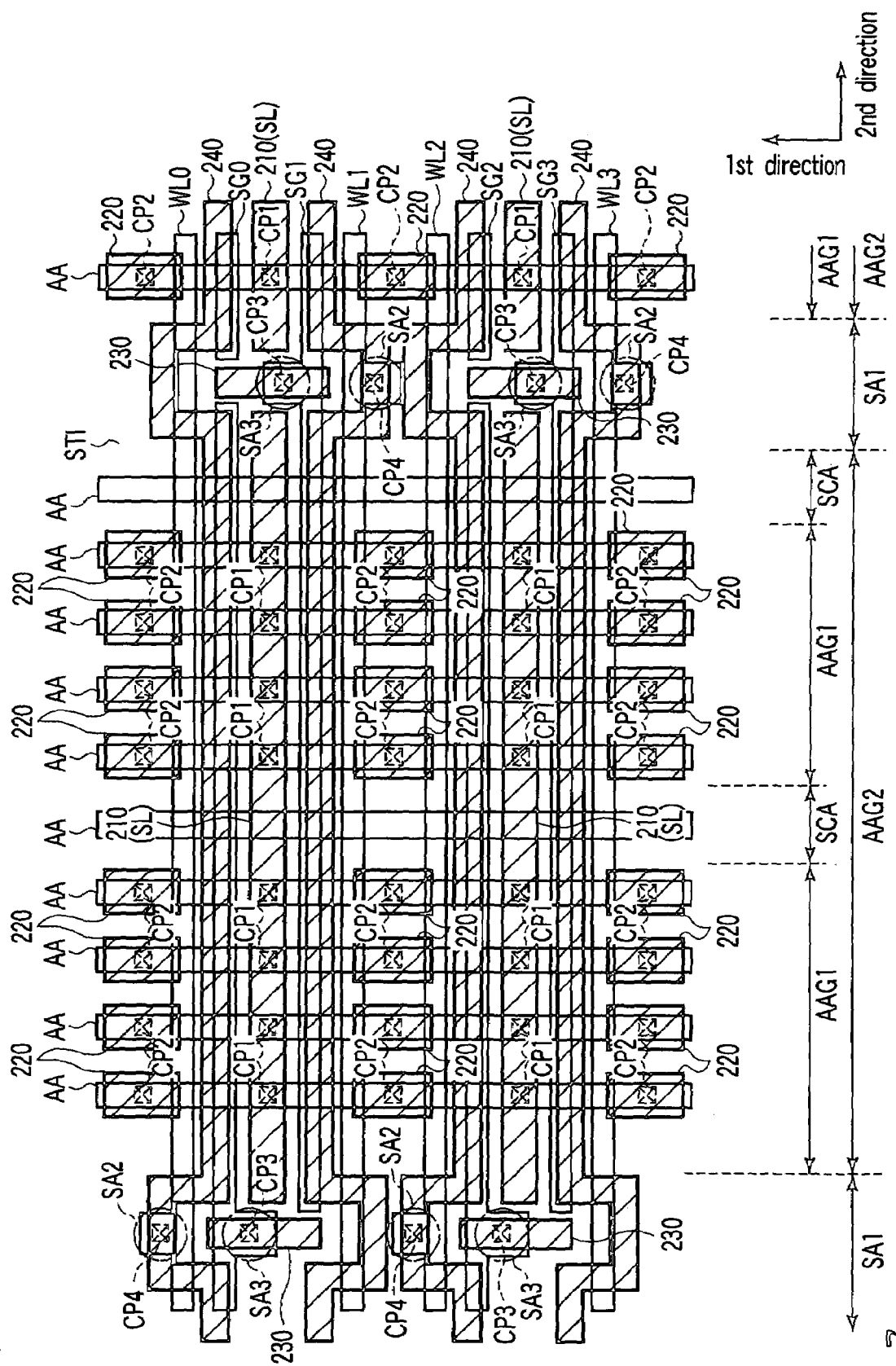
FIG. 7 is a plan view of the memory cell array included in the 2Tr flash memory according to the first embodiment, showing a plane pattern of a metal wiring layer of a first layer.

Next, using FIGS. 6 and 7, a pattern of a first-layer metal wiring layer existing on word line WL0 to WL(4m+3) and select gate lines SG0 to SG(4m+3) will be explained. In FIG. 7, the shaded region is a first-layer metal wiring layer.

As shown in FIG. 7, between adjacent select gate lines SG (between SG0 and SG1, between SG2 and SG3, . . . ), a stripe-shaped metal wiring layer 210 extending in the second direction is formed. The metal wiring layer 210 is a part of a source line SL. The metal wiring layers 210 are separated from one another by stitch regions SA1 in its longitudinal direction (or the second direction). That is, the metal wiring layers 210 are independent on a second element region group AAG2 basis. Each of the metal wiring layers 210 is connected to the source region of a select transistor ST by a contact plug CP1. In the first embodiment, in the source contact region SCA, no contact plug CP1 is formed, with the result that the metal wiring layer 210 is not electrically connected to the source region of the memory cell in the source contact region SCA. Above the drain region of the memory cell transistor MT in the first element region group AAG1, an island pattern of metal wiring layer 220 is formed. The metal wiring layers 220 are separated from one another. Each of the metal wiring layers 220 is connected to the drain of the corresponding memory cell transistor MT by a contact plug CP2. Therefore, a plurality of metal wiring layers 220 arranged in the second direction and a plurality of stripe-shaped metal wiring layers 210 arranged in the second direction are provided alternately in the first direction. Above the shunt region SA3, an island pattern of metal wiring layer 230 is formed. The metal wiring layer 230 is connected to the shunt region SA3 of the corresponding select gate line SG by a contact plug CP3. The metal wiring layer 230 is extended in the first direction from the top of the corresponding select gate line SG to the top of the region from which the adjacent select gate line SG has been removed.

Furthermore, between adjacent metal wiring layers 210 and between adjacent metal wiring layers 230, stripe-shaped metal wiring layers 240 are formed in such a manner that they are electrically separated from the metal wiring layers 210, 230 and extend in the second direction. The metal wiring layers 240 function as shunt wires for word lines WL0 to WL(4m+3). In the second element region group AAG2, the each metal wiring layer 240 is extended from the top of the select gate line of the corresponding memory cell toward the region between the select gate line and the word line of the corresponding memory cell. In the stitch region SA1, the select gate lines are bent so as to pass over the shunt regions SA2 of the word lines WL0 to WL(4m+3). That is, in the stitch region SA1, the metal wiring layers 240 has such a plane pattern as projects toward the opposite side of the surface facing the adjacent metal wiring layer 210. The metal wiring layers 240 corresponding to the word lines with no shunt region SA2 are also bent in the stitch region SA1 as the metal wiring layers 240 corresponding to the word lines with shunt regions SA2. Therefore, two metal wiring layers 240 adjacent to a metal wiring layer 210 have such a plane pattern as is axisymmetric with the metal wiring layer 210. Then, in the stitch region SA1, the metal wiring layer 240 is connected to the shunt region SA2 of the corresponding word line WL by a contact plug CP4.

Next, using FIGS. 6 and 8, a pattern of a second-layer metal wiring layer existing on the first-layer metal wiring layers 210 to 240 will be explained. In FIG. 8, the shaded region is the second-layer metal wiring layer.

As shown in FIG. 8, in a first element region AAG1, stripe-shaped metal wiring layers 250 are formed in the first direction above element regions AA. The metal wiring layers 250 function as local bit lines LBL0 to LBL3. The metal wiring layers 250 are connected to the first-layer metal wiring layer 220 by contact plugs CP4. In source contact regions SCA, metal wiring layers 260 whose pattern is similar to that of the metal wiring layers 250 are formed. Therefore, the line width of the metal wiring layers 260 is the same as that of the metal wiring layers 250. The metal wiring layers 260 function as part of the source lines SL. The metal wiring layers 260 are connected to the first-layer metal wiring layers 210 by contact plugs CP6. That is, a plurality of metal wiring layers 210 isolated in the first direction are connected to one another by a metal wiring layer 260. In the stitch region SA1, metal wiring layers 270 with an island pattern are formed. The metal wiring layers 270 are formed so as to correspond to the first-layer metal wiring layers 230. The shape of a metal wiring layer 270 is such that the layer 270 is extended more to the adjacent word line than the metal wiring layer 230 and a part of the layer 270 exists above a word line. The metal wiring layers 270 are connected to the metal wiring layers 230 by contact plugs CP7. While in FIGS. 6 and 8, the contact plugs CP6 are directly above the shunt regions SA2, the present embodiment is not limited to this, as long as the contact plugs CP7 are provided in positions where the metal wiring layers 230 and 270 can be connected.

Figure 9:
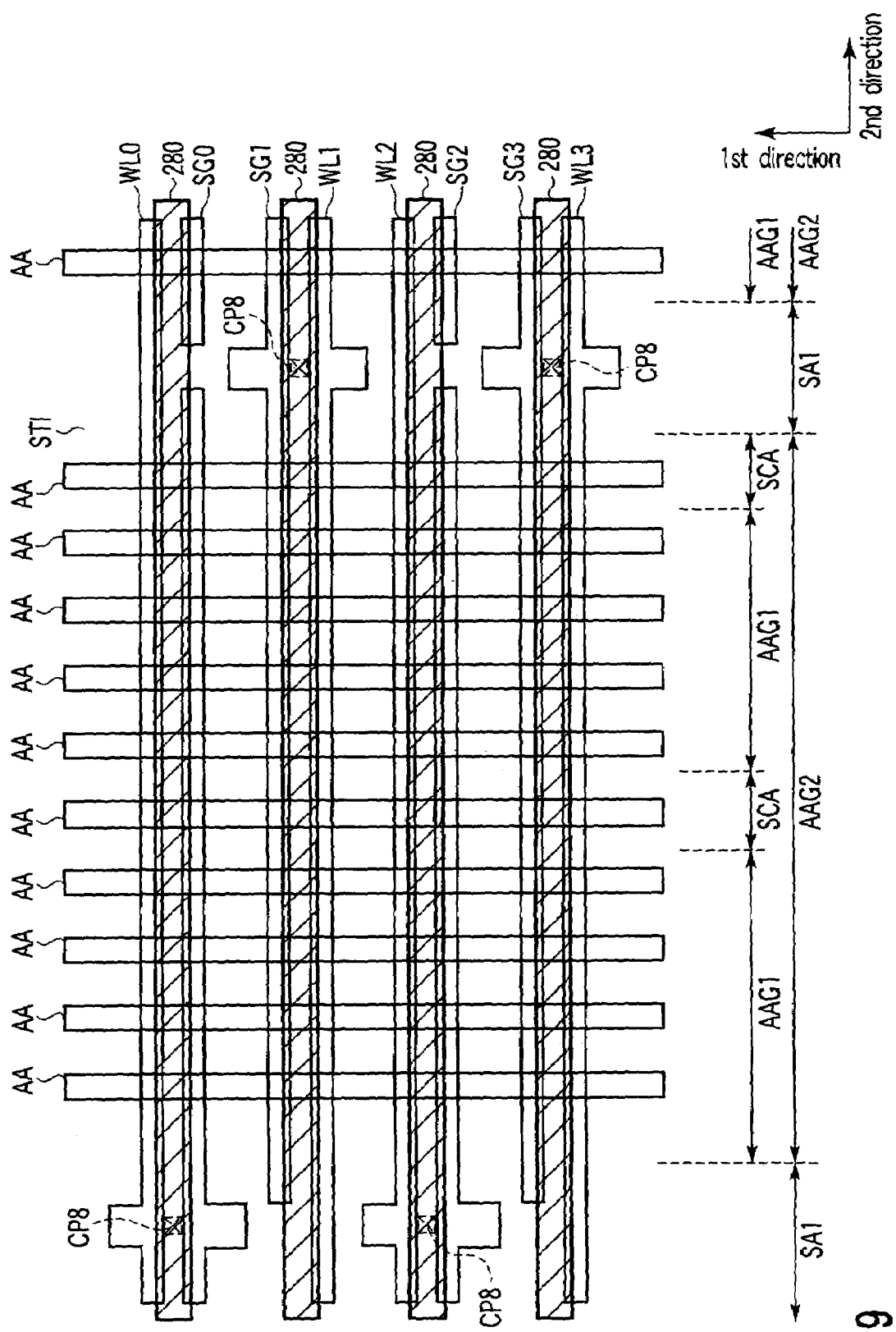
FIG. 9 is a plan view of the memory cell array included in the 2Tr flash memory according to the first embodiment, showing a plane pattern of a metal wiring layer of a third layer.

Next, using FIGS. 6 and 9, a pattern of a third-layer metal wiring layer existing on the second-layer metal wiring layers 250 to 270 will be explained. In FIG. 9, the shaded region is the third-layer metal wiring layer.

As shown in FIG. 9, stripe-shaped metal wiring layers 280 are formed in the second direction. The metal wiring layers 280 are formed for sets of word line and select gate line (a set of WL0 and SG1, a set of WL1 and SG1, ...) in a one-to-one correspondence. The metal wiring layers 280 are connected by contact plugs CP8 to the second-layer metal wiring layers 270 electrically connected to the corresponding select gate lines. Specifically, each of the metal wiring layers 280 function as a shunt wire for each of the select gate lines SG0 to SG(4m+3). Each of the metal wiring layers 280 is formed in a region between the central part of a word line WL and the central part of the select gate line corresponding to the word line WL. In other words, the metal wiring layer 280 runs through the central part of the memory cell MC. Therefore, the metal wiring layers 280 are arranged at equal intervals in the first direction. The metal wiring layers 280 are connected to each other between second element groups AA2 adjoining each other in the second direction. One end of each metal wiring layer 280 is connected to the select gate decoder 30 and the other end is connected to the write decoder 20.

Figure 10:
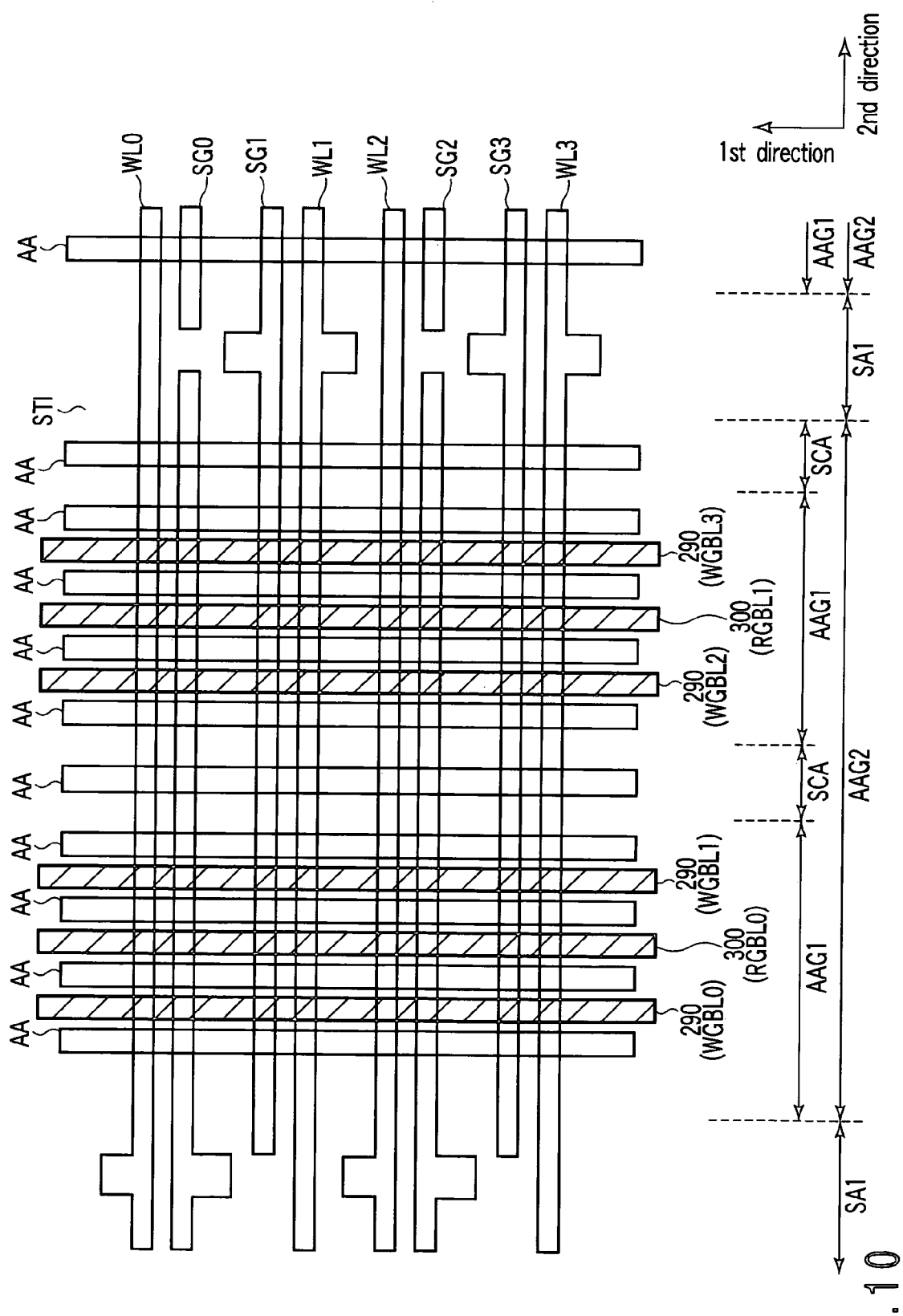
FIG. 10 is a plan view of the memory cell array included in the 2Tr flash memory according to the first embodiment, showing a plane pattern of a metal wiring layer of a fourth layer.

Next, using FIGS. 6 and 10, a pattern of a fourth-layer metal wiring layer existing on the third-layer metal wiring layers 280 will be explained. In FIG. 10, the shaded region is the fourth-layer metal wiring layer.

As shown in FIG. 10, stripe-shaped metal wiring layers 290, 300 are formed in the first direction. The metal wiring layers 290 function as write global bit lines WGBL0 to WGBL(2n+1). The metal wiring layers 300 function as read global bit lines RGBL0 to RGBLn. Two metal wiring layers 290 and one metal wiring layer 300 form a set. A metal wiring layer 290 is provided so as to correspond to a set of two local bit lines LBL0, LBL1 or a set of two local bit lines LBL2, LBL3. A metal wiring layer 300 is provided so as to correspond to a set of four local bit lines LBL0 to LBL3.

Figure 17:
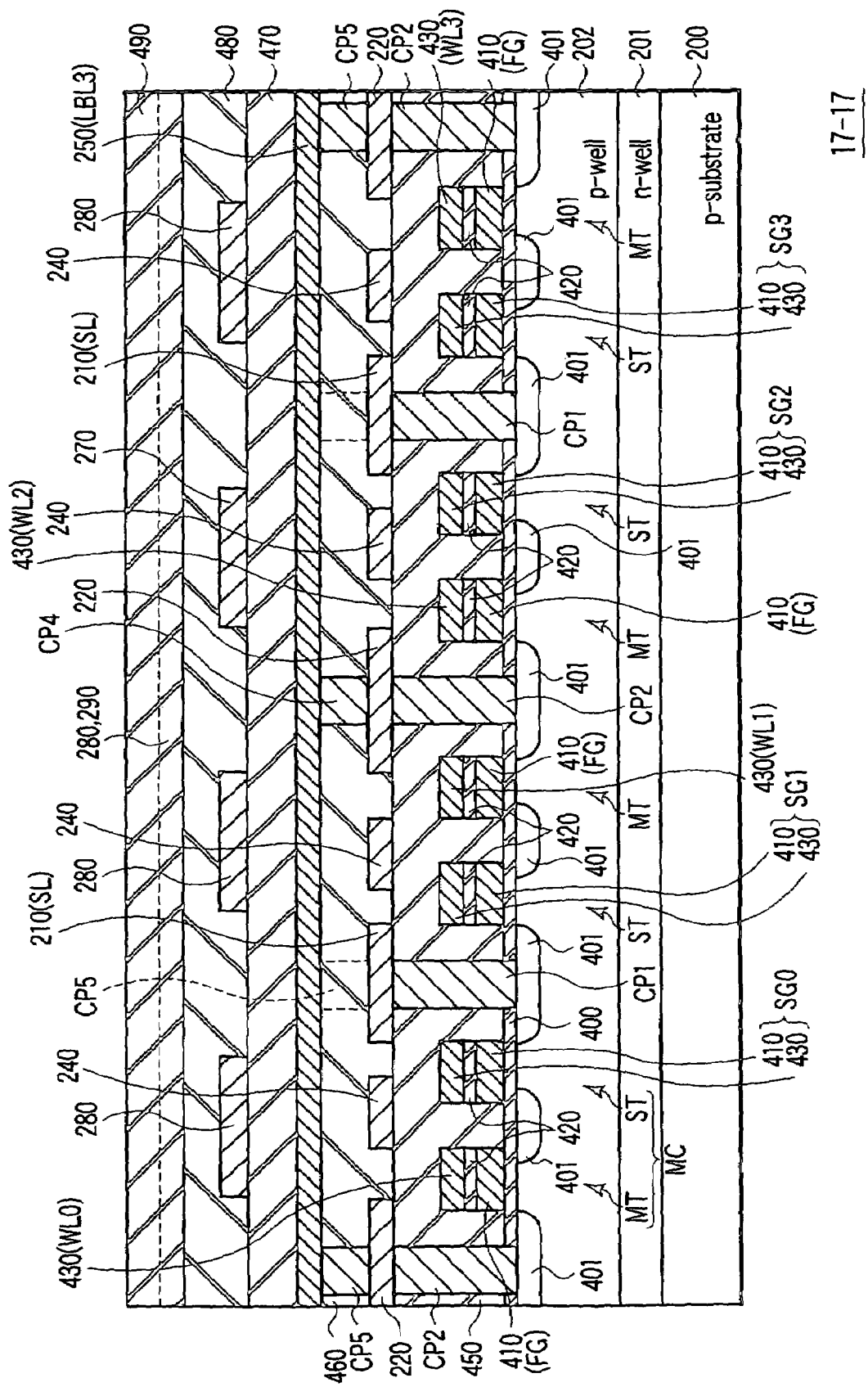
FIG. 17 is a sectional view taken along line 17—17 of FIG. 6.
Figure 18:
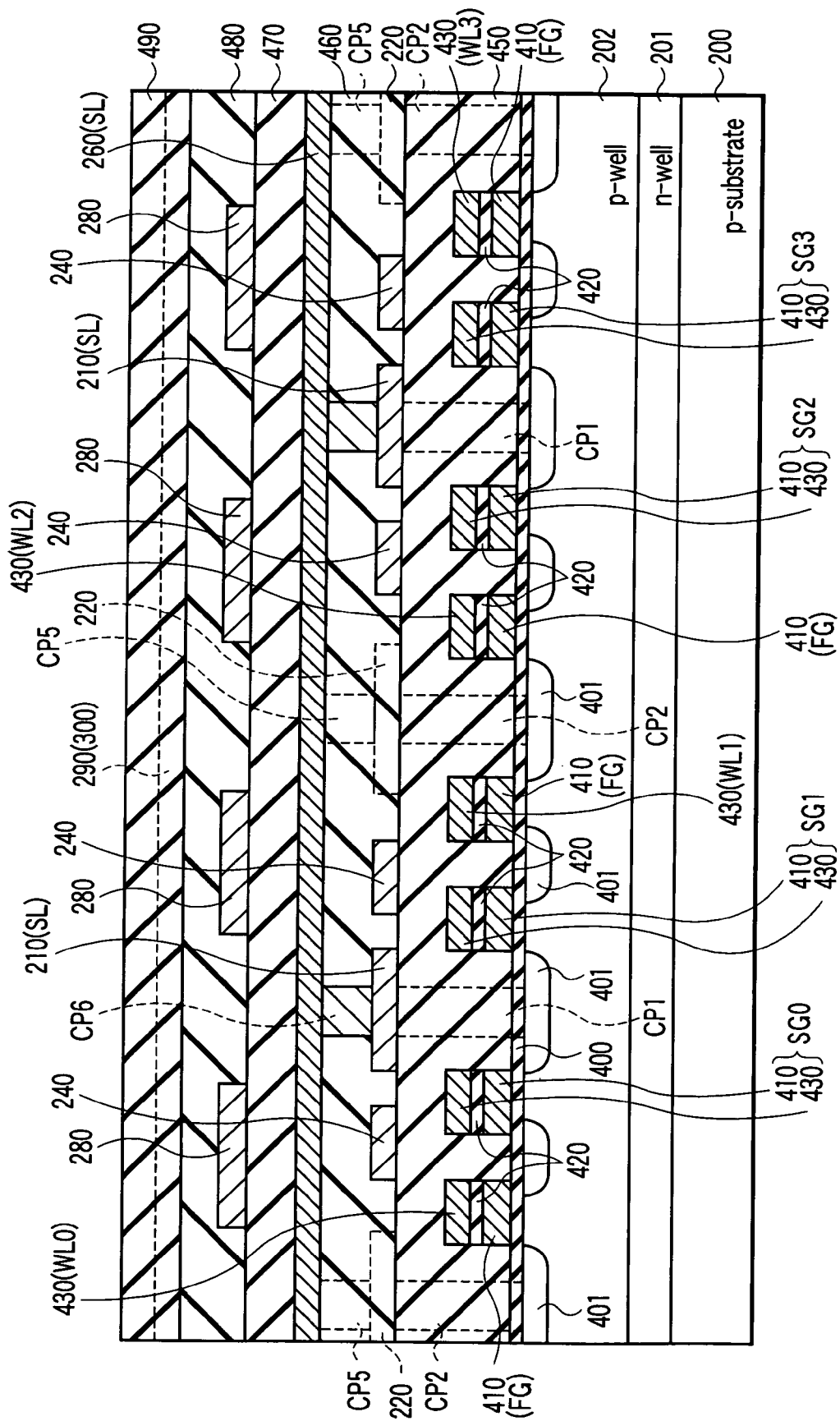
FIG. 18 is a sectional view taken along line 18—18 of FIG. 6.

Next, a sectional structure of the flash memory configured as described above will be explained. Using FIGS. 11 to 18, a sectional structure of the second element region group AAG2 will be explained. FIGS. 11 to 16 are sectional views taken along line 11—11, along line 12—12, along line 13—13, along line 14—14, along line 15—15, and along line 16—16 in FIG. 6, respectively. FIGS. 17 and 18 are sectional views taken along line 17—17 and along line 18—18 in FIG. 6, respectively.

As shown, at the surface of the p-type semiconductor substrate 200, an n-well region 201 is formed. At the surface of the n-well region 201, a p-well region 202 is formed. In the p-well region 202, an element isolating region STI is formed. The region surrounded by the element isolating region STI is an element region AA. On the element region of the p-well region 202, a gate insulating film 400 is formed. On the gate insulating film 400, the gate electrodes of a memory cell transistor MT and a select transistor ST are formed. Each of the gate electrodes of the memory cell transistor MT and the select transistor ST includes a polysilicon layer 410 formed on the gate insulating film 400, an inter-gate insulating film 420 formed on the polysilicon layer 410, and a polysilicon layer 430 formed on the inter-gate insulating film 420. The inter-gate insulating film 420 is made of, for example, a silicon oxide film, or an ON film, NO film, or ONO film having a stacked structure of a silicon oxide film and a silicon nitride film.

Figure 11:
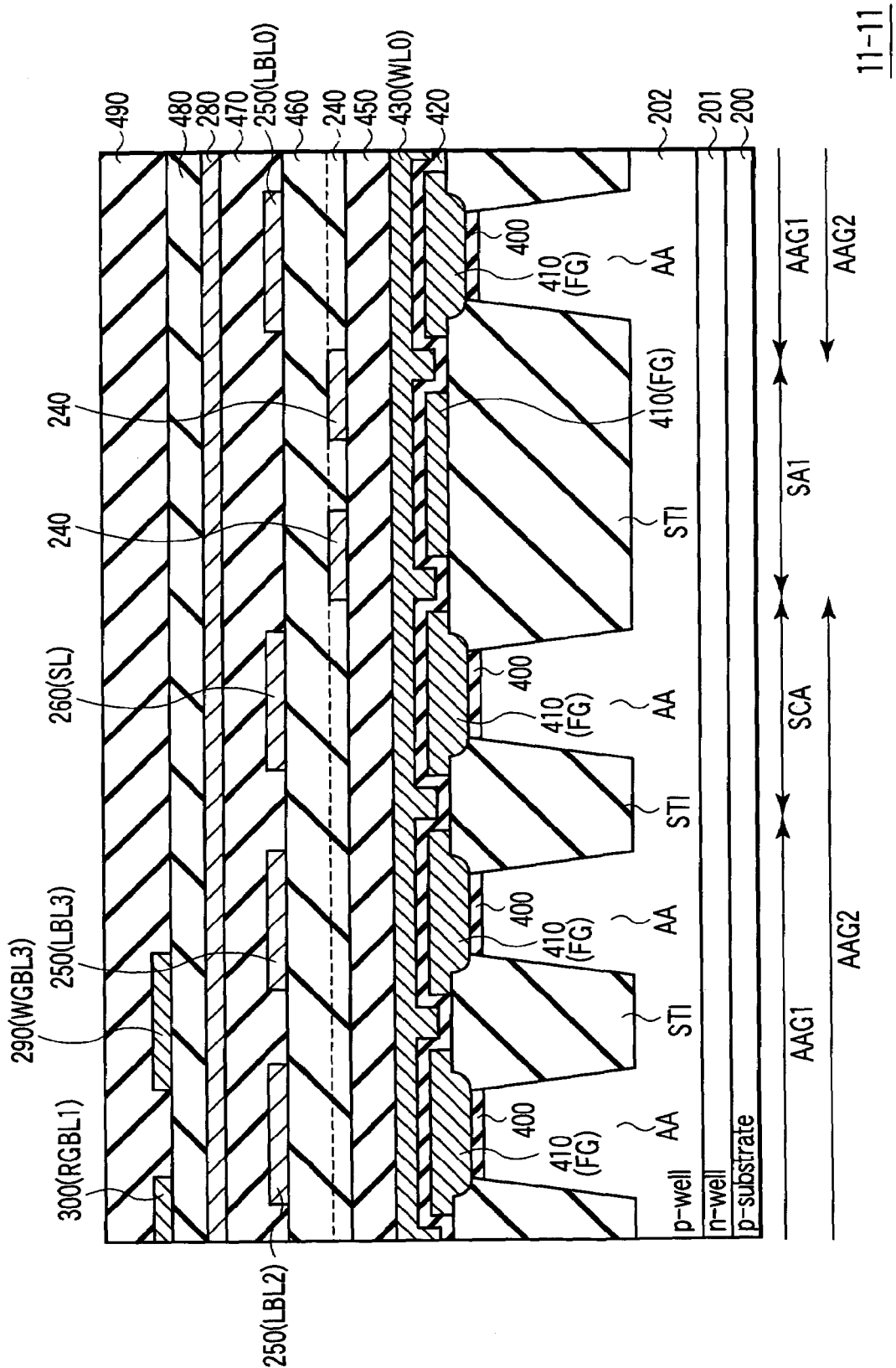
FIG. 11 is a sectional view taken along line 11—11 of FIG. 6.
Figure 14:
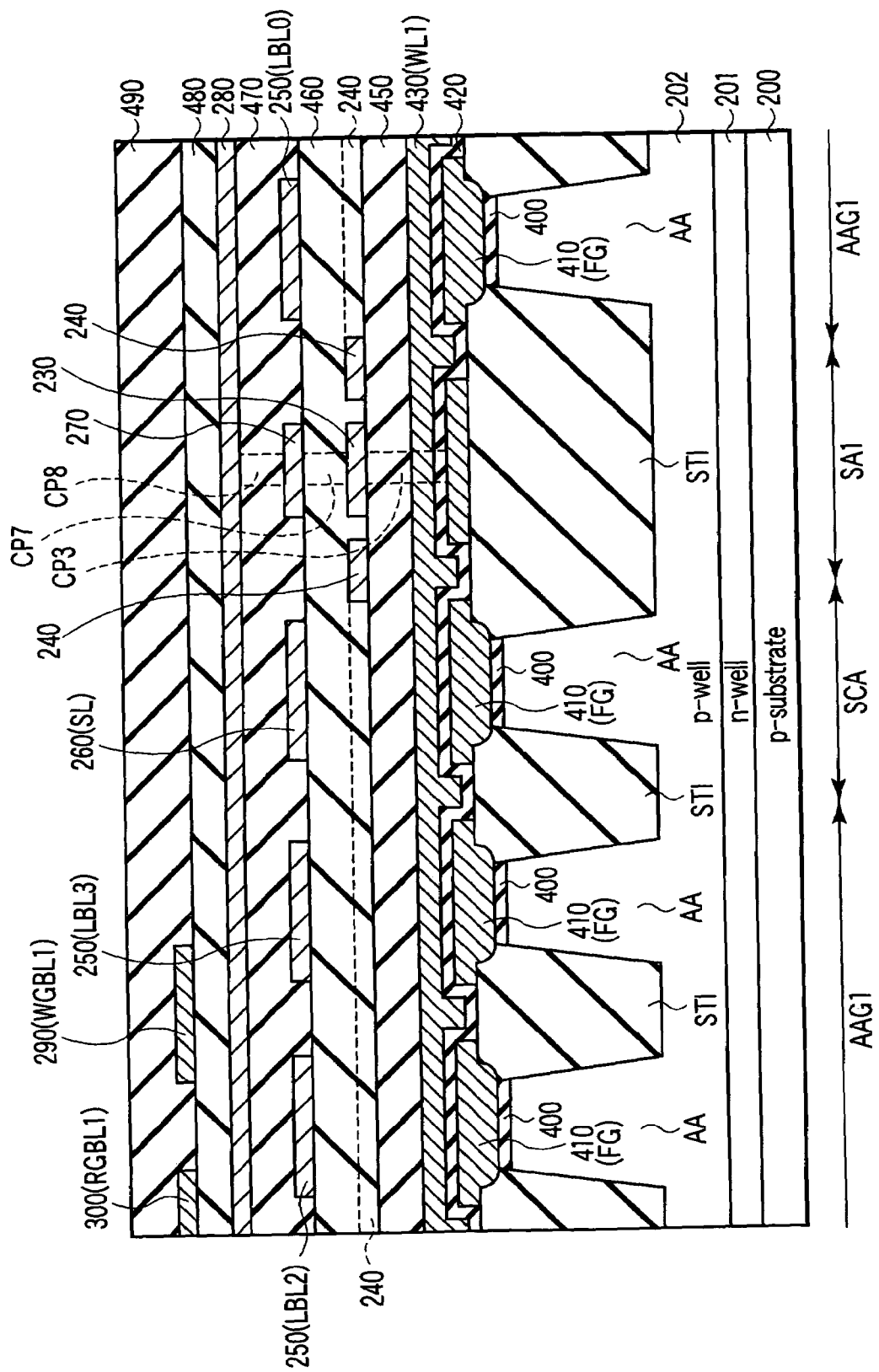
FIG. 14 is a sectional view taken along line 14—14 of FIG. 6.

As shown in FIGS. 11 and 14, in a memory cell transistor MT, the polysilicon layers 410, which are isolated from each other between adjacent element regions AA along the word line, function as floating gates (FG). On the other hand, the polysilicon layers 430, which are shared by adjacent element regions AA, function as control gates (or word line WL).

Figure 12:
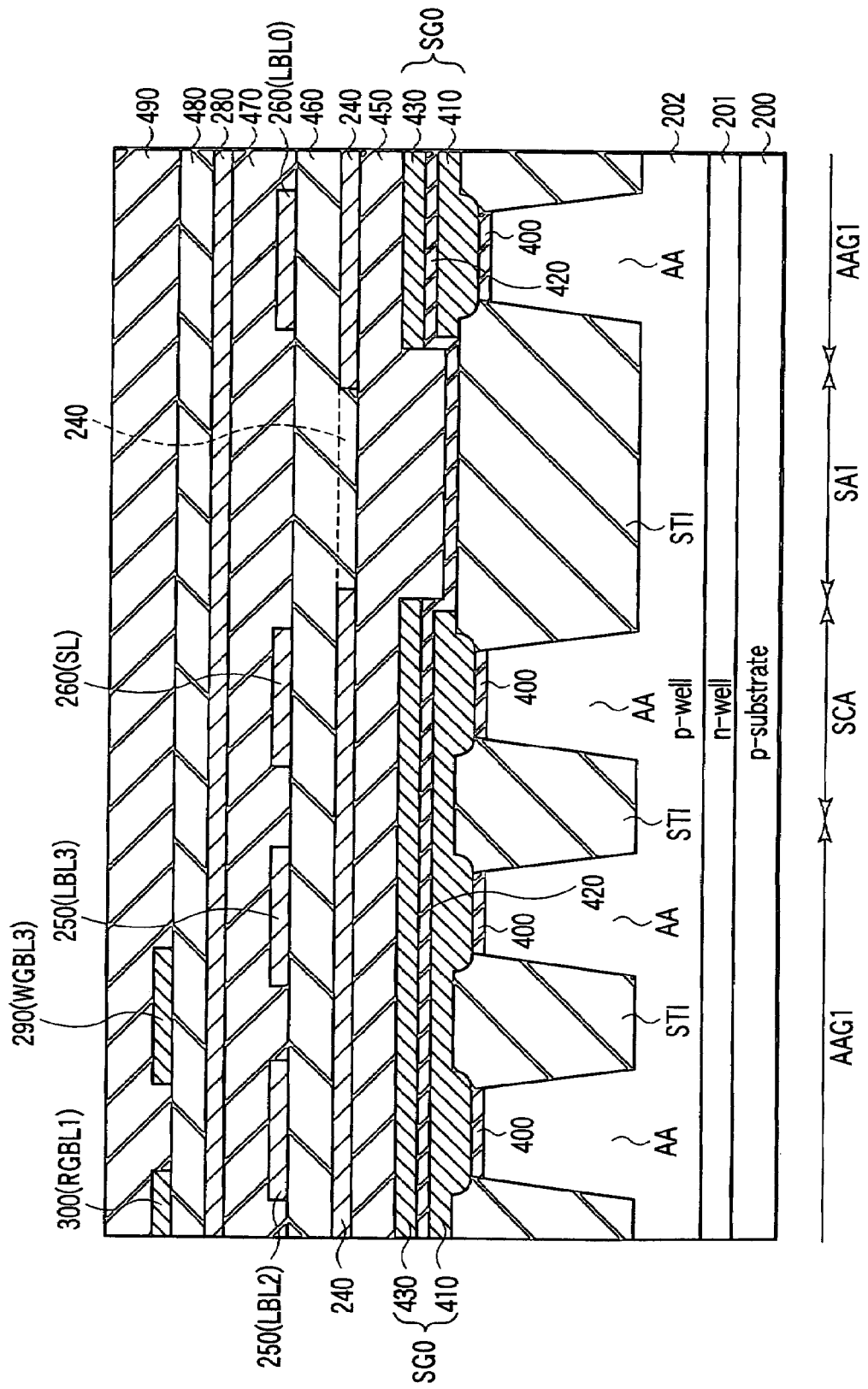
FIG. 12 is a sectional view taken along line 12—12 of FIG. 6.
Figure 13:
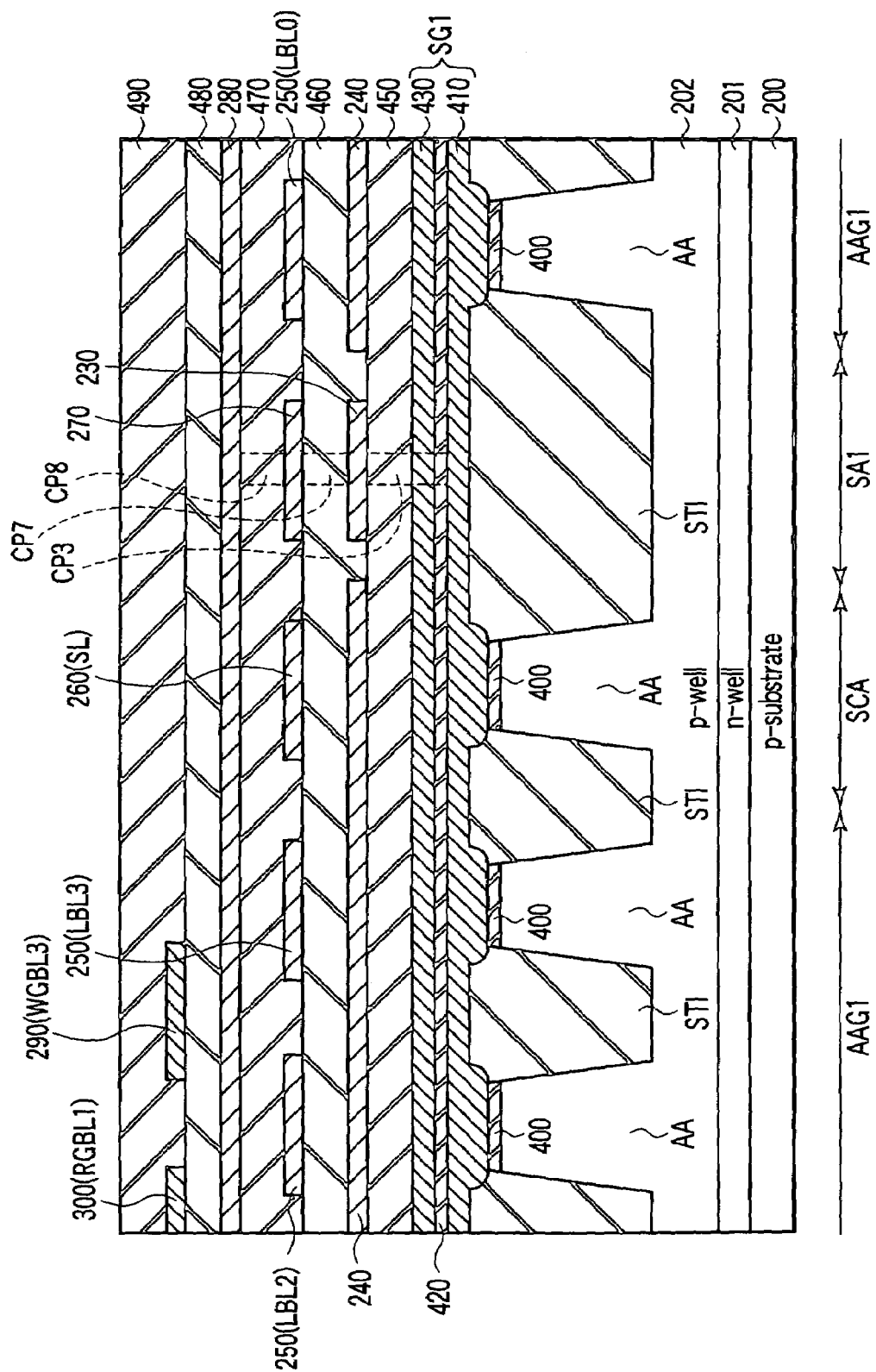
FIG. 13 is a sectional view taken along line 13—13 of FIG. 6.

As shown in FIGS. 12 and 13, in a select transistor ST, the polysilicon layers 210 are shared by adjacent element regions AA. The polysilicon layers 230 are also shared by adjacent element regions AA. Then, the polysilicon layers 410, 430 function as select gate lines SG. Of these polysilicon layers, it is only the polysilicon layers 210 that practically function as select gate lines.

At the surface of the p-well region 202 between adjacent gate electrodes, an impurity diffused layer 401 is formed (see FIGS. 17 and 18). The impurity diffused layer 401 is shared by adjacent transistors.

As described above, a memory cell including a memory cell transistor MT and a select transistor ST is formed so as to have the following relationship. In adjacent memory cells, their select transistors ST or their memory cell transistors MT are adjacent to each other. The adjacent select transistors or memory cell transistors share the impurity diffused layer 401. Therefore, two adjacent memory cells MC, MC, when their select transistors are adjacent to each other, are arranged symmetrically with the impurity diffused layer (or source region) 401 shared by the two select transistors ST, ST. Conversely, when their memory cell transistors MT are adjacent to each other, two adjacent memory cells MC, MC are arranged symmetrically with the impurity diffused layer (or drain region) 401 shared by the two memory cell transistors MT, MT.

Then, on the p-well region 202, an interlayer insulating film 450 is formed so as to cover the memory cell transistors MT and select transistors ST. In the interlayer insulating film 450, a contact plug CP1 is formed which reaches the impurity diffused layer (or source region) 401 shared by two select transistors ST, ST (see FIG. 15). On the interlayer insulating film 450, a metal wiring layer 210 to be connected to the contact plug CP1 is formed. The metal wiring layer 210 functions as a source line SL. In the interlayer insulating film 450, a contact plug CP2 is formed which reaches the impurity diffused layer (or drain region) 401 shared by two memory cell transistors MT, MT (see FIG. 16). On the interlayer insulating film 450, a metal wiring layer 220 to be connected to the contact plug CP2 is formed. Further a metal wiring layer 240 functioning as a shunt wire for word line is formed on the interlayer insulating film 450.

On the interlayer insulating film 450, an interlayer insulating film 460 is formed so as to cover the metal wiring layers 210, 220, 240. In the interlayer insulating film 460, a contact plug CP5 reaching the metal wiring layer 220 is formed (see FIG. 16). On the interlayer insulating film 460, a metal wiring layer 250 connected commonly to a plurality of contact plugs CP5 is formed. The metal wiring layer 250 functions as any one of the local bit lines LBL0 to LBL3. A contact plug CP6 reaching the metal wiring layer 210 is formed in the inter layer insulating film 460 (see FIG. 15, source contact region SCA). On the interlayer insulating film 460, a metal wiring layer 260 connected commonly to a plurality of contact plugs CP6 in the bit line direction is formed (see FIGS. 15 and 18, source contact region SCA). The metal wiring layer 260 functions as a part of a source line SL.

On the interlayer insulating film 460, an interlayer insulating film 470 is formed so as to cover the metal wiring layers 250, 260. On the interlayer insulating film 470, a metal wiring layer 280 is formed. The metal wiring layers 280, which function as shunt wires for the select gate lines, are arranged at equal intervals. On the interlayer insulating film 470, an interlayer insulating film 480 is formed so as to cover the metal wiring layer 280.

On the interlayer insulating film 480, metal wiring layers 290, 300 functioning as write global bit lines and read global bit lines are formed and then an interlayer insulating film 490 is formed.

Figure 19:
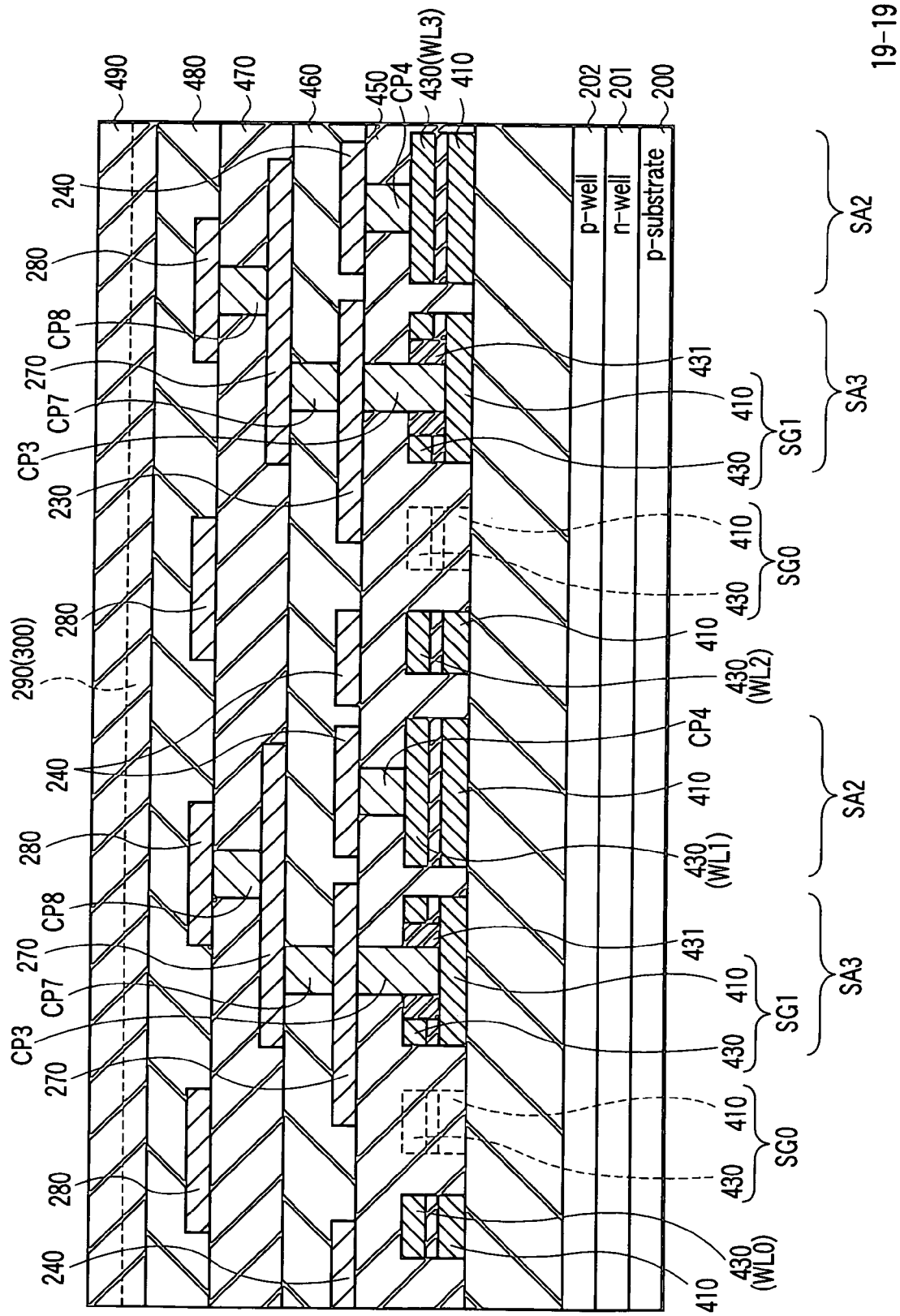
FIG. 19 is a sectional view taken along line 19—19 of FIG. 6.

Next, using FIGS. 12, 15, 16, and 19, a sectional structure of a stitch region SA1 will be explained. FIG. 19 is a sectional view taken along line 19—19 of FIG. 6.

As shown in FIG. 19, an element isolating region STI is formed in the p-well region 202. On the element isolating region STI, the floating gate 410 and control gate 430 of a memory cell transistor MT are formed. The polysilicon layers 410, 430 have been removed from the select gate lines which have no shunt region SA3 in the stitch region SA1 (see FIGS. 12 and 19). That is, the select gate lines are divided by the stitch regions SA1. In each of the select gate lines which have a shunt region SA3, a stacked gate including the polysilicon layers 410, 430 is formed. The stacked gate is formed so as to project toward the adjacent select gate lines (see FIG. 19). Similarly, a word line which has a shunt region SA2 is formed so as to project toward the adjacent word lines (see FIG. 19).

Figure 15:
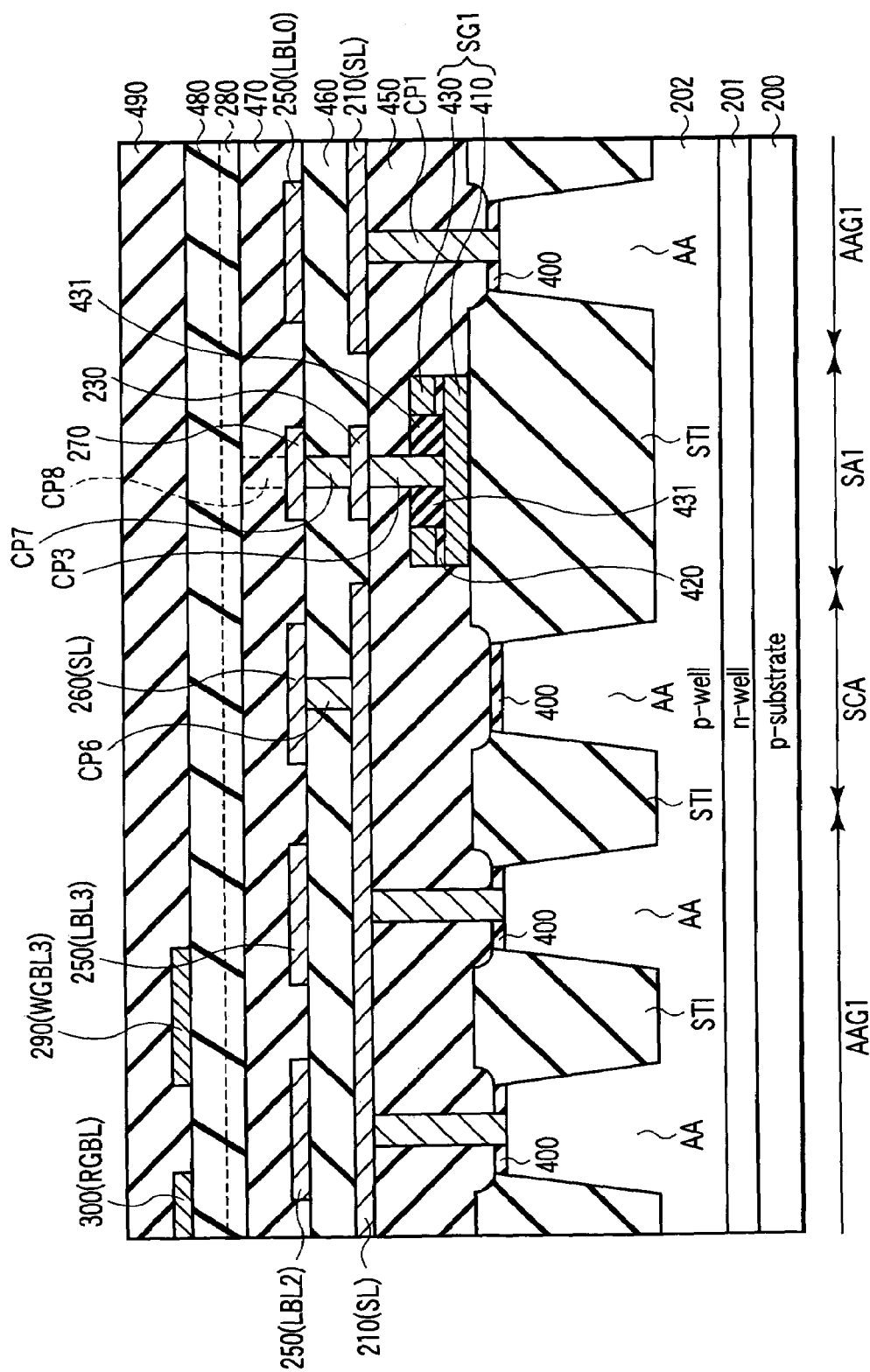
FIG. 15 is a sectional view taken along line 15—15 of FIG. 6.

As shown in FIGS. 15 and 19, in a shunt region SA3, the polysilicon layer 430 and inter-gate insulating film 420 are removed, thereby exposing the polysilicon layer 410. Then, a contact plug CP3 is formed so as to contact the top of the polysilicon layer 410 in the region. An insulating film 431 electrically isolates the contact plug CP3 from the polysilicon layer 430. The contact plug CP3 is formed from the surface of the interlayer insulating film 450 so as to reach the polysilicon layer 410.

Figure 16:
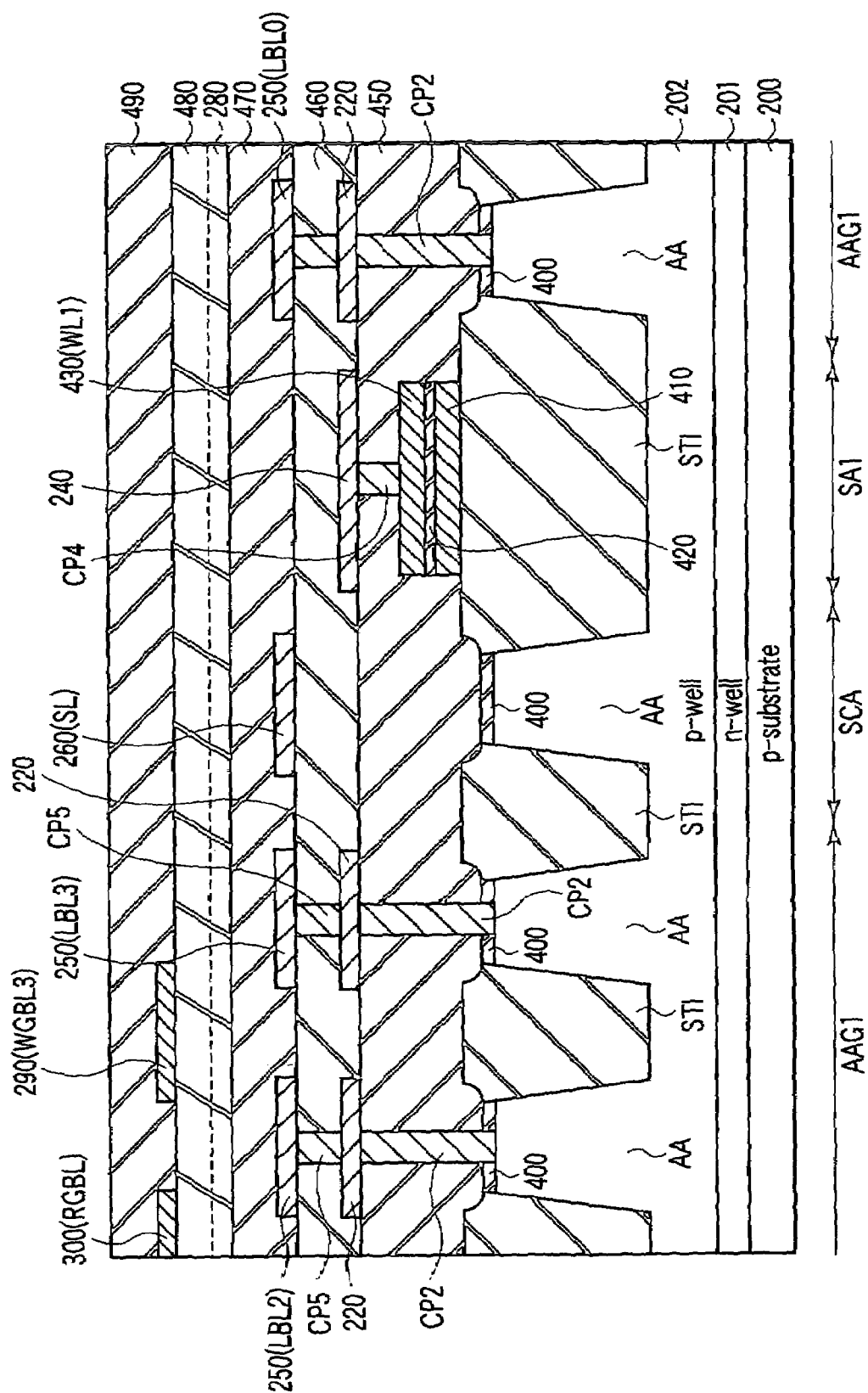
FIG. 16 is a sectional view taken along line 16—16 of FIG. 6.

As shown in FIGS. 16 and 19, in a shunt region SA2, a contact plug CP4 is formed in the interlayer insulating film 450. The contact plug CP4 is formed from the surface of the interlayer insulating film 450 so as to reach the polysilicon layer 430.

On the inter-layer insulating film 450, metal wiring layers 230, 240 are formed. A metal wiring layer 240, which is a shunt wire for a word line, is connected to the corresponding word line (polysilicon layer 430) by a contact plug CP4. A metal wiring layer 230 is connected to the corresponding select gate line (polysilicon layer 410) by a contact plug CP3. On the interlayer insulating film 450, an interlayer insulating film 460 is formed so as to cover the metal wiring layers 230, 240. In the interlayer insulating film 460, a contact plug CP7 reaching the metal wiring layer 230 is formed. On the interlayer insulating film 460, a metal wiring layer 270 connected to the contact plug CP7 is formed. The metal wiring layer 270 is extended so as to cover the top of the gate electrode of the corresponding select transistor ST and the top of the stacked gate electrode of the memory cell transistor MT corresponding to the select transistor ST (see FIG. 19). On the interlayer insulating film 460, an interlayer insulating film 470 is formed. In the interlayer insulating film 470, a contact plug CP8 reaching the metal wiring layer 270 is formed. As shown in FIG. 19, the contact plug CP8 is in the central part of a memory cell. In other words, it is formed in a region between the central part of the stacked gate of a memory cell transistor MT and the central part of the gate electrode of a select transistor ST. On the interlayer insulating film 470, a metal wiring layer 280 connected to the contact plug CP8 is formed. As shown in FIG. 19, a plurality of metal wiring layers 280 are arranged at equal intervals on the interlayer insulating film 470. Then, on the interlayer insulating film 470, interlayer insulating films 480, 490 are formed so as to cover the metal wiring layers 280.

Figure 20:
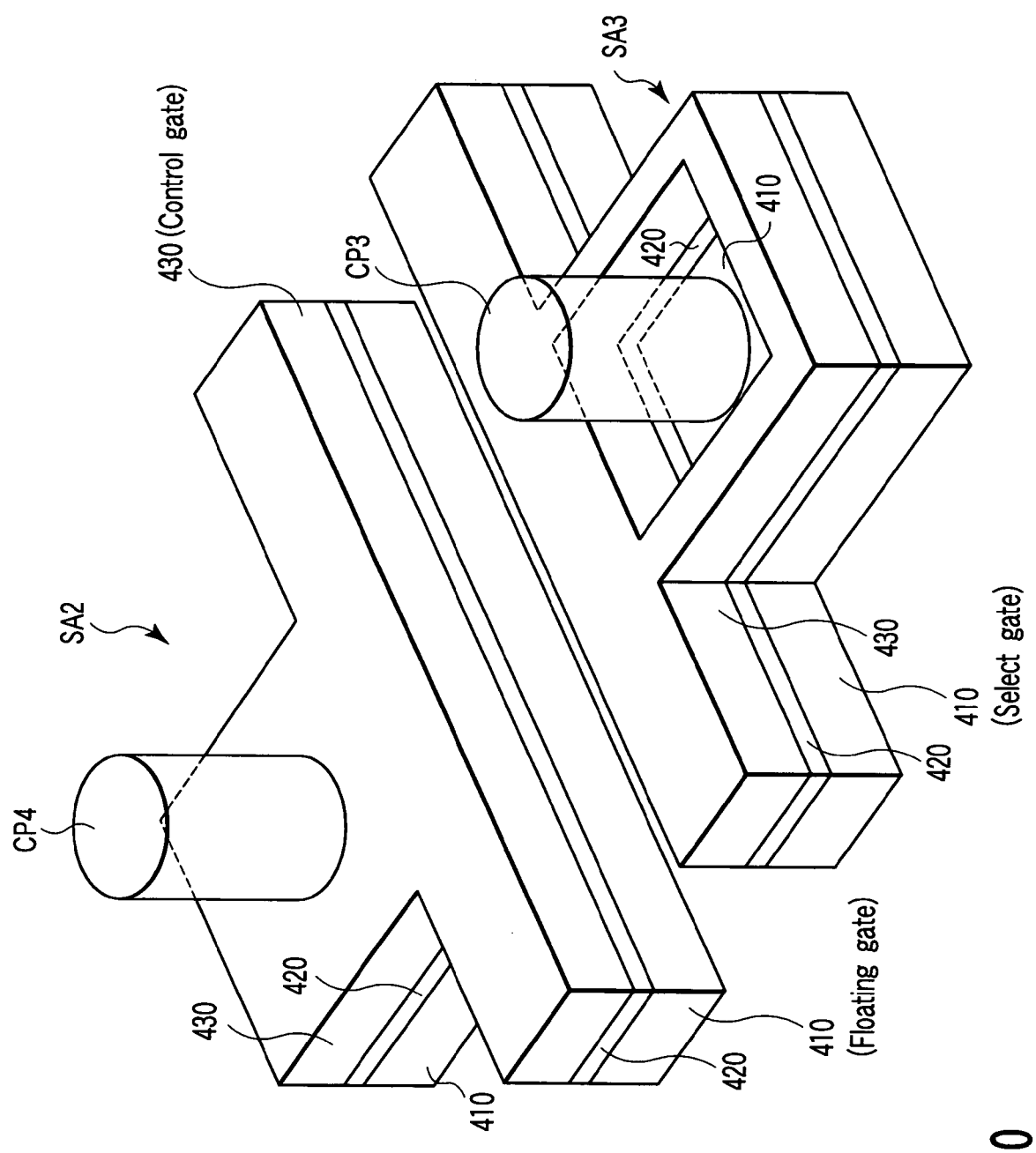
FIG. 20 is a perspective view of the shunt region in FIG. 6.

FIG. 20 is a perspective view of shunt regions SA2 and SA3. As shown in FIG. 20, each of a stacked gate structure of a word line and that of a select gate line is made wider in part. In a shunt region SA2, a contact plug CP4 is formed on the polysilicon layer 430 made wider. In a shunt region SA3, the polysilicon layer 430 and inter-gate insulating film 420 in a part of the wider region are removed, thereby exposing the polysilicon layer 410. A contact plug CP3 is formed so as to touch the exposed polysilicon layer 410. The contact plug CP3 is electrically isolated from the polysilicon layer 430. That is, the polysilicon layer 430 is electrically isolated from the shunt wire 280.

Figure 21:
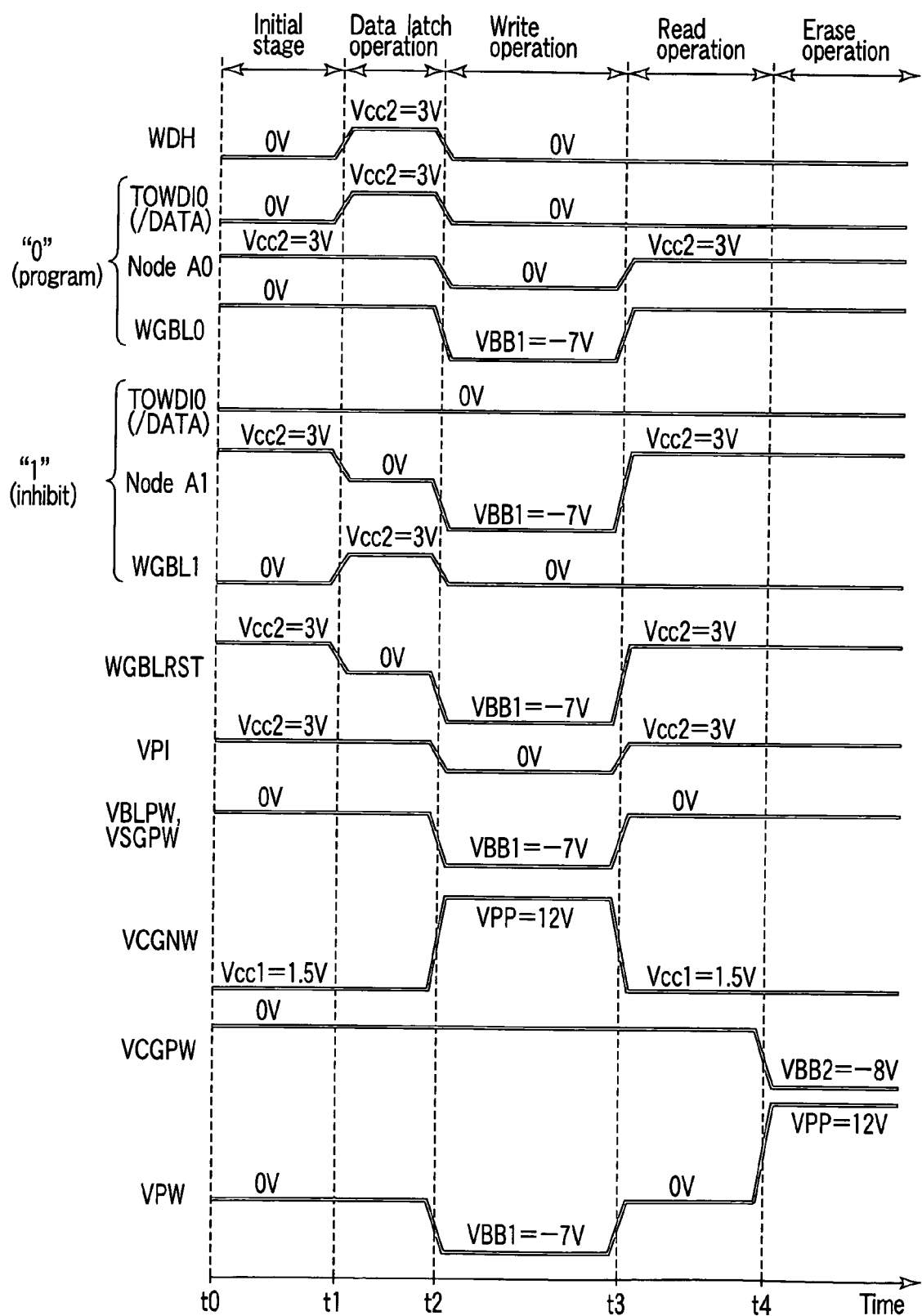
FIG. 21 is a timing chart for various signals in the operation of the 2Tr flash memory according to the first embodiment.

Next, the operation of the 2Tr flash memory 3 with the above configuration will be explained with reference to FIG. 21. FIG. 21 is a timing chart for various signals and voltages at various nodes. Hereinafter, a state where no electron is injected into the floating gate and the threshold voltage is negative is defined as a state where "1" data has been written. A state where electrons are injected into the floating gate and the threshold voltage is positive is defined as a state where "0" data has been written. To simplify explanation, a case where a memory cell array 10 has two write global bit lines WGBL0, WGBL1 and one read global bit line RGBL0 is used as an example.

<Initial Operation>

Figure 22:
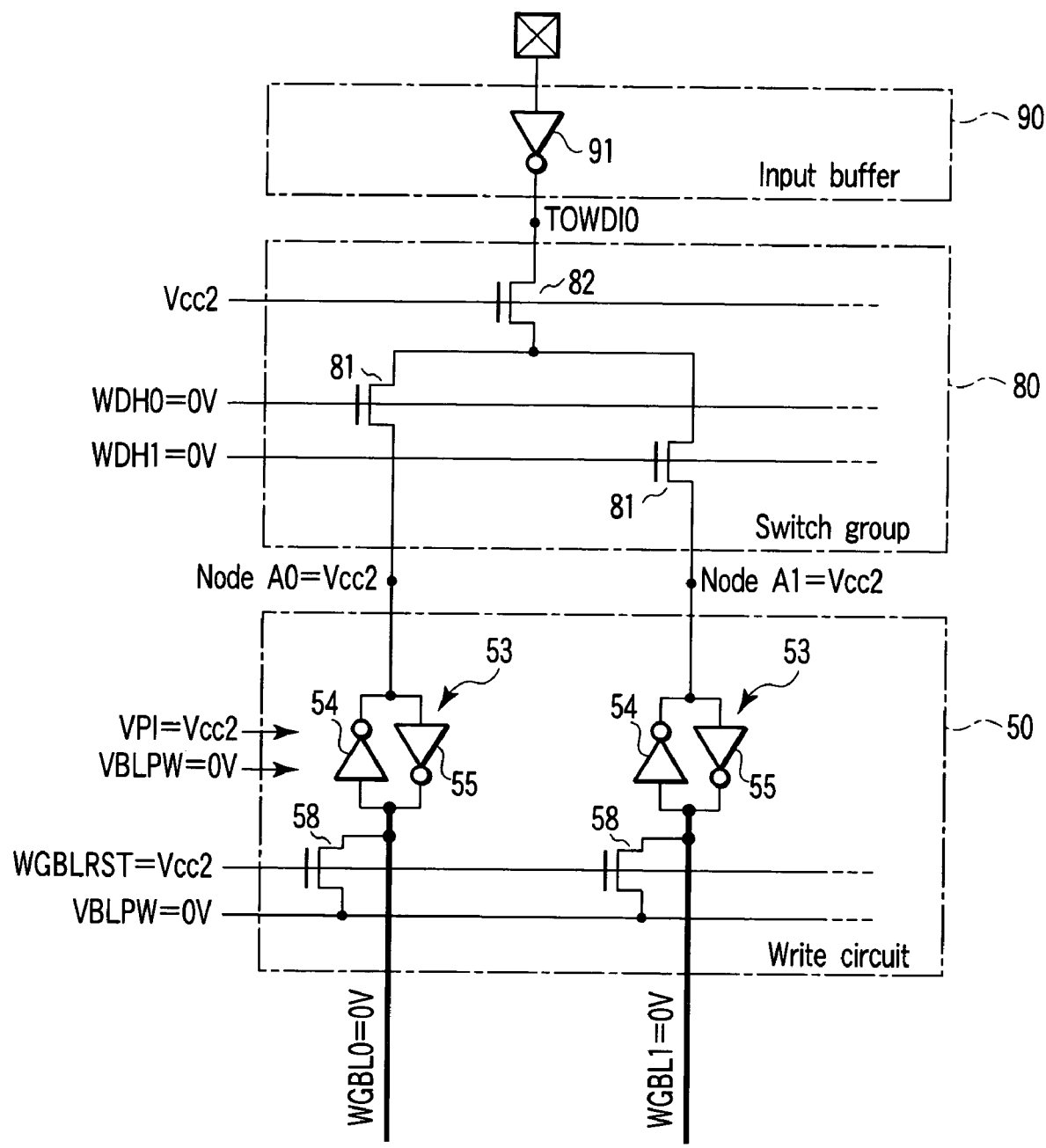
FIG. 22 is a circuit diagram to help explain the states of an input buffer, switch group, and write circuit in the initial operation of the 2Tr flash memory according to the first embodiment.

An initial operation will be explained with reference to FIG. 22. An initial operation is the first operation to be performed in a write, a read, and an erase operation. In FIG. 21, an initial operation is carried out in the period between time t0 to time t1. FIG. 22 is a circuit diagram of the input buffer 90, switch group 80, and write circuit 50 corresponding to the write global bit lines WGBL0, WGBL1 in an initial operation.

Before the initial operation, the signals WDH0 and WDH1 are both set to the low (L) level (0V), turning off the MOS transistors 81 in the switch group 80, which electrically isolates the write circuit 50 from the input buffer 180. The write inhibit voltage VPI supplied as the high voltage power supply voltage of the latch circuit 53 is set to Vcc2 and VBLPW is set to 0V. Then, the signal WGBLRST is set to the high (H) level (Vcc2) and all of the write global bit lines WGBL0, WGBL1 are reset. That is, the MOS transistors 58 in the write circuit 50 are turned on, thereby allowing VBLPW node to apply 0V to the write global bit lines WGBL0, WGBL1. As a result, the output nodes of all of the latch circuits 53 go to the low (L) level (0V) and the input nodes (node A0, node A1) go to the high (H) level (Vcc2).

As described above, in the initial operation, the write global bit lines are set to 0V and Vcc2 is applied to node A0 and node A1.

<Data Latch Operation>

Figure 23:
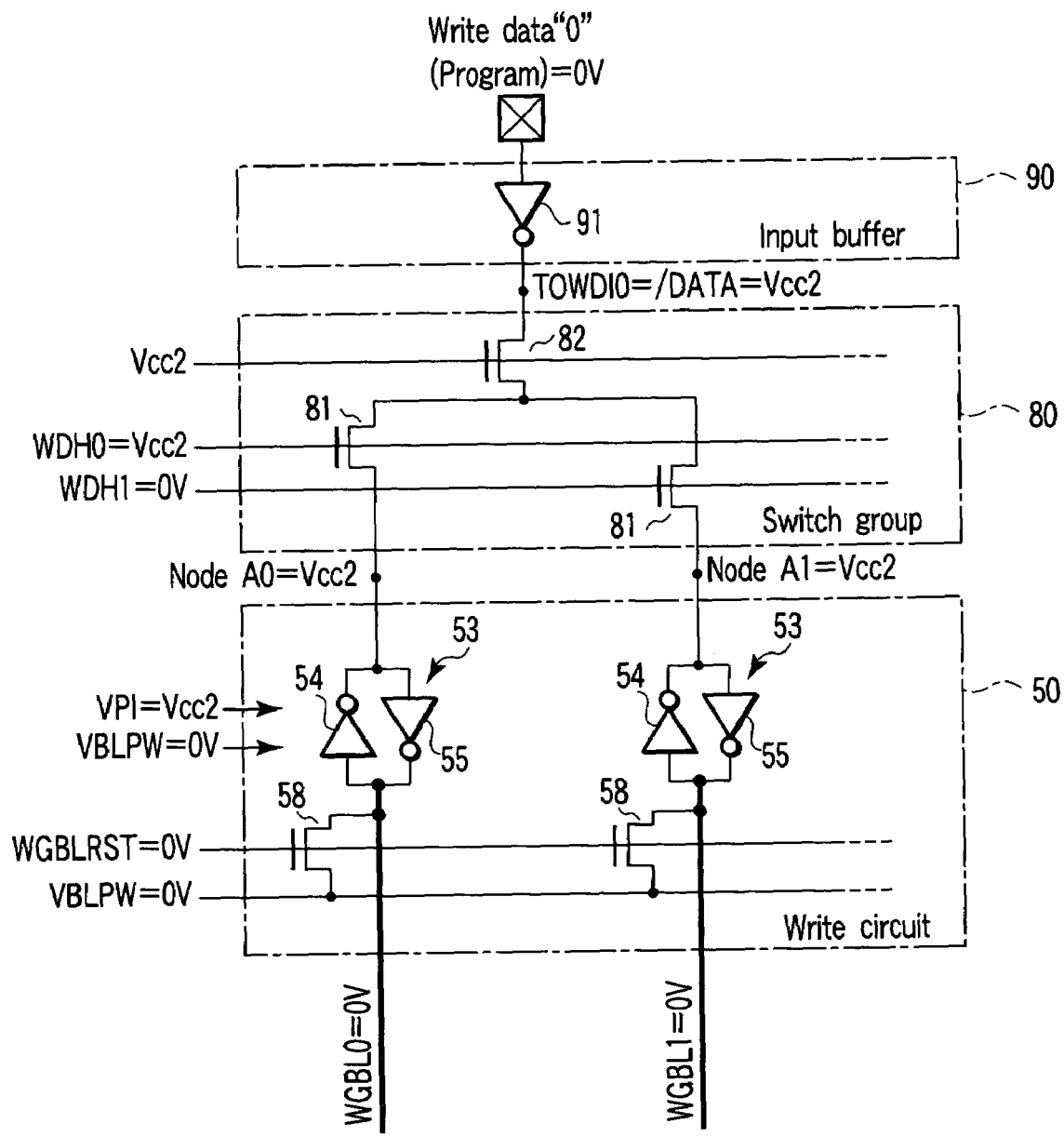
FIG. 23 is a circuit diagram to help explain the states of the input buffer, switch group, and write circuit in a data latch operation of the 2Tr flash memory according to the first embodiment.
Figure 24:
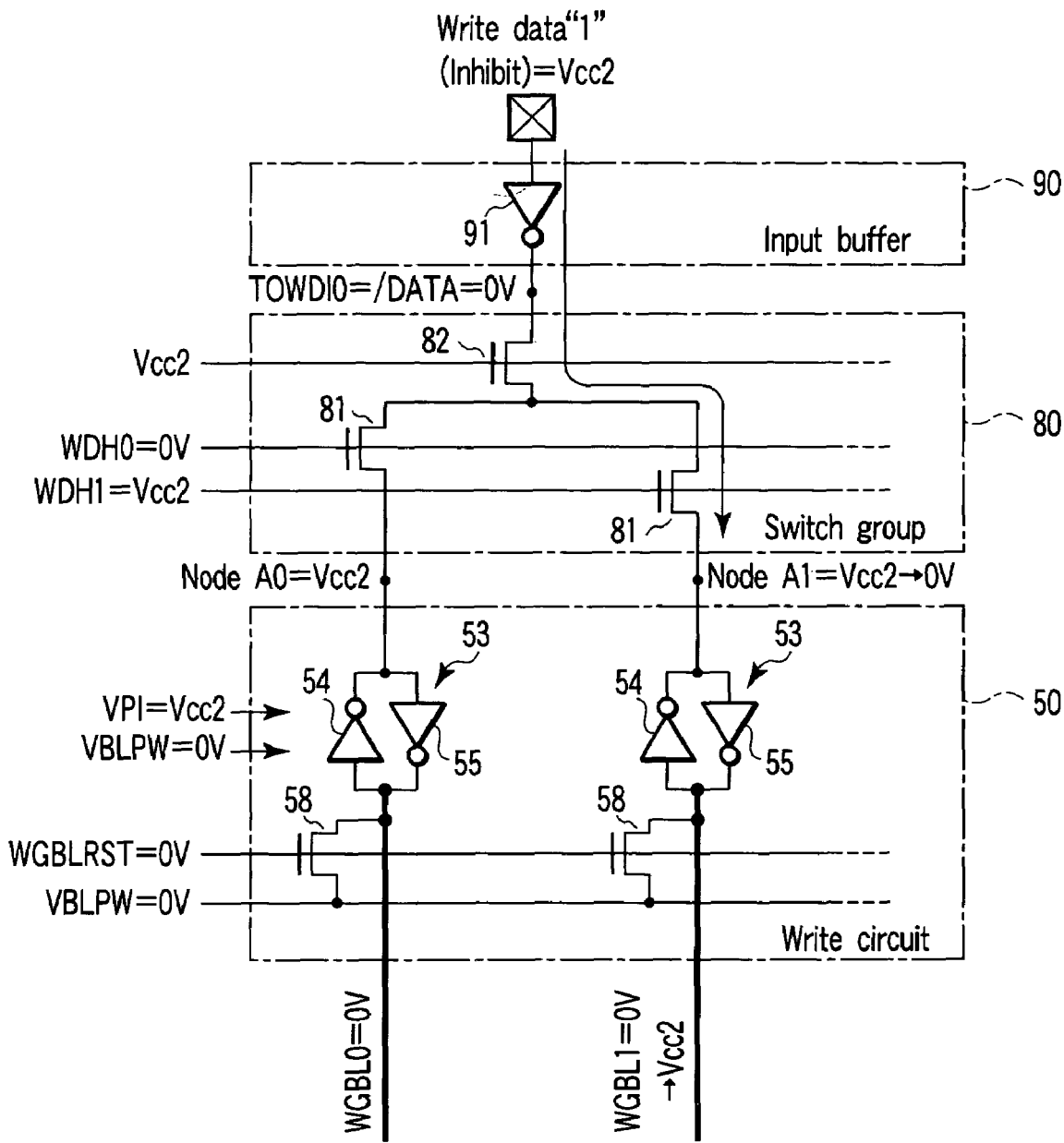
FIG. 24 is a circuit diagram to help explain the states of the input buffer, switch group, and write circuit in a data latch operation of the 2Tr flash memory according to the first embodiment.

Next, a data latch operation will be explained with reference to FIGS. 23 and 24. A data latch operation is the operation of inputting the write data to each latch circuit 53 in a write operation. A data latch operation is carried out between time t1 to time t2 in FIG. 21. FIGS. 23 and 24 are circuit diagrams of the input buffer 90, switch group 80, and write circuit 50 in a data latch operation. FIG. 23 shows a case where "0" data has been input. FIG. 24 shows a case where "1" data has been input. Hereinafter, explanation will be given using a case where "0" data is written into the memory cells connected to write global bit line WGBL0 (that is, WGBL0 is selected) and "1" data is written into the memory cells connected to WGBL1 (that is, WGBL1 is unselected).

First, a case where "0" data is input will be explained with reference to FIG. 23. Before a data latch operation, the signal WGBLRST is set to 0V, thereby turning off the MOS transistor 58, which electrically isolates write global bit lines WGBL0, WGBL1 from VBLPW node. To latch the data in the latch circuit 53 corresponding to write global bit line WGBL0, the signal WDH0 is set to the high (H) level (Vcc2), which turns on the MOS transistor 81 corresponding to write global bit line WGBL0. On the other hand, the MOS transistor 81 corresponding to write global bit line WGBL1 is turned off. Therefore, the input buffer 90 is electrically connected to the latch circuit 53 corresponding to write global bit line WGBL0.

Then, the CPU 2 inputs "0" data to the inverter of the input buffer 90. When "0" data is input, 0V is applied to the input node of the inverter 91. The "0" data is inverted by the inverter 91. As a result, the potential of TOWDI0 node goes to Vcc2. Then, since Vcc2 has been applied to the gate of the MOS transistor 82, the MOS transistor 82 goes into the cutoff state. Therefore, the latch circuit 53 keeps holding the data given in the period between time t0 to time t1. That is, node A0 remains at Vcc2 and write global bit line WGBL0 remains at 0V.

Next, a case where "1" data is input will be explained with reference to FIG. 24. What differs from the case where "0" data is input is that setting WDH0 to 0V (WDH0=0V) and WDH1 to Vcc2 (WDH1=Vcc2) brings the MOS transistor 81 corresponding to write global bit line WGBL1 into the on state.

Then, the CPU 2 inputs "1" data to the input buffer 90. When "1" data is input, Vcc2 is applied to the input node of the inverter 91. Consequently, the potential at the TOWDI0 node goes to 0V. The potential at TOWDI0 node is input to the latch circuit 53 via the current path of the MOS transistor 81. As a result, the potential at node A1 is inverted from Vcc2 to 0V, which inverts the potential on write global bit line WGBL1 from 0V to Vcc2.

As described above, in the data latch operation, the data in the latch circuit corresponding to the memory cell into which "1" data is to be written is reversed from its initial state. That is, when "0" writing is done (or when electrons are injected), virtually no data is input from the outside. When "1" writing (or when no electron is injected=the memory is unselected), the data is taken in from the outside.

<Write Operation>

Figure 25:
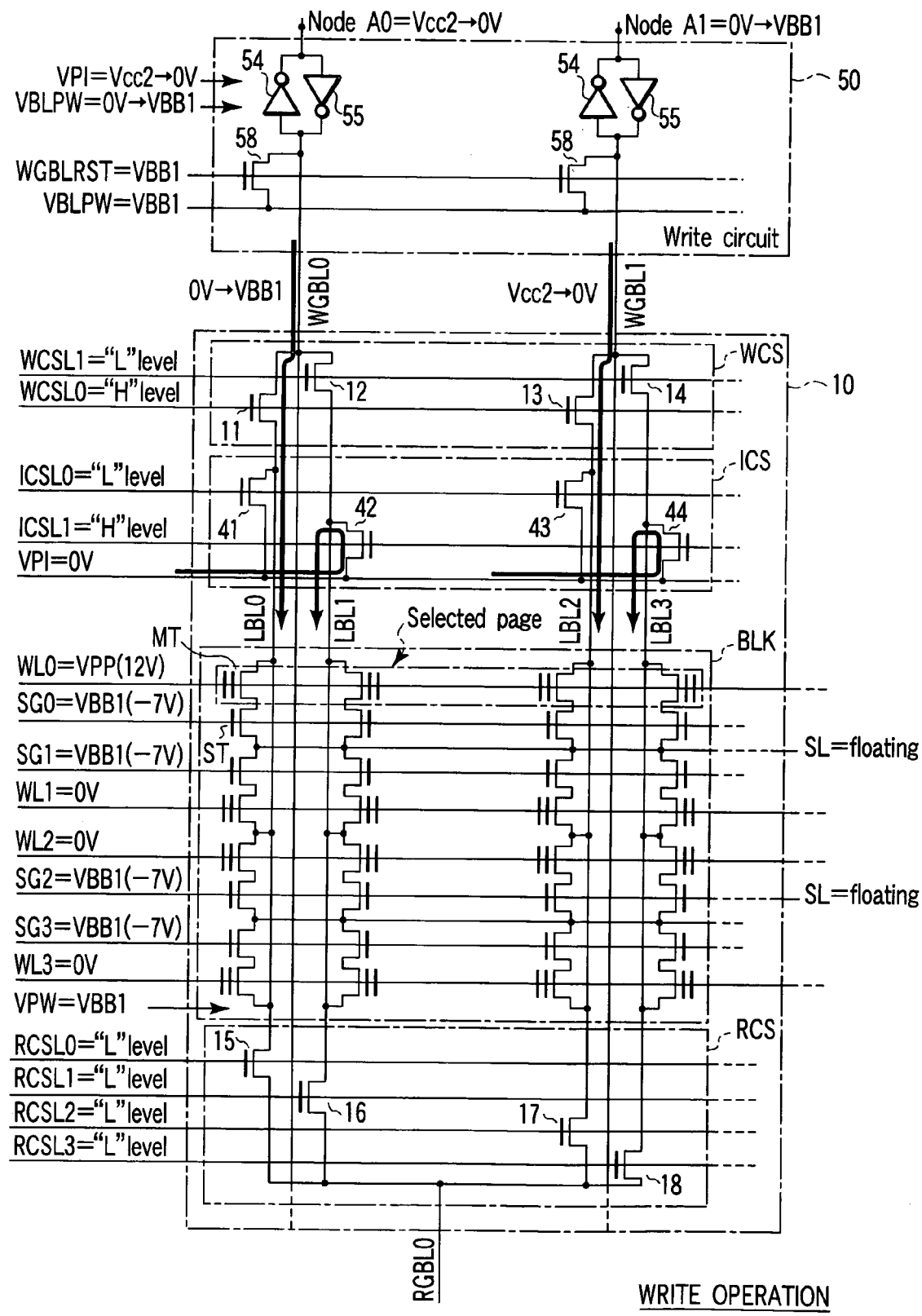
FIG. 25 is a circuit diagram to help explain the states of the memory cell array, select gate decoder, switch group, and write circuit in a write operation of the 2Tr flash memory according to the first embodiment.

A write operation will be explained with reference to FIG. 25. Data is written simultaneously into all of the memory cell blocks in a row. In each of the memory cell blocks, the memory cells written into simultaneously include those connected to one of the local bit lines LBL0 and LBL1 and those connected to one of the local bit lines LBL2 and LBL3.

In FIG. 21, a write operation is carried in the period between time t2 and t3. FIG. 25 is a circuit diagram of a part of the memory cell array 10 and write circuit 50 in a write operation. In FIG. 25, it is assumed that data is written into the memory cell transistors MT connected to word line WL0 and local bit lines LBL0, LBL2 and that, of the memory cell transistors MT, "0" data is written into the one connected to local bit line LBL0 and "1" data is written into the one connected to local bit line LBL2. In other words, the memory cell connected to local bit line LBL0 is selected and the memory cell connected to local bit line LBL2 is unselected.

First, before a write operation, the signal WGBLRST still remains at 0V. Then, at time t2, the write inhibit voltage VPI changes from Vcc2 to 0V and the potential at VBLPW node changes from 0V to VBB1 (−7V). Under the control of the write state machine 120, the voltage generator 130 outputs the negative potential VBB1. The potential of VPI may be a negative potential instead of 0V.

Then, the low-voltage-side power supply voltage of the inverters 54, 55 in the latch circuit 53 changes from 0V to VBB1 and the high-voltage-side power supply voltage changes from Vcc2 to 0V, with the result that the potentials at node A0 and node A1 change to 0V and VBB1, respectively. The potentials on write global bit lines WGBLD, WGBL1 also change to VBB1 and 0V, respectively.

Then, the write decoder 20 selects word line WL0 and applies the positive voltage VPP (12V) to the selected word line WL0. In addition, the isolating MOS transistor 25 is turned on, which allows the negative potential VBB1 (=7V) to be applied from VSGPW node to all of the select gate lines SG0 to SG(4m+3). Moreover, the write decoder 20 applies the negative potential VBB1 to the substrate (p-well region 202) in which memory cells have been formed. In a write operation, the signal ZISOG is kept at the low (L) level, which electrically isolates the row address decode circuit 31 of the select gate decoder 30 from the select gate lines.

The column decoder 40 selects write column select line WCSLD from the two write column select lines connected to the write column selector WCS corresponding to the memory cell block BLK including the selected word line WL0. This turns on the MOS transistors 11, 13 in the write column selector WCS. As a result, write global bit line WGBL0 and local bit line LBL0 are electrically connected and write global bit line WGBL1 and local bit line LBL2 are electrically connected.

Furthermore, the column decoder 40 makes unselected all of the write column select lines connected to the write column selector WCS corresponding to the memory cell block BLK which does not include the selected word line WL0. Therefore, the MOS transistors 11 to 14 in the write column selector WCS corresponding to the memory cell block BLK not including the selected word line are turned off.

Furthermore, the column decoder 40 makes unselected all of the read column select lines RCSL0 to RCSL(4m+3). This turns off the MOS transistors 15 to 18 in all of the read column selectors RCS. Therefore, the read global bit lines RGBL are electrically isolated from local bit lines LBL0 to LBL3.

In addition, to turn on the MOS transistors 42, 44 connected to local bit lines LBL1, LBL3 made unselected, the column decoder 40 sets the write inhibit column select line ICSL1 to the high (H) level (Vcc2). Write inhibit column select line ICSL0 connected to the MOS transistors 41, 43 corresponding to the selected local bit lines LBL0, LBL2 is set to the low (L) level, which turns off the MOS transistors 41, 43. As a result, the write inhibit voltage VPI=0V is applied to the unselected local bit lines LBL1, LBL3.

Consequently, the write voltage (VBB1) is applied from write global bit line WGBL0 via the MOS transistor 11 in the write column selector WCS to the local bit line LBL0 in the memory cell block BLK including the selected word line WL0. Moreover, the write inhibit voltage VPI (0V) is applied from write global bit line WGBL1 via the MOS transistor 13 to local bit line LBL2 in the memory cell block BLK including the selected word line WL0.

As a result, in the memory cell transistor MT connected to write global bit lines WGBL1 and word line WL0, since the potential difference between the gate and channel is insufficient (VPP−VPI=12V), no electron is injected into the floating gate. Thus, the memory cell MC holds the negative threshold value. That is, "1" data is written. Furthermore, in the memory cell transistors MT connected to the unselected local bit lines LBL1, LBL3 and word line WL0, since VPI is applied to the channel, no electron is injected into the floating gate, which enables the memory cell MC to hold the negative threshold value. On the other hand, in the memory cell transistor MT connected to write global bit line WGBL0 and word line WL0, since the potential difference between the gate and channel is sufficient (VPP−VBB1=19V), electrons are injected into the floating gate by FN tunneling. As a result, the threshold value of the memory cell transistor MT changes to positive. That is, "0" data is written.

As described above, the data is written into one page of memory cell transistors simultaneously.

<Read Operation>

Figure 26:
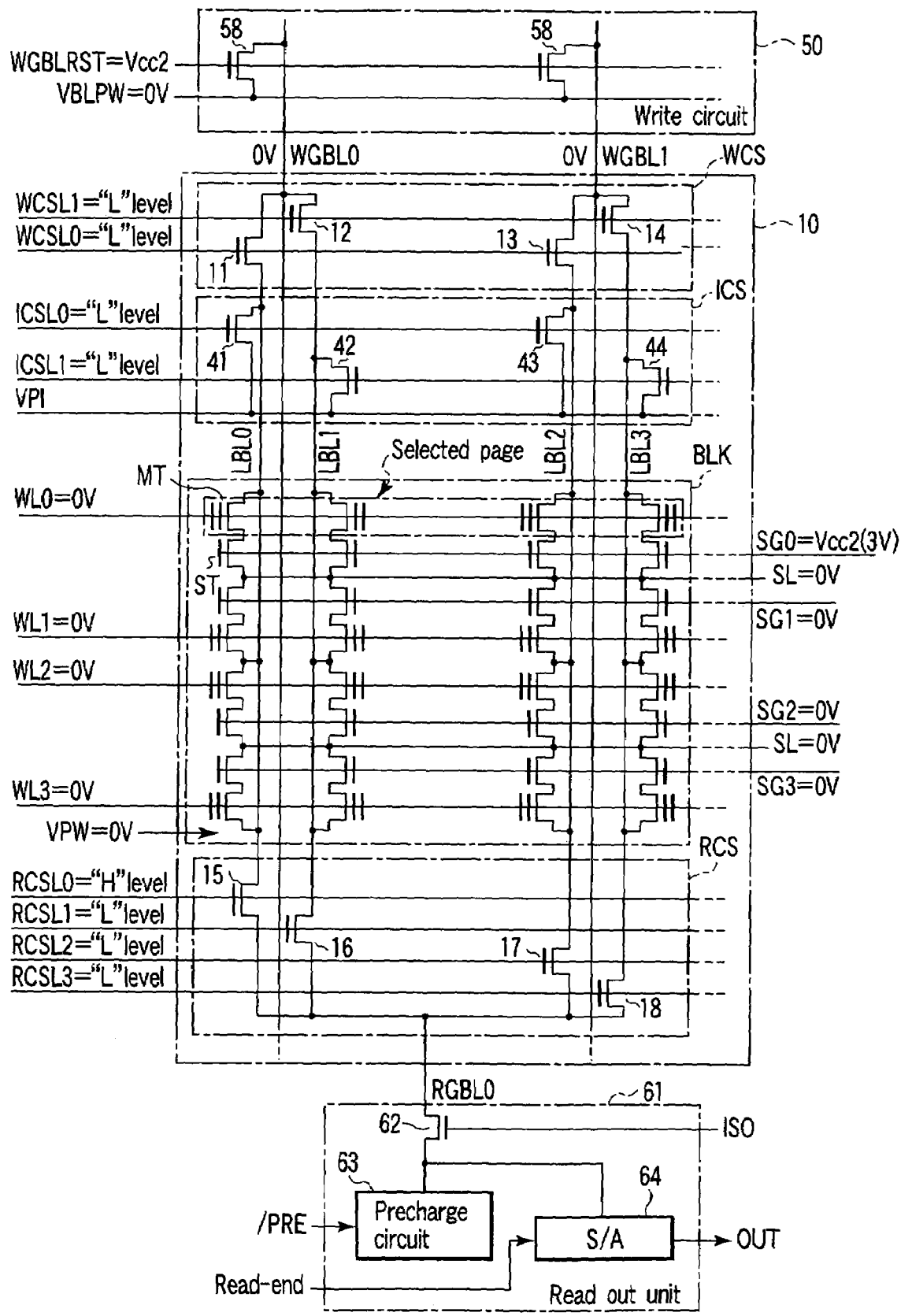
FIG. 26 is a circuit diagram to help explain the state of the memory cell array in a read operation of the 2Tr flash memory according to the first embodiment.

Next, using FIG. 26, a read operation will be explained. In FIG. 21, a read operation is carried out in the period between time t3 and time t4. FIG. 26 is a circuit diagram of the memory cell array 10, write circuit 50, and read unit 61 of the 2Tr flash memory 3. FIG. 26 shows a case where the data is read from the memory cell transistor MT connected to local bit line LBL0 and word line WL0. The data is read from one memory cell MC per memory cell block BLK. However, when there are a plurality of read global bit lines per memory cell block BLK, as many items of data as correspond to the read global bit lines are read out.

As shown in FIG. 26, first, the column decoder 40 selects read column select line RCSL0 from the four read column select lines RCSL0 to RCSL3 connected to the read column selector RCS corresponding to the memory cell block BLK including the selected select gate line SG0. This turns on the MOS transistor 15 in the read column selector RCS corresponding to the memory cell block BLK including the selected select gate line SG0.

Furthermore, the column decoder 40 makes all of the write column select lines WCSL0 to WCSL(2m+1) unselected, which turns off all of the four MOS transistors 11 to 14 in all of the write column select lines WCSL0 to WCSL(2m+1). Therefore, the write global bit lines WGBL are electrically isolates from local bit lines LBL0 to LBL3.

When the signal WGBLRST is set to the high (H) level (Vcc2), this turns on the MOS transistor 58 in the write circuit 50. In addition, 0V is applied to VBLPW node. Therefore, all of the write global bit lines WGBL0, WGBL1 are set to 0V in the read operation.

Furthermore, the signal BIAS is set to the high (H) level, the signal/PRE is set to the low (L) level, and the signal ISO is set to the high (H) level. This turns on the MOS transistor 62 in the read unit 61, which allows the precharge circuit 63 to precharge read global bit line RGBL0.

After the potential on the read global bit line has reached a specific precharge potential, the signal ZISOG is set to the high (H) level, turning on the isolating MOS transistor 35. Then, the select gate decoder 30 selects select gate line SG0 (H level: Vcc2=3V). Furthermore, the write decoder 20 makes all of the word lines WL0 to WL(4m+3) unselected (0V) and sets the potential VPW at the p-well region 202 to 0V. Moreover, the source line driver 70 sets the potential on the source line to 0V. In the read operation, the signal WSG is set to the low (L) level, which electrically isolates the row address decode circuit 21 of the write decoder 20 from the select gate lines.

Then, the select transistor ST connected to select gate line SG0 is turned on. As a result, if the data written in the memory cell transistor MT connected to the selected word line WL0 and selected local bit line LBL0 is "1", current flows from read global bit line RGBL0 to the source line. On the other hand, if the data written in the memory cell transistor MT is "0", no current flows.

Then, a change in the potential on the read global bit line as a result of current flowing in the memory cell MC is amplified by the sense amplifier 64.

As described above, the read operation is carried out.

<Erase Operation>

Figure 27:
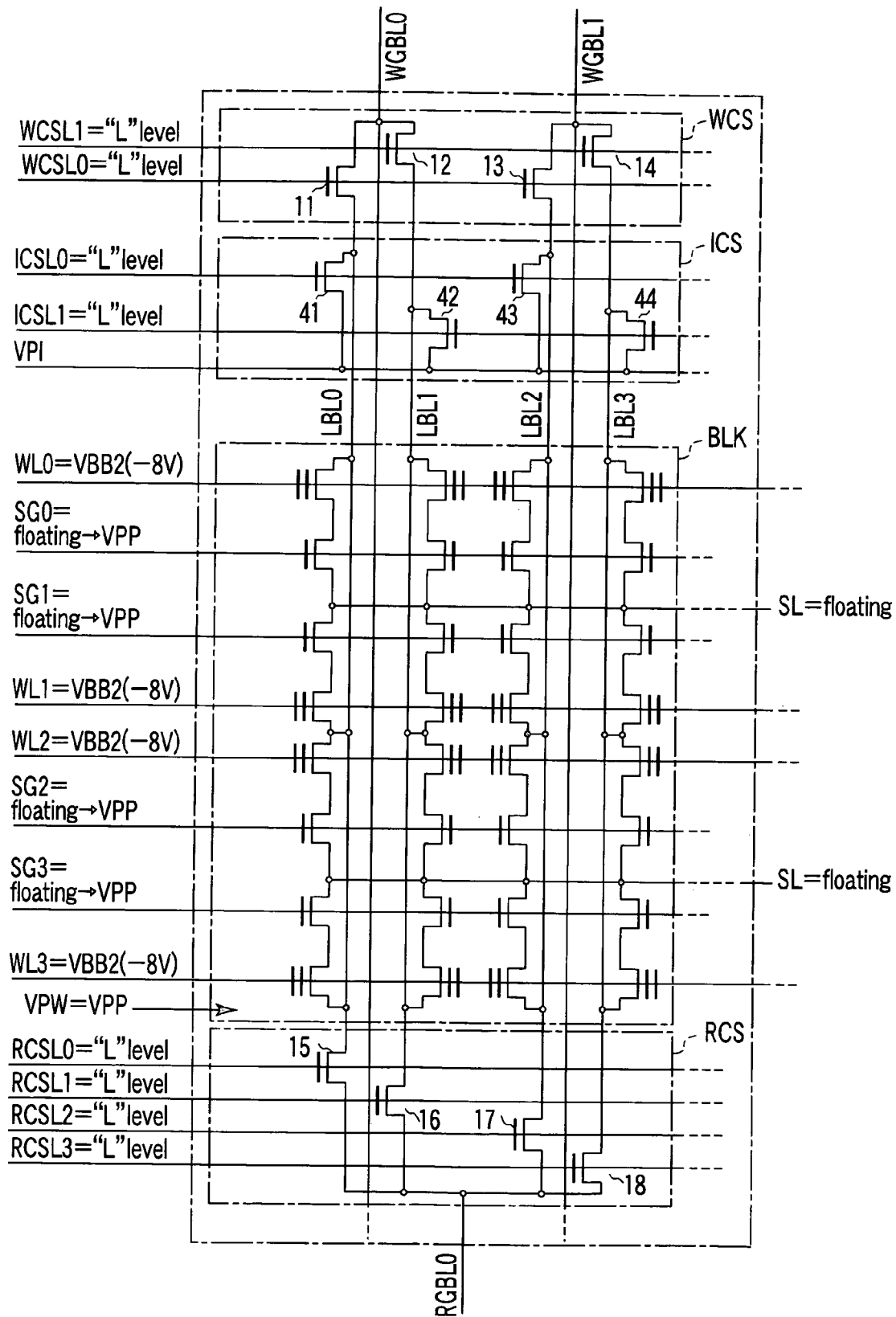
FIG. 27 is a circuit diagram to help explain the state of the memory cell array in an erase operation of the 2Tr flash memory according to the first embodiment.

Next, using FIG. 27, an erase operation will be explained. An erase operation is carried out at time t4 and later in FIG. 21. FIG. 27 is a circuit diagram of the memory cell array 10 in an erase operation. Data is erased from all of the memory cells MC sharing the p-well region 202 simultaneously. An erase operation is carried out by pulling electrons out of the floating gates by FN tunneling.

Before an erase operation, all of the MOS transistors 11 to 16 are turned off. Therefore, all of the write global bit lines WGBL0, WGBL1 are electrically isolated from the latch circuit 51 and from VBLPW node and VPI node and therefore go into the floating state.

Then, the write decoder 20 applies the negative voltage VBB2 to all of the word lines WL0 to WL(4m+3) in the selected block. In addition, the write decoder 20 applies the positive potential VPP to the substrate (p-well region 202) Sin which memory cells have been formed. In the erase operation, the signals ZISOG and WSG are kept at the low (L) level, which electrically isolates the row address decode circuits 31, 21 of the select gate decoder 30 and write decoder 20 from the select gate lines.

As a result, electrons are extracted from the floating gates of the memory cell transistors of the memory cells MC into the substrate by FN tunneling, thereby erasing the data in all of the memory cells MC connected to word lines WL0 to WL(4m+3), which makes the threshold voltage negative.

As described above, the flash memory according to the first embodiment produces the effects in item (1) to item (6) below.

(1) Erroneous reading can be prevented.

Figure 28:
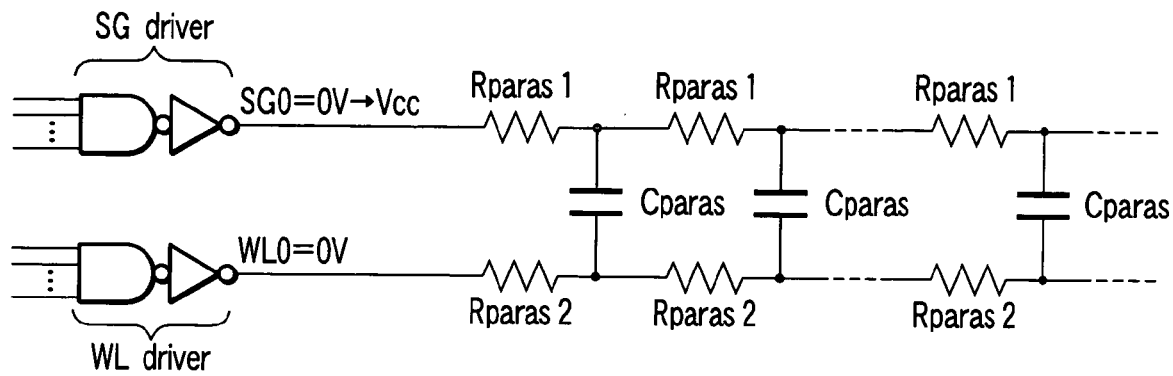
FIG. 28 is an equivalent circuit of the row decoder, a select gate line, and a word line included in the 2Tr flash memory.
Figure 29:
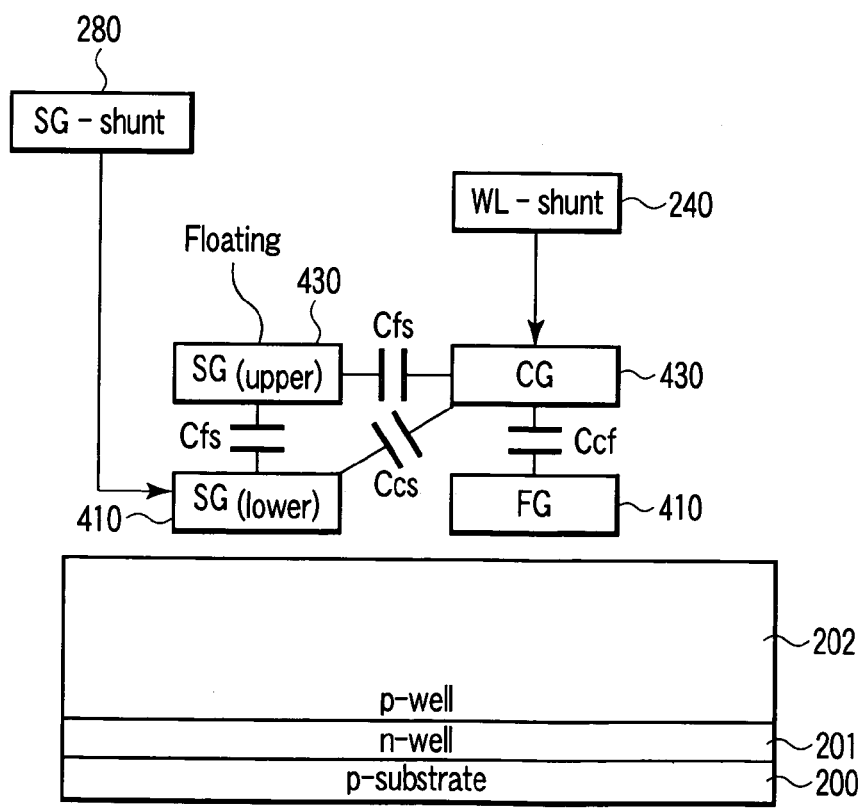
FIG. 29 is a sectional view schematically showing a memory cell included in the 2Tr flash memory according to the first embodiment.

This will be explained using FIGS. 28 and 29. FIG. 28 is an equivalent circuit of a select gate line SG and a word line WL and their driver circuits. FIG. 29 is a sectional view of a memory cell according to the first embodiment.

As shown in FIG. 28, the select gate line SG and word line WL have wiring resistances Rparas1 and Rparas2 respectively. There is a parasitic capacitance Cparas between the select gate line SG and the word line WL.

As shown in FIG. 29, a select transistor ST has a multilayer gate structure of polysilicon layers 410, 430, with the polysilicon layer 420 electrically in a floating state. A memory cell transistor MT also has a multilayer gate structure of polysilicon layers 410, 430. The control gate CG of the memory cell transistor MT adjacent to the select transistor ST has parasitic capacitances Ccs, Cfc between itself and the polysilicon layers 410, 430 and a parasitic capacitance Ccf between itself and the floating gate FG. There is a parasitic capacitance Cfs between the polysilicon layers 410, 430 of the select transistor ST. These parasitic capacitances Ccs, Cfc, Cfs correspond to the parasitic capacitance Cparas in FIG. 28.

When select gate line SG0 is selected in a read operation, the select gate line driver (or the row address decode circuit 31 of FIG. 5) applies Vcc2 to select gate line SG0. Word line WL0 is at 0V. Then, the potential of select gate line SG0 rises, with the result that the potential of word line WL0 fluctuates under the influence of the coupling of the parasitic capacitance Cparas. More specifically, in FIG. 29, the polysilicon layer 410 of the select transistor ST has a direct effect of the coupling of the parasitic capacitance Ccs on word line WL0. As a result of a fluctuation in the potential of the polysilicon layer 410 of the select transistor ST, the polysilicon layer 430 whose potential fluctuated due to the coupling of the parasitic capacitance Cfs has the effect of the parasitic capacitance Cfc on word line WL0. Then, the potential of the floating gate FG of the memory cell transistor MT fluctuates as a result of coupling with the control gate CG (or due to the parasitic capacitance Ccf).

In this respect, the flash memory 3 of the first embodiment has the shunt wires 240 for the word lines as shown in FIG. 29. The shunt wires 240, which are made of material whose resistance is lower than that of polysilicon, are in contact with the word lines at a plurality of places. Therefore, the row address decode signal supplied from the write decoder 20 can be transmitted to the control gates at high speed. In other words, the wiring resistance Rparas2 of the word lines WL can be made lower in FIG. 28. Accordingly, the control gates CG of the memory cell transistors MT are less liable to be influenced by coupling. The reason is that the lower wiring resistance Rparas2 of the word lines means that the driving capability of the write decoder 20 is improved. Specifically, for example, in a read operation, the control gate CG of a memory cell transistor MT is fixed heavily to 0V by the shunt wire 240. Therefore, the control gate CG is less liable to be influenced by coupling due to a change in the potential of the select gate line.

As described above, since fluctuation in the potential of the control gates CG can be suppressed, it is possible to prevent the data from being read from the memory cells erroneously.

(2) The operating speed can be improved.

Figure 30:
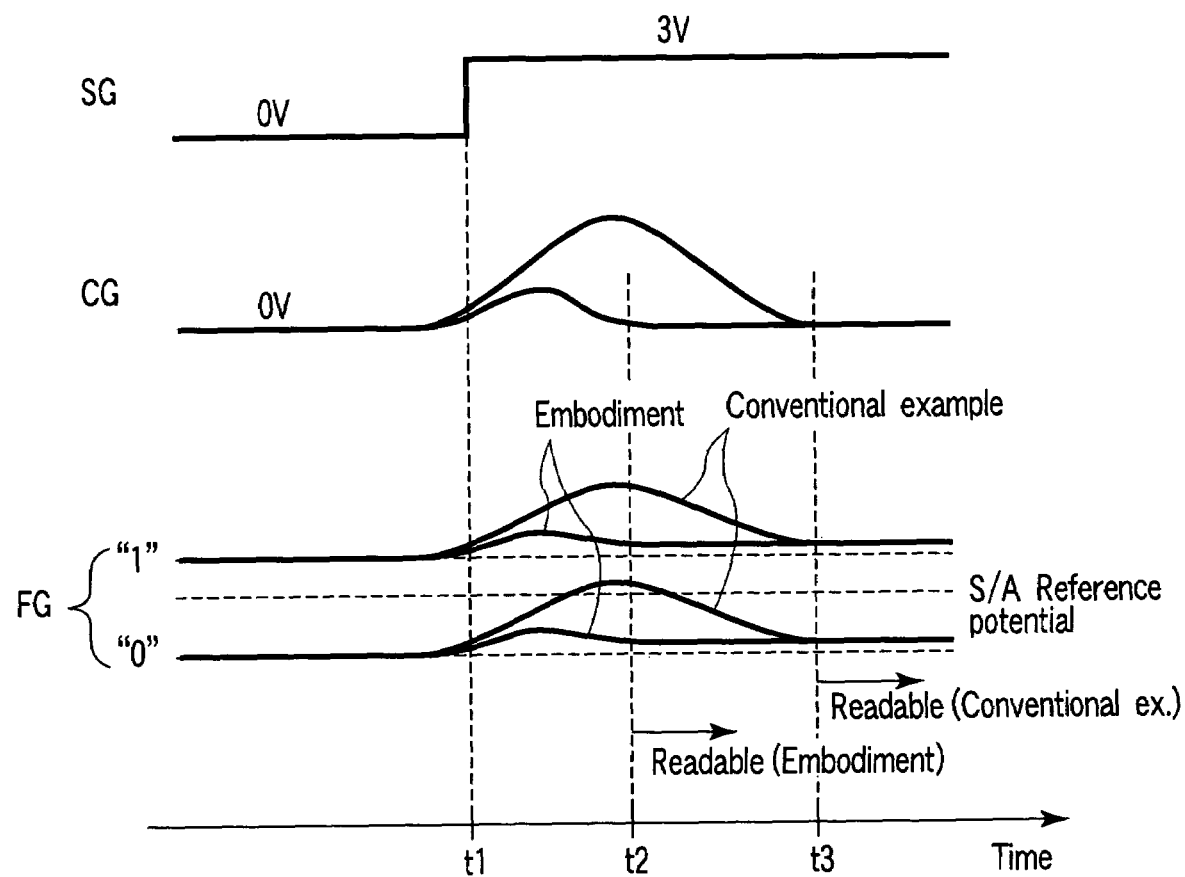
FIG. 30 is a timing chart for various signals in the read operation of the flash memory of the first embodiment and that of a conventional flash memory.

For the same reason explained in item (1), the read operation speed and write operation speed can be improved. This will be explained using FIG. 30. FIG. 30 is a timing chart to help explain fluctuations in the potentials of a select gate line, a control gate line, and a floating gate in a read operation.

As described above, as the potential of the select gate line fluctuates, the potential of the control gate fluctuates as a result of coupling with the fluctuation. However, with the configuration of the first embodiment, the effect of coupling can be made smaller than in the prior art, which enables the potential of the control gate to be determined in a shorter time than in the prior art. As shown in FIG. 30, since the effect of coupling is great in a conventional structure, if the potential of the select gate fluctuates at time t1, the potential of the control gate is stabilized at time t3. However, with the configuration of the first embodiment, since the effect of coupling is smaller than in the prior art, the potential of the control gate is stabilized at time t2 earlier than time t3. Similarly, the potential of the floating gate FG is stabilized at time t2 in the first embodiment.

To start a write or a read operation, the potential has to be stabilized after the effect of coupling subsides. In this respect, with the configuration of the first embodiment, the potentials of the control gate and floating gate FG can be stabilized earlier than in the prior art, which enables a write or a read operation to be started earlier than in the prior art. Therefore, the operating speed of the flash memory can be improved.

Furthermore, the write operation speed can also be improved for the following reason. If the potential of the control gate CG is liable to fluctuate as a result of coupling with the select gate line, writing has to be done excessively to prevent erroneous reading (when "0" data is written). Specifically, to prevent the memory cell transistor MT from being turned on even when the potential of the control gate CG rises by coupling, excess electrons have to be injected to the floating gate. As a result, the write time has to be made longer, which makes the write operation slower.

However, with the configuration of the first embodiment, a fluctuation in the potential of the control gate CG due to coupling can be suppressed. Therefore, when "0" is written, excess electrons need not be injected to the floating gate, which improves the write operation speed.

Furthermore, in the first embodiment, the shunt wires 280 are provided for the select gate lines SG. Therefore, the row address decode signal to select a select gate can be transmitted at high speed, which enables the operating speed of the flash memory to be improved.

(3) The reliability of the flash memory can be improved.

Figure 31:
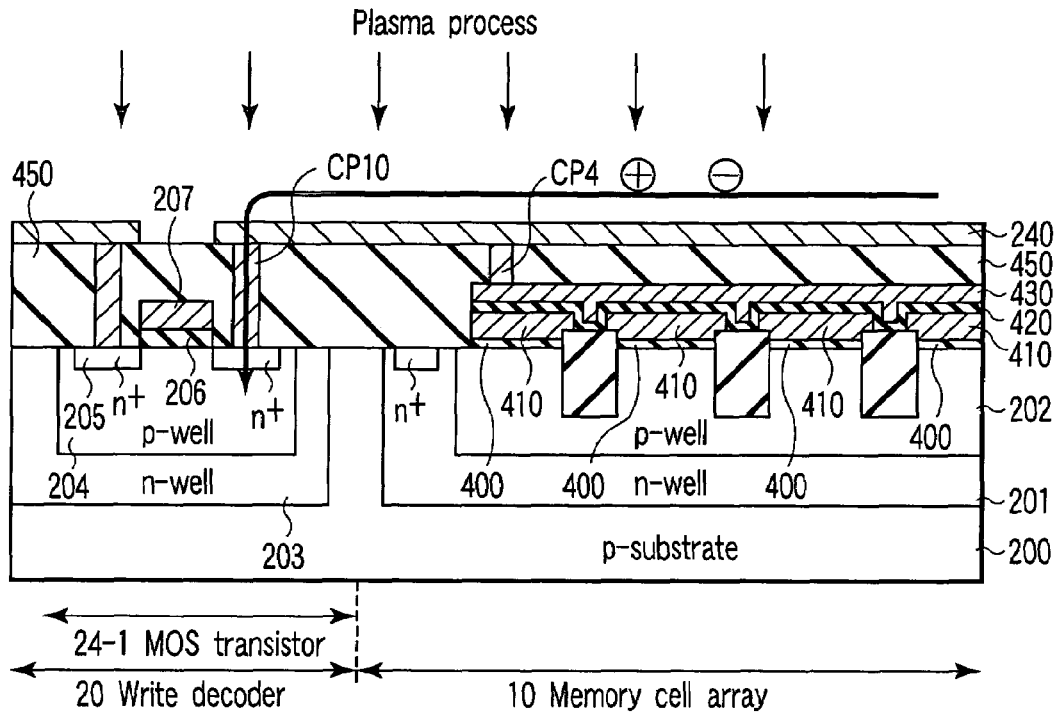
FIG. 31 is a sectional view of the 2Tr flash memory according to the first embodiment, which helps explain the manufacturing processes.

With the configuration of the first embodiment, the word line shunt wires 240 are formed of metal wiring lines at the level of the lowest one of the multilayer metal wiring layer. Therefore, plasma damage done to the flash memory can be reduced. This effect will be explained using FIG. 31. FIG. 31 is a sectional view to help explain the middle of manufacturing a flash memory according to the first embodiment. FIG. 31 particularly shows the step of forming a metal wiring layer 240.

In the process of manufacturing a flash memory, RIE, plasma CVD, and the like are used. In this case, a flash memory is exposed to plasma, which accumulates charge at the surface of the chip. For example, this happens in a case where contact holes are made by RIE, a case where a metal wiring layer is patterned by RIE, a case where an interlayer insulating film is formed, or the like. Then, the positive or negative charge can destroy the semiconductor elements. Particularly in the memory cells whose gate insulating film is thin and which have to guarantee that writing can be done more than a hundred thousand times, the damage to the memory cells is serious. For example, in FIG. 31, if the charge accumulated at the surface of the chip flows via the gate insulating films of memory cells into the semiconductor substrate, the gate insulating films 400 are damaged, which can lead to deterioration of the performance or the destroy of the memory cells.

However, with the configuration of the first embodiment, the word line shunt wires 240 are formed of the metal wiring lines at the level of the lowest one of the multilayer metal wiring layer. Therefore, at the stage where the shunt wires 240 have been formed, a path that allows the positive charge and negative charge to escape to the semiconductor substrate 200 has been surely formed. Therefore, the flowing of the charge via the gate insulating film 400 of a memory cell can be suppressed. The path will be explained below.

As shown in FIG. 31, the word line shunt wires 240 are connected to the write decoder 20. More specifically, the word line shunt wires 240 are connected to the MOS transistors 24-1 of the inverters 24. At the stage where the shunt wires 240 are formed, the shunt wires 240 have already been connected to the drain regions 205 of the MOS transistor 24-1 via contact plugs CP10. Therefore, the charge accumulated on the shunt wires 240 can escape from the metal wiring layers 240 to the p-well region 204 via the contact plugs CP10 and drain regions 205. Therefore, it is possible to suppress damage done to the gate insulating films 400 by the charge, which enables the reliability of the flash memory to be improved.

(4) The operating speed of the flash memory can be improved.

With the configuration of the first embodiment, the bit lines are hierarchized into the local bit lines and the global bit lines (read global bit lines and write global bit lines). That is, a plurality of memory cells are connected to each of a plurality of local bit lines. A plurality of local bit lines are connected to each of a plurality of global bit lines. In the example of FIG. 2, 2(m+1) local bit lines (LBL0 and LBL1 or LBL2 and LBL3) are connected to one write global bit line WGBL via the write column selector WCS. Then, four memory cells are connected to each of the local bit lines LBL. In addition, 4(m+1) local bit lines (LBL0 to LBL3) are connected to one read global bit line RGBL via the read column selector RCS. Then, four memory cells are connected to each of the local bit lines.

In a write operation, only the local bit line LBL to which the selected memory cell has been connected is connected to the write global bit line WGBL. The local bit lines LBL to which the selected memory cell has not been connected are electrically isolated from the write global bit line WGBL by the write column selector WCS. Therefore, only one local bit line including the selected memory cell, that is, four memory cells, can be seen from one write global bit line WGBL. Therefore, only the four memory cells MC contribute to the parasitic capacitance on the write global bit line WGBL. The unselected memory cells which are in the same column as the selected memory cell and are connected to a different local bit line LBL do not contribute to the parasitic capacitance on the write global bit line. Therefore, it is possible to decrease the parasitic capacitance on the write global bit line remarkably. The same holds true for a read operation.

As described above, since the parasitic capacitance on the write global bit line and read global bit line are reduced, the operating speed of the flash memory can be improved.

(5) The read speed can be improved.

In the flash memory, relatively high voltages, including VPP1, VBB1 and VBB2, have to be handled in a write operation. To meet this requirement, high-withstand-voltage MOS transistors whose gate insulating film is thick have to be used. On the other hand, the voltages handled in a read operation are lower than in a write operation. Therefore, as far as a read operation is concerned, it is desirable that low-withstand-voltage MOS transistors whose gate insulating film is thin should be used. Even from the viewpoint of operating speed, it is desirable that low-withstand-voltage MOS transistors should be used.

In this respect, with the configuration of the first embodiment, the local bit lines are connected to the write global bit lines and read global bit lines. Then, the memory cells are connected to the write circuit 50 via the write global bit lines and to the read circuit 60 via the read global bit lines. That is, the signal route for a write operation differs from the signal route for a read operation. Therefore, in the signal route in a read operation, all of the circuits excluding the read column selector RCS that connects the read global bit lines to the local bit lines can be made using the transistors whose gate insulating film is thin. As a result, the read operating speed can be improved.

(6) The reliability of a write operation can be improved.

As explained in item (4), the bit lines are hierarchized. When the write route is particularly considered, a plurality of local bit lines are connected to one write global bit lines. Then, in a write operation, only one local bit line including the selected memory cell is electrically connected to the write global bit line. The other local bit lines are electrically isolated from the write local bit line. Therefore, the voltage corresponding to the write data is not applied to the local bit lines to which the selected memory cell is not connected. Therefore, the memory cells connected to these local bit lines can be prevented effectively from being written into erroneously, which enables the reliability of the write operation to be improved.

Figure 32:
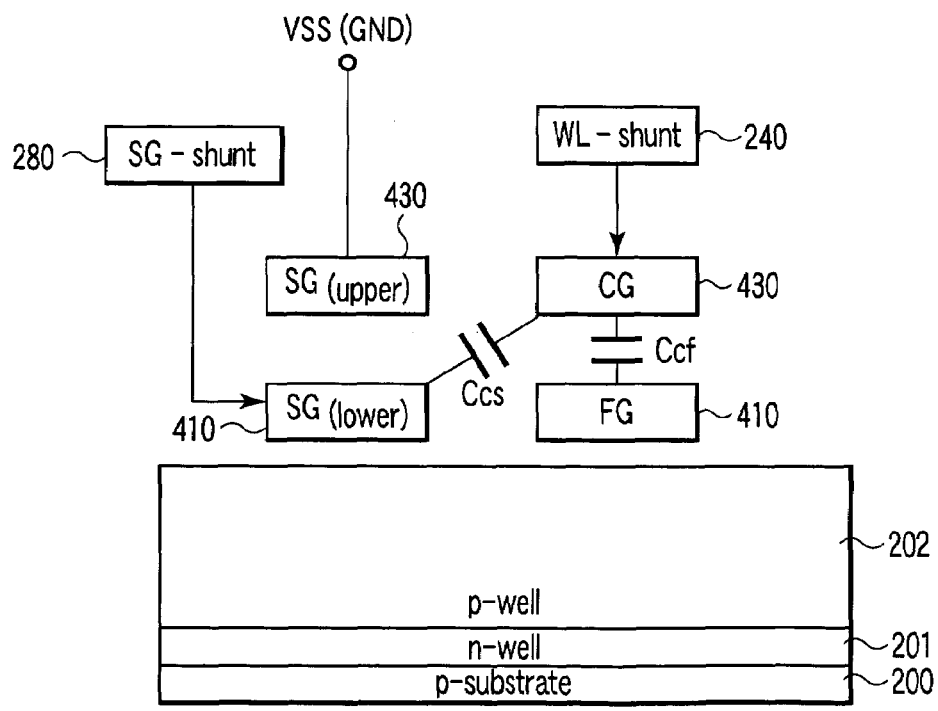
FIG. 32 is a sectional view schematically showing a memory cell included in a 2Tr flash memory according to a second embodiment of the present invention.

Next, a semiconductor memory device according to a second embodiment of the present invention will be explained. The second embodiment is such that the potential of the higher polysilicon layer of a select transistor is fixed to a specific potential. Since the configuration of a flash memory is the same as that in the first embodiment, its explanation will be omitted. FIG. 32 is a schematic sectional view of a memory cell according to the second embodiment.

As shown in FIG. 32, a select transistor ST in a 2Tr flash memory 3 according to the second embodiment has a multilayer gate structure including polysilicon layers 410, 430. As in the first embodiment, the shunt wire 280 for a select gate line is connected to the polysilicon layer 410 and is not connected to the polysilicon layer 430. Instead, in the second embodiment, the polysilicon layer 430 of the select transistor ST is connected to a specific potential VSS (e.g., GND), thereby fixing the potential.

As described above, the configuration of the second embodiment produces not only the effects in item (1) to item (6) explained in the first embodiment but also the effect in item (7) below.

(7) Erroneous reading can be prevented more effectively and the operating speed can be improved more.

In the configuration of the second embodiment, the polysilicon layer 430 of a select transistor ST is fixed at a specific potential. Therefore, when a voltage is applied to the polysilicon layer 410 via the shunt wire 280, the effect of the parasitic capacitance Cfs, Cfc explained using FIG. 29 in the first embodiment can be made very small. Consequently, the parasitic capacitance Cparas explained in FIG. 28 is determined almost only by the parasitic capacitance Ccs as shown in FIG. 32. Therefore, the parasitic capacitance Cparas between the select gate line and the word line can be made much smaller than in the first embodiment. As a result, as explained in the effects in item (1) and item (2) in the first embodiment, the suppression of erroneous reading and a greater improvement in the operating speed can be realized.

Figure 33:
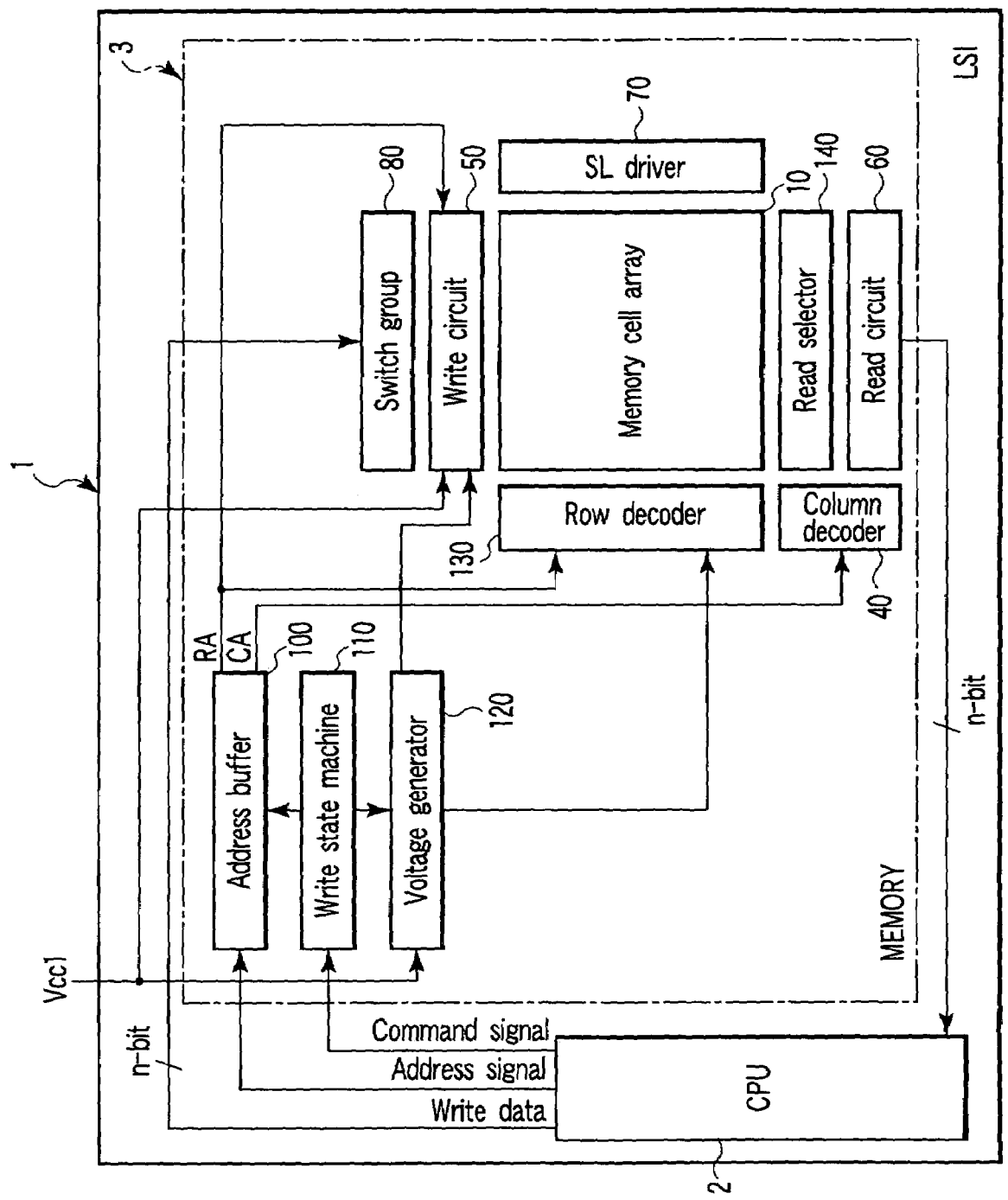
FIG. 33 is a block diagram of a system LSI according to a third embodiment of the present invention.

Next, using FIG. 33, a semiconductor memory device according to a third embodiment of the present invention will be explained. FIG. 33 is a block diagram of a system LSI according to the third embodiment. The third embodiment is such that the first embodiment is applied to a 3Tr-NAND flash memory. Hereinafter, only what differs from the first embodiment will be explained.

As shown in FIG. 33, the system LSI of the third embodiment is such that a row decoder 130 is provided instead of the write decoder 20 and select gate decoder 30 in the configuration of FIG. 1 explained in the first embodiment.

Figure 34:
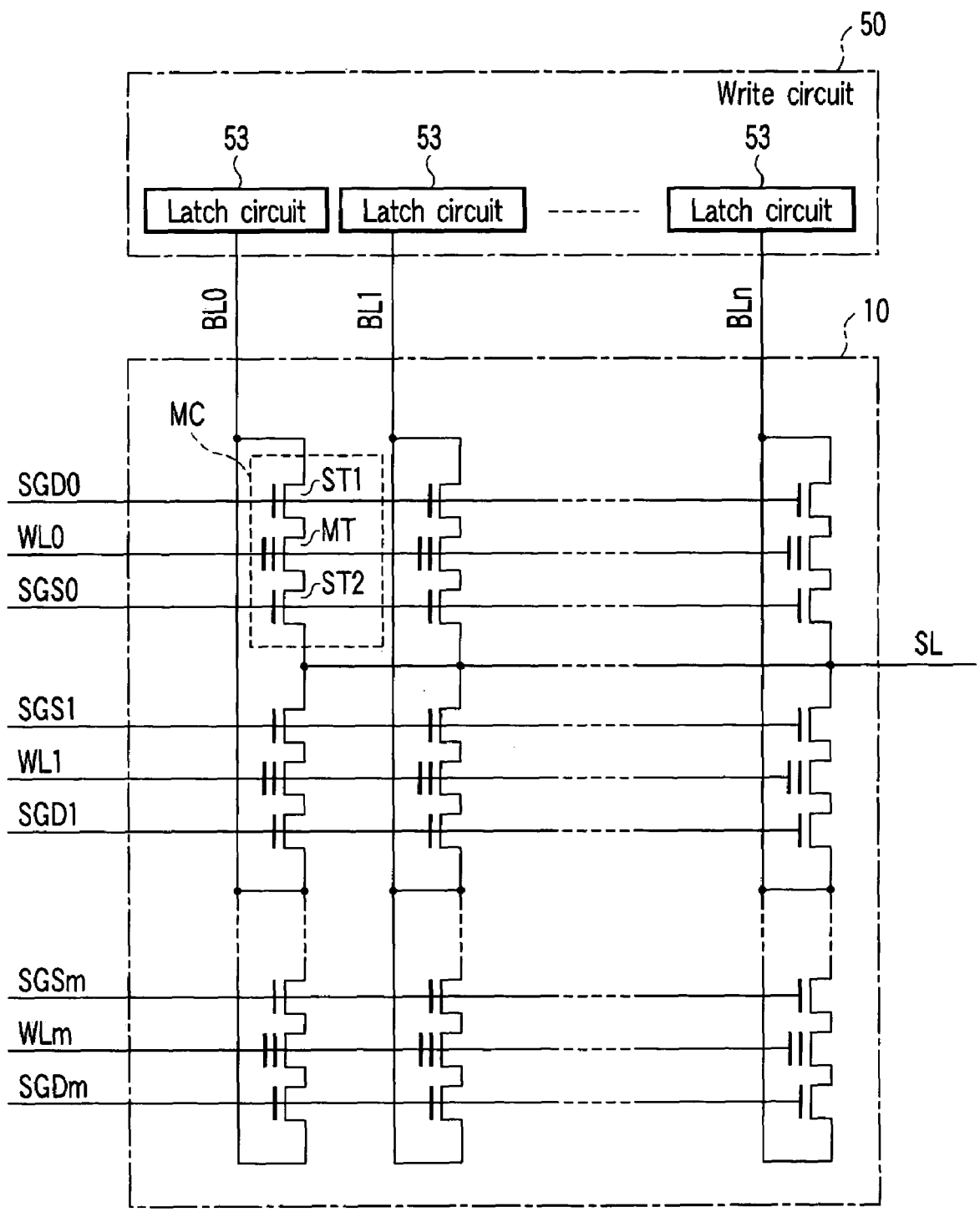
FIG. 34 is a circuit diagram of the memory cell array of a 3Tr-NAND flash memory according to the fourth embodiment.

FIG. 34 is a circuit diagram of the memory cell array 10. As shown in FIG. 34, the memory cell array 10 has (m+1)× (n+1) memory cells MC (m and n are natural numbers) arranged in a matrix. Each of the memory cells MC includes a memory cell transistor MT and select transistors ST1, ST2, which have their current paths connected in series with one another. The current path of the memory cell transistor MT is connected between the current paths of the select transistors ST1, ST2. The memory cell transistor MT has a stacked gate structure that includes a floating gate formed on a semiconductor substrate with a gate insulating film interposed therebetween and a control gate formed on the floating gate with an inter-gate insulating film interposed therebetween. Each of the select transistors ST1, ST2 has a multilayer gate structure that includes a first polysilicon layer formed on the semiconductor substrate with a gate insulating film interposed therebetween and a second polysilicon layer formed on the first polysilicon layer with an inter-gate insulating film interposed therebetween. The source region of the select transistor ST1 is connected to the drain region of the memory cell transistor MT. The source region of the memory cell transistor MT is connected to the drain region of the select transistor ST2. Memory cells adjoining each other in the column direction share the drain region of the select transistor ST1 or the source region of the select transistor ST2.

The control gates of the memory cell transistors MT of the memory cells MC in a row are connected commonly to any one of the word lines WL0 to WLm. The gates of the select transistors ST1 of the memory cells MC in a same row are connected commonly to any one of select gate lines SGD0 to SGDm. The gates of the select transistors ST2 in a same row are connected commonly to any one of select gate lines SGS0 to SGSm. The drain regions of the select transistors ST1 of the memory cell MCs in a same column are connected commonly to any one of bit lines BL0 to BLn. Bit lines BL0 to BLn are connected to the corresponding latch circuits 51. The source regions of the select transistors ST2 of the memory cells MC are connected commonly to a source line SL and further connected to the source line driver 70.

The row decoder 130 decodes a row address signal, thereby producing a row address decode signal. Then, on the basis of the row address decode signal, the row decoder 130 selects a word line and a select gate line.

The column selector 140 selects any one of the bit lines in a read operation.

The voltage generator 120 generates a plurality of internal voltages on the basis of the voltage Vcc1 externally input. The voltage generator, which includes a positive charge pump circuit, generates positive voltages VPP2 (e.g., 3V), VPP3 (e.g., 18V), and VPP4 (e.g., 4.5V).

The write circuit 50 latches write data. As shown in FIG. 34, the write circuit 50 includes latch circuits 61 provided for the bit lines in a one-to-one correspondence. Each of the latch circuits 61 is connected to the corresponding one of the bit lines BL0 to BLn. The latch circuits 61 are as explained in the first embodiment, except that the high-voltage-side power supply voltage of the inverters 62, 63 is VPP2 (3V) and their low-voltage-side power supply voltage is 0V.

Figure 35:
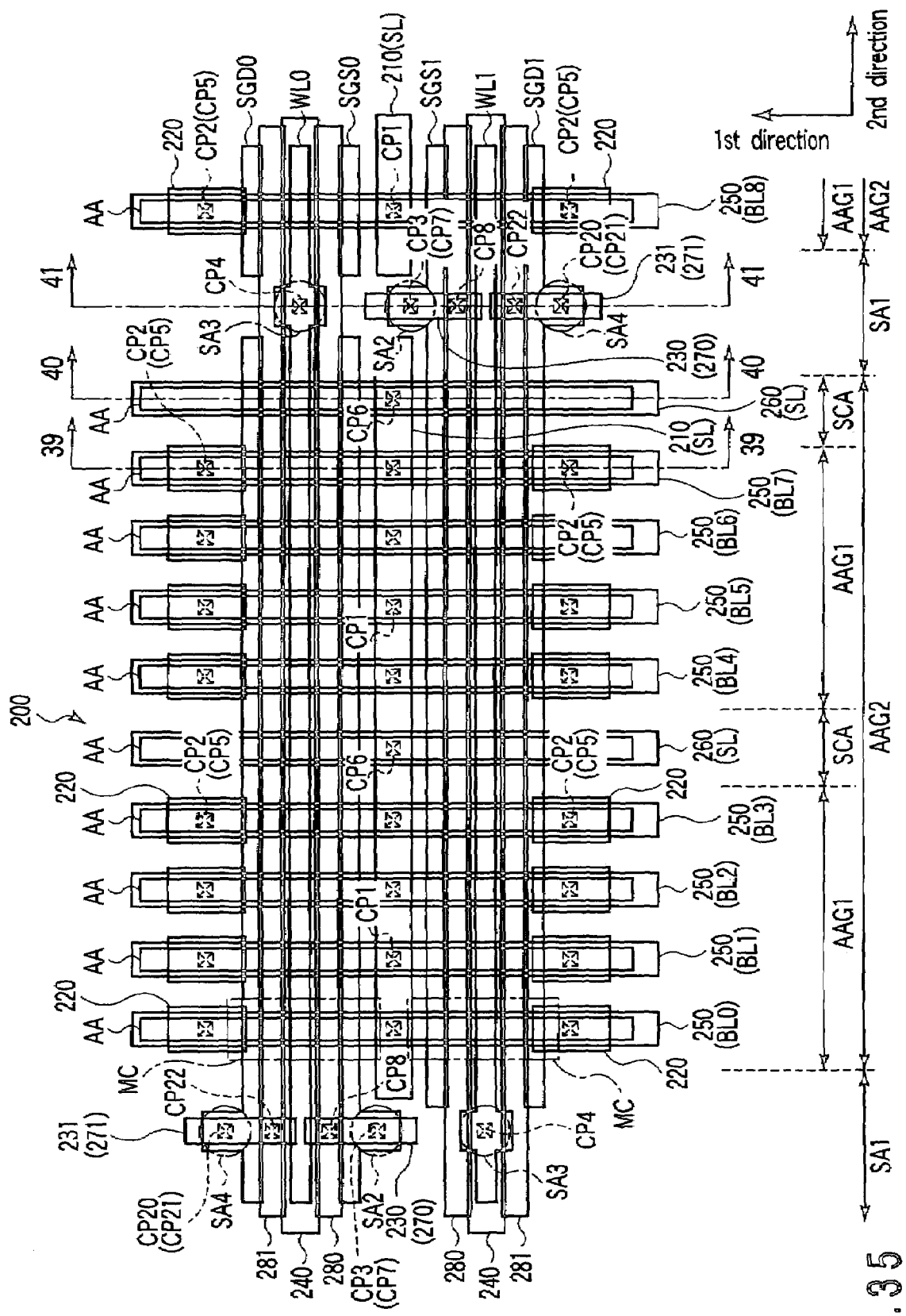
FIG. 35 is a plan view of the memory cell array included in the 3Tr-NAND flash memory according to the third embodiment.
Figure 36:
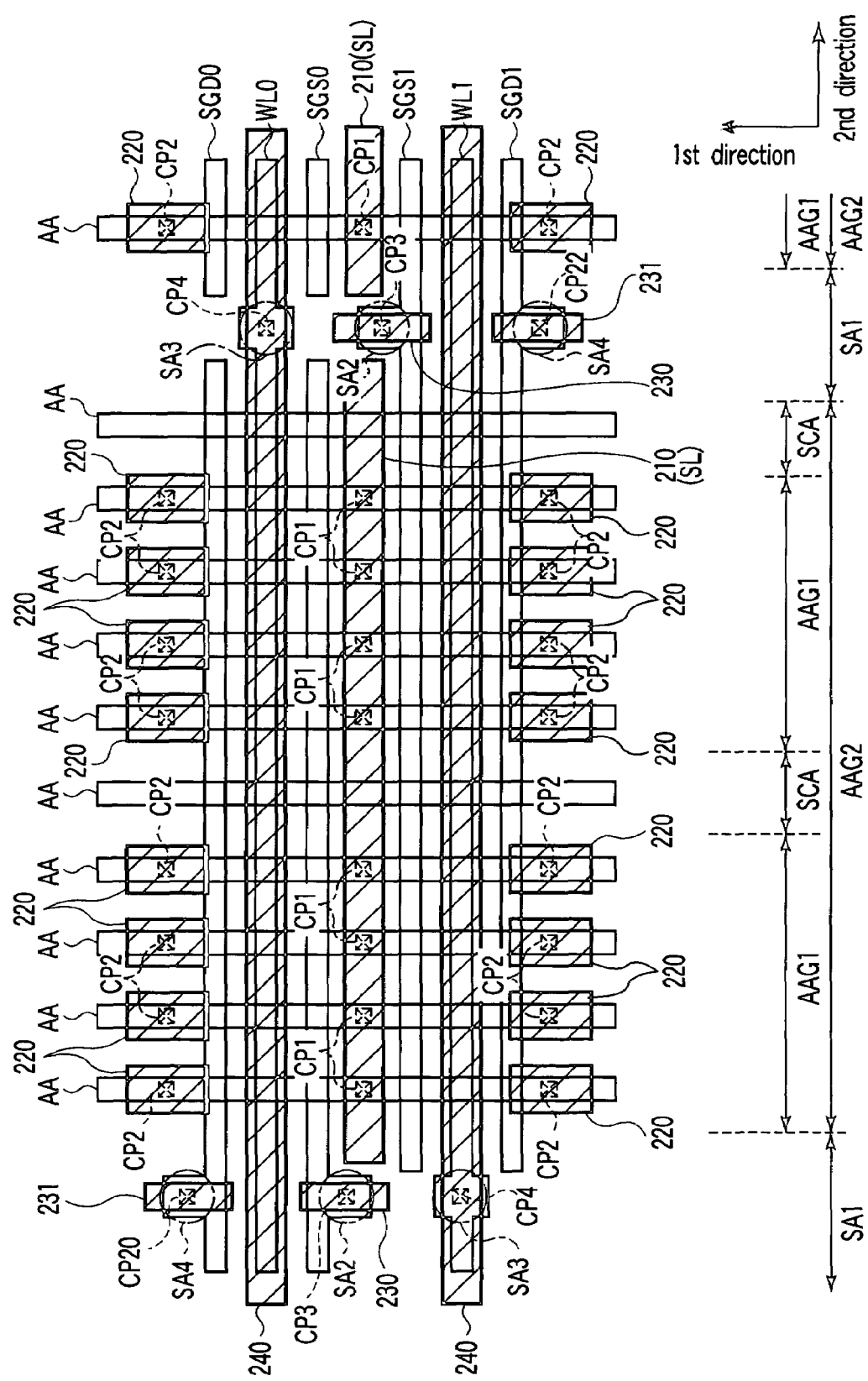
FIG. 36 is a plan view of the memory cell array included in the 3Tr-NAND flash memory according to the third embodiment, showing a plane pattern of a metal wiring layer of a first layer.
Figure 38:
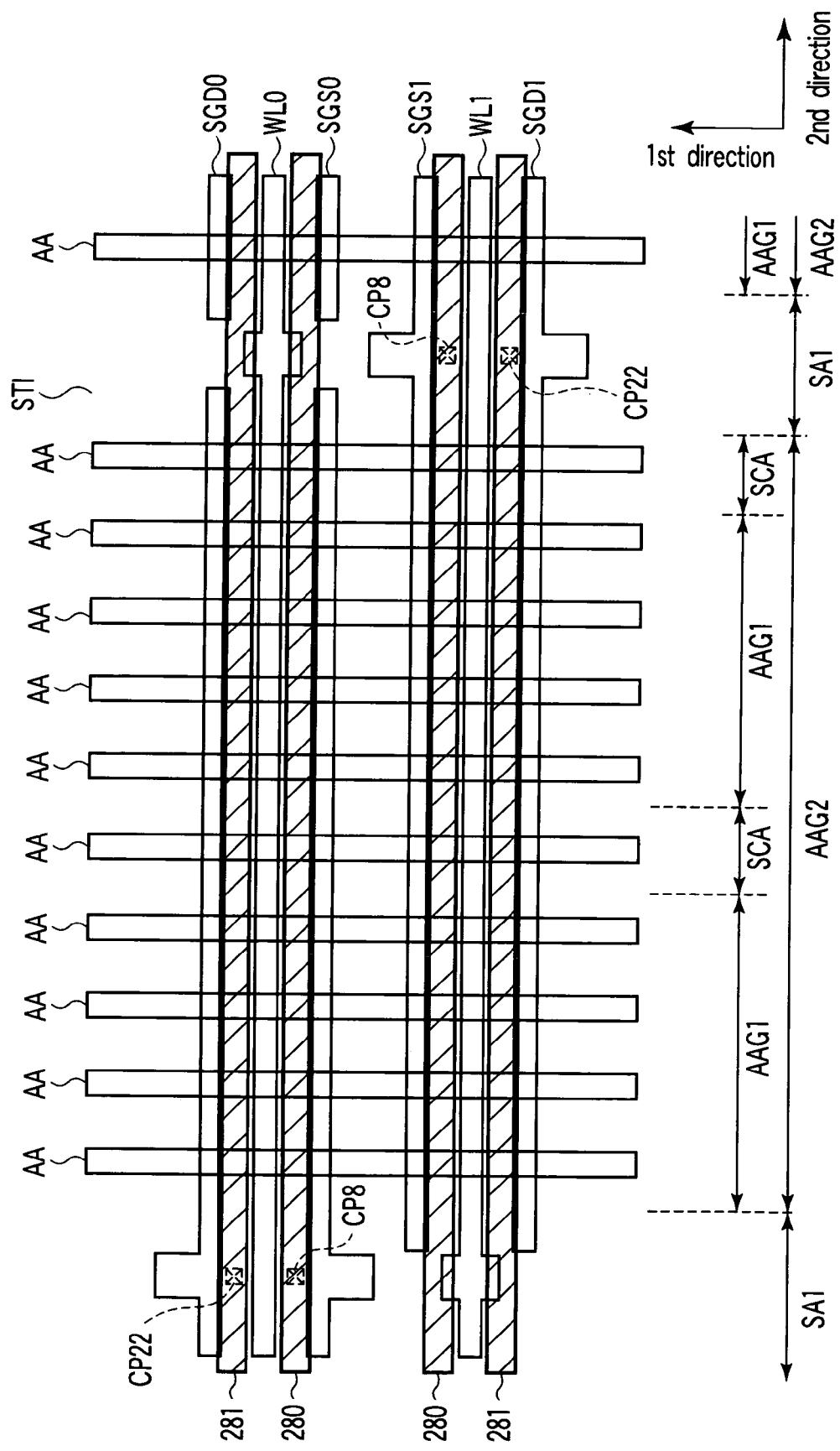
FIG. 38 is a plan view of the memory cell array included in the 3Tr-NAND flash memory according to the third embodiment, showing a plane pattern of a metal wiring layer of a third layer.

Next, using FIGS. 35 to 38, a plane structure of the memory cell array 10 included in the 3Tr-NAND flash memory 3 will be explained. FIG. 35 is a plan view of a part of the memory cell array 10. FIGS. 36 to 38 are plan views showing plane patterns of metal wiring layers of a first to a third layer, respectively, together with element regions, word lines, and select gate lines. In FIGS. 36 to 38, the regions shown correspond to those in FIG. 35. The plane structure of the third embodiment is such that the select gate lines SG are replaced with select gate lines SGS in the configuration of the first embodiment and that select gate lines SGD and shunt regions SA4 for the select gate lines SGD and shunt wires 281 are further provided. Hereinafter, what differs from the first embodiment will be explained.

As shown in FIGS. 35 to 38, in the p-type semiconductor substrate 200, a plurality of stripe-shaped element regions AA extending in a first direction are formed in a second direction perpendicular to the first direction. Stripe-shaped word lines WL0 to WLm and select gate lines SGD0 to SGDm, SGS0 to SGSm, which extend in the second direction, are formed so as to cross the element regions AA. In the regions where word lines WL0 to WLm cross the element regions AA, memory cell transistors MT are formed. In the regions where select gate lines SGD0 to SGDm cross the element regions AA, select transistors ST1 are formed. In the regions where select gate lines SGS0 to SGSm cross the element regions AA, select transistors ST2 are formed. In the regions where word lines WL0 to WLm cross the element regions AA, floating gates (not shown) separated on a memory cell transistor MT basis are formed. Word lines WL0 to WLm are arranged in such a manner that they are sandwiched between select gate lines SGD0 to SGDm and select gate lines SGS0 to SGSm, respectively. Adjacent memory cells MC have their select gate lines SGD or SGS adjoining each other.

In the stitch region SA1, a part of each of the select gate lines SGD0 to SGDm, SGS0 to SGSm, and word lines WL0 to WLm is made wider. Hereinafter, the regions made wider in the word lines are referred to as shunt regions SA2, the regions made wider in the select gate lines SGS are referred to as shunt regions SA3, and the regions made wider in the select gate lines SGD are referred to as shunt regions SA4. The shunt regions SA2 and the shunt regions SA3, SA4 are provided in word lines WL0 to WLm and select gate lines SGS0 to SGSm, SGD0 to SGDm alternately in the second direction. Specifically, in a stitch region SA1, shunt regions SA2 to SA4 are formed in word lines WL0, WL2, WL4, .. . and select gate lines SGS1, SGD1, SGS3, SGD3, SGS5, SGD5, . . . . In another stitch region SA1 adjacent to the stitch region, shunt regions SA2 to SA4 are formed in word lines WL1, WL3, WL5, . . . and select gate lines SGS0, SGD0, SGS2, SGD2, SGS4, SGD4, . . . . The select gate lines where shunt regions SA3, SA4 are not formed are partially removed in the stitch region SA1. Each of the shunt regions SA2 is formed so as to project to two adjacent select gate lines and each of the shunt regions SA3, SA4 is formed so as project toward the adjacent select gate lines.

Next, using FIGS. 35 and 36, a pattern of a first-layer metal wiring layer existing on the word lines and the select gate lines will be explained. In FIG. 36, the shaded region is a first-layer metal wiring layer.

As shown in the figures, between adjacent select gate lines SGS (between SGS0 and SGS1, between SGS2 and SGS3, . . . ), a stripe-shaped metal wiring layer 210 extending in the second direction is formed. The metal wiring layer 210 is a part of a source line SL. The metal wiring layers 210 are separated from one another by stitch regions SA1 in their longitudinal direction (or the second direction). That is, the metal wiring layers 210 are independent on a second element region group AAG2 basis. Each of the metal wiring layers 210 is connected to the source region of a select transistor ST by a contact plug CP1. On the drain region of the select transistor ST1 in the first element region group AAG1, an island pattern of metal wiring layer 220 is formed. The metal wiring layers 220 are separated from one another. Each of the metal wiring layers 220 is connected to the drain of the corresponding select transistor ST1 by a contact plug CP2. Therefore, a plurality of metal wiring layers 220 arranged in the second direction and a plurality of stripe-shaped metal wiring layers 210 arranged in the second direction are provided alternately in the first direction. On the shunt region SA3, an insular pattern of metal wiring layer 230 is formed. On the shunt region SA4, an island pattern of metal wiring layer 231 is formed. The metal wiring layer 230 is connected to the shunt region SA3 of the corresponding select gate line SGS by a contact plug CP3. The metal wiring layer 231 is connected to the shunt region SA4 of the corresponding select gate line SGD by a contact plug CP20. The metal wiring layer 230 is extended in the first direction from the top of the corresponding select gate line SGS to the top of the region from which the adjacent select gate line SGS has been removed. The metal wiring layer 231 is extended in the first direction from the top of the corresponding select gate line SGD to the top of the region from which the adjacent select gate line SGD has been removed.

Furthermore, between adjacent metal wiring layers 210 and between metal wiring layers 230, 231, that is, just above word lines WL0 to WLm, stripe-shaped metal wiring layers 240 are formed in such a manner that they are electrically isolated from the metal wiring layers 210, 230, 231 and extend in the second direction. Therefore, each of the metal wiring layers 210 is formed between two adjacent metal wiring layers 240. The two adjacent metal wiring layers 240 have such a plane pattern as is axisymmetric with the metal wiring layer 210. The metal wiring layers 240 function as shunt wires for word lines WL0 to WLm. Then, in the stitch region SA1, each of the metal wiring layers 240 is connected to the shunt region SA2 of the corresponding word line WL by a contact plug CP4 and is further connected to the row decoder 130.

Next, using FIGS. 35 and 37, a pattern of second-layer metal wiring layer existing on the first-layer metal wiring layers 210, 220, 230, 231, 240 will be explained. In FIG. 37, the shaded regions are the second-layer metal wiring layers.

As shown in the figures, in a first element region AAG1, stripe-shaped metal wiring layers 250 are formed in the first direction on element regions AA. The metal wiring layers 250 function as bit lines BL0 to BLn. The metal wiring layers 250 are connected to the first-layer metal wiring layer 220 by contact plugs CP5. In source contact regions SCA, metal wiring layers 260 whose pattern is similar to that of the metal wiring layers 250 are formed. Therefore, the line width of the metal wiring layers 260 is the same as that of the metal wiring layers 250. The metal wiring layers 260 function as part of the source lines SL. The metal wiring layers 260 are connected to the first-layer metal wiring layers 210 by contact plugs CP6. In the stitch region SA1, metal wiring layers 270, 271 with an insular pattern are formed. The metal wiring layers 270, 271 are formed so as to correspond to the first-layer metal wiring layers 230, 231. Their shape is such that the layers 270, 271 are extended more toward the adjacent word lines than the metal wiring layers 230, 231 and part of the layers 270, 271 exist on the word lines. The metal wiring layers 270 are connected to the metal wiring layers 230 by contact plugs CP7. The metal wiring layers 271 are connected to the metal wiring layers 231 by contact plugs CP21. While in FIGS. 35 and 37, the contact plugs CP7, CP21 are directly above the shunt regions SA3, SA4, the present embodiment is not limited to this, as long as the contact plugs CP7, CP21 are provided in positions where they can connect the metal wiring layers 230 and 270 each other and the metal wiring layers 231 and 271 each other.

Next, using FIGS. 35 and 38, a pattern of third-layer metal wiring layers existing on the second-layer metal wiring layers 250, 260, 270, and 271 will be explained. In FIG. 38, the shaded regions are the third-layer metal wiring layers.

As shown in the figures, stripe-shaped metal wiring layers 280, 281 are formed in the second direction. The metal wiring layers 280, 281 are formed for sets of a word line and select gate lines (a set of WL0 and SGS0, SGD0, a set of WL1 and SGS1, SGD1, . . . ) in a one-to-one correspondence. The metal wiring layers 280 are connected by contact plugs CP8 to the second-layer metal wiring layers 270 electrically connected to the corresponding select gate lines.

The metal wiring layers 281 are connected by contact plugs CP22 to the second-layer metal wiring layers 271 electrically connected to the corresponding select gate lines. Specifically, each of the metal wiring layers 280 functions as a shunt wire for each of the select gate lines SGS0 to SGSm. Each of the metal wiring layers 281 functions as a shunt wire for each of the select gate lines SGD0 to SGDm. While in FIG. 38, the metal wiring layers 280, 281 are not arranged at equal intervals, it is desirable from a parasitic capacitance viewpoint that they should be arranged at equal intervals. The metal wiring layers 280, 281 are connected to one another between second element region groups AAG2 adjoining in the second direction and are further connected to the row decoder 130.

Figure 39:
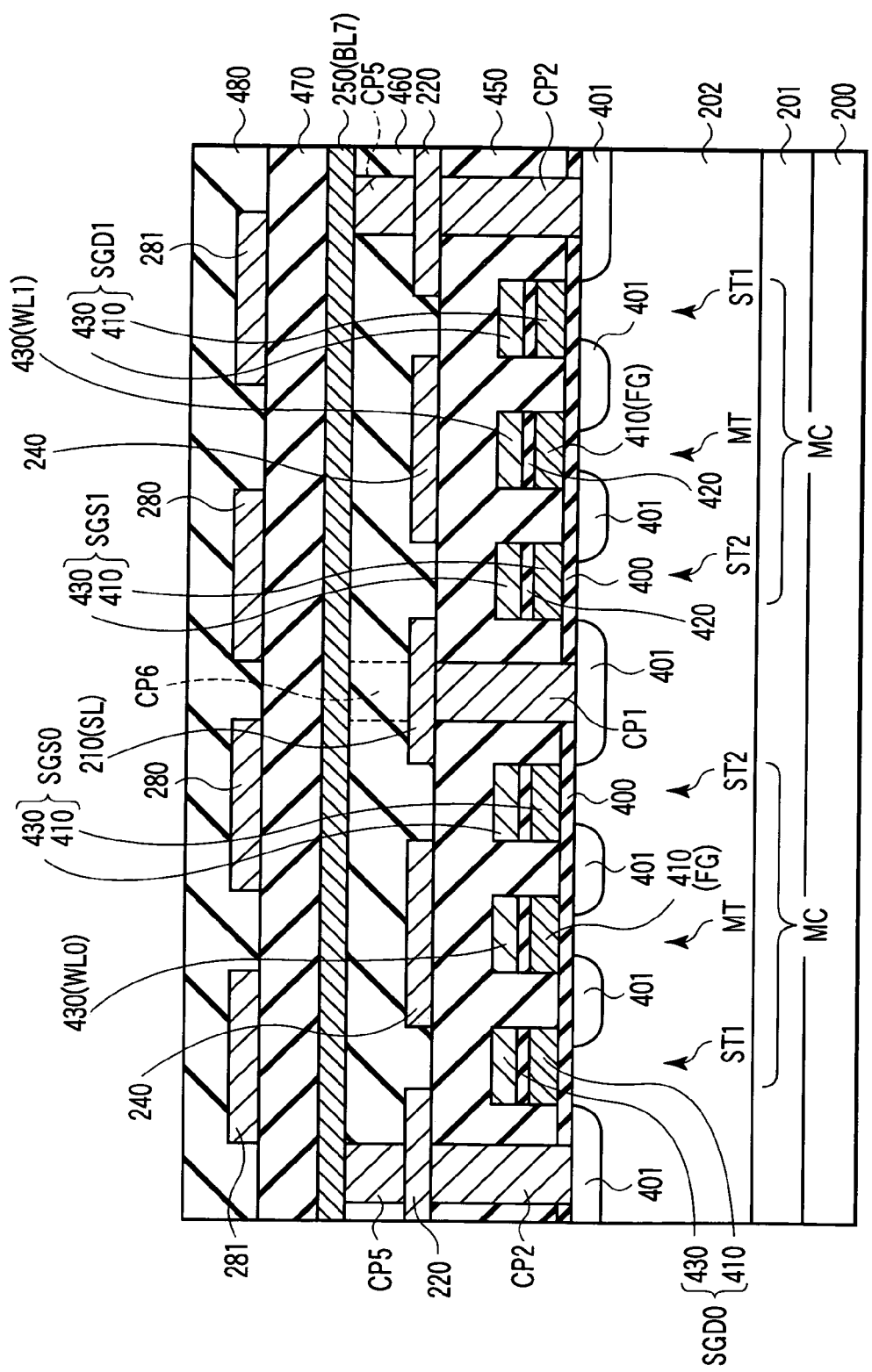
FIG. 39 is a sectional view taken along line 39—39 of FIG. 35.
Figure 40:
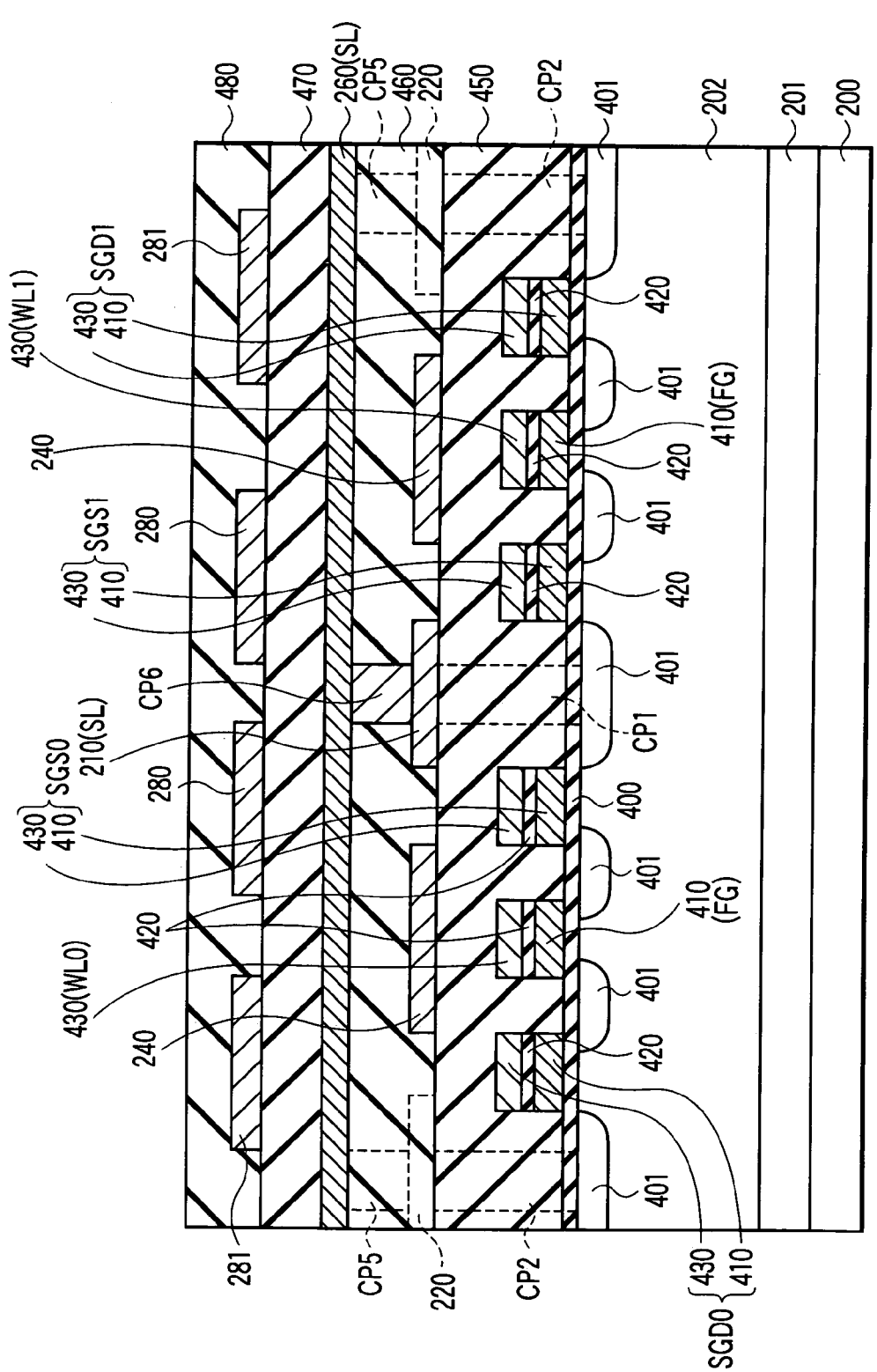
FIG. 40 is a sectional view taken along line 40—40 of FIG. 35.
Figure 41:
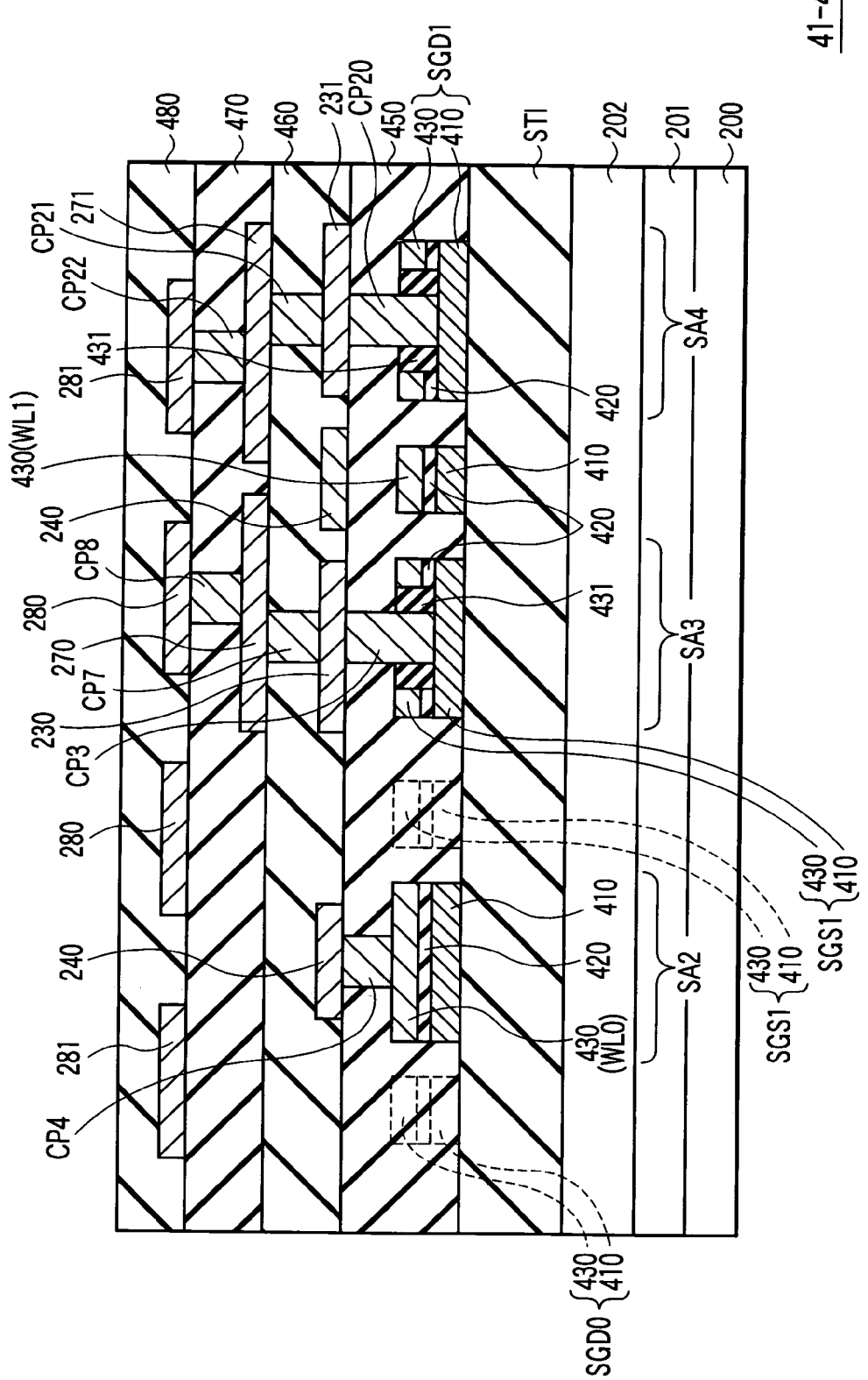
FIG. 41 is a sectional view taken along line 41—41 of FIG. 35.

Next, a sectional structure of the flash memory configured as described above will be explained. Since the sectional structure along a word line is almost the same as that in the first embodiment, the sectional structure along a bit line will be explained using FIGS. 39 to 41. FIG. 39 is a sectional view taken along line 39—39 of FIG. 35. FIG. 40 is a sectional view taken along line 40—40 of FIG. 35. FIG. 41 is a sectional view taken along line 41—41 of FIG. 35.

First, using FIGS. 39 and 40, a sectional structure of a second element region group AAG2 will be explained. As shown in the figures, on an element region AA of the p-type semiconductor substrate 200, the gate electrodes of a memory cell transistor MT and select transistors ST1, ST2 are formed with a gate insulating film 400 interposed therebetween. As in the first embodiment, each of the gate electrodes of the memory cell transistor MT and select transistors ST1, ST2 has a polysilicon layer 410 formed on the gate insulating film 400, an inter-gate insulating film 420 formed on the polysilicon layer 410, and a polysilicon layer 430 formed on the inter-gate insulating film 420.

In the memory cell transistor MT, the polysilicon layers 410, which are separated from each other between adjacent element regions AA, function as the floating gates of memory cell transistors MT. The polysilicon layers 430, which are connected to one another between adjacent element regions AA, function as control gates (or word lines WL).

In the select transistors ST1, ST2, the polysilicon layers 410, 420 are connected to one another between adjacent element regions AA. The polysilicon layers 410, 432 function as select gate lines SGS, SGD. As explained in the first embodiment, the polysilicon layers 430 of the select transistors ST1, ST2 are electrically in a floating state. Therefore, it is only the polysilicon layers 410 that practically function as select gate lines SGS, SGD.

At the surface of the semiconductor substrate 200 between adjacent gate electrodes, an impurity diffused layer 401 is formed. The impurity diffused layer 401 is shared by adjacent transistors.

As described above, a memory cell MC including a memory cell transistor MT and a select transistor ST is formed so as to have the following relationship. In adjacent memory cells MC, MC, their select transistors ST1 or select transistors ST2 are adjacent to each other. The adjacent select transistors share an impurity diffused layer 401.

Then, on the semiconductor substrate 200, an interlayer insulating film 450 is formed so as to cover the memory cell transistors MT and select transistors ST. In the interlayer insulating film 450, a contact plug CP1 is formed which reaches the impurity diffused layer (or source region) 401 shared by two select transistors ST2, ST2. On the interlayer insulating film 450, a metal wiring layer 210 to be connected to the contact plug CP1 is formed. The metal wiring layer 210 functions as a source line SL. In the interlayer insulating film 450, a contact plug CP2 is formed which reaches the impurity diffused layer (or drain region) 401 shared by two select transistors ST2, ST2. On the interlayer insulating film 450, a metal wiring layer 220 to be connected to the contact plug CP2 is formed. On the interlayer insulating film 450, a metal wiring layer 240 is formed which functions as a shunt wire for a word line.

On the interlayer insulating film 450, an interlayer insulating film 460 is formed so as to cover the metal wiring layers 210, 220, 240. In the interlayer insulating film 460, a contact plug CP5 reaching the metal wiring layer 220 is formed (see FIG. 39). On the interlayer insulating film 460, a metal wiring layer 250 connected equally to a plurality of contact plugs CP5 is formed (see FIG. 39). The metal wiring layers 250 function as bit lines BL0 to BLn. A contact plug CP6 reaching the metal wiring layer 210 is formed in the interlayer insulating film 460 (see FIG. 40, source contact region SCA). On the interlayer insulating film 460, a metal wiring layer 260 connected equally to a plurality of contact plugs CP6 in the bit line direction is formed (see FIG. 40, source contact region SCA). The metal wiring layer 260 functions as a part of a source line SL.

On the interlayer insulating film 460, an interlayer insulating film 470 is formed so as to cover the metal wiring layers 250, 260. On the interlayer insulating film 470, metal wiring layers 280, 281 are formed. The metal wiring layers 280 function as shunt wires for the select gate lines SGS and the metal wiring layers 281 function as shunt wires for the select gate lines SGD. The metal wiring layers 280, 281 are arranged, for example, at equal intervals as shown in FIGS. 39 and 40. On the interlayer insulating film 470, an interlayer insulating film 480 is formed so as to cover the metal wiring layers 280, 281.

Next, using FIG. 41, a sectional structure of a stitch region SA1 will be explained.

As shown in FIG. 41, an element isolating region STI is formed in the p-type semiconductor substrate 200. On the element isolating region STI, the floating gate 310 and control gate 330 of a memory cell transistor MT are formed. The polysilicon layers 410, 430 have been removed from the select gate lines without shunt regions SA3, SA4 in the stitch region SA1. That is, the select gate lines SGS, SGD are divided by the stitch regions SA1. In each of the select gate lines 410, 430 which have a shunt region SA3 and a shunt region SA4 respectively, a stacked gate including the polysilicon layers 410, 430 has been formed. The stacked gate has been formed so as to project toward the adjacent select gate lines. Similarly, the word lines each having a shunt region SA2 have been formed so as to project toward the adjacent select gate lines SGS, SGD.

Furthermore, in the shunt regions SA3, SA4, the polysilicon layer 430 and inter-gate insulating film 420 are removed, thereby exposing the polysilicon layer 410. Then, contact plugs CP3, CP20 are formed so as to contact the top of the polysilicon layer 410 in the region. An insulating film 431 electrically isolates the contact plugs CP3, CP20 from the polysilicon layer 430. The contact plugs CP3, CP20 are so formed that they extend from the surface of the interlayer insulating film 450 to the polysilicon layer 410.

Furthermore, in the shunt region SA2, a contact plug CP4 is formed in the interlayer insulating film 450. The contact plug CP4 is so formed that they extend from the surface of the interlayer insulating film 450 to the polysilicon layer 430.

On the inter-layer insulating film 450, metal wiring layers 230, 231, 240 are formed. The metal wiring layer 240, which is a shunt wire for a word line, is connected to the corresponding word line (polysilicon layer 430) by a contact plug CP4. The metal wiring layer 230 is connected to the corresponding select gate line SGS (polysilicon layer 410) by a contact plug CP3. The metal wiring layer 231 is connected to the corresponding select gate line SGD (polysilicon layer 410) by a contact plug CP20.

On the interlayer insulating film 450, an interlayer insulating film 460 is formed so as to cover the metal wiring layers 230, 231, 240. In the interlayer insulating film 460, contact plugs CP7, CP20 reaching the metal wiring layers 230, 231 respectively are formed. On the interlayer insulating film 460, metal wiring layers 270, 271 to be connected to the contact plugs CP7, CP21 respectively are formed. The metal wiring layers 270, 271 are extended so as to cover the tops of the gate electrodes of the corresponding select transistors ST1, ST2 and the tops of the stacked gate electrodes of the memory cell transistors MT corresponding to the select transistors ST1, ST2.

On the interlayer insulating film 460, an interlayer insulating film 470 is formed. In the interlayer insulating film 470, contact plugs CP8, CP22 reaching the metal wiring layers 270, 271 respectively are formed. Further on the interlayer insulating film 470, metal wiring layers 280, 281 connected to the contact plugs CP8, CP22 respectively are formed. As shown in FIG. 19, a plurality of metal wiring layers 280, 281 are arranged at equal intervals on the interlayer insulating film 470. Then, on the interlayer insulating film 470, an interlayer insulating film 480 is formed so as to cover the metal wiring layers 280, 281.

The structure of each of the shunt regions SA3, SA4 is the same as that of the shunt region SA3 of FIG. 20 explained in the first embodiment. The shunt region SA2 is so formed that not only one side of a word line but also the other side projects out, that is, both sides of the word line project out, in the shunt region SA2 of FIG. 20.

Next, the operation of the 3Tr-NAND flash memory configured as described above will be explained.

<Write Operation>

Figure 42:
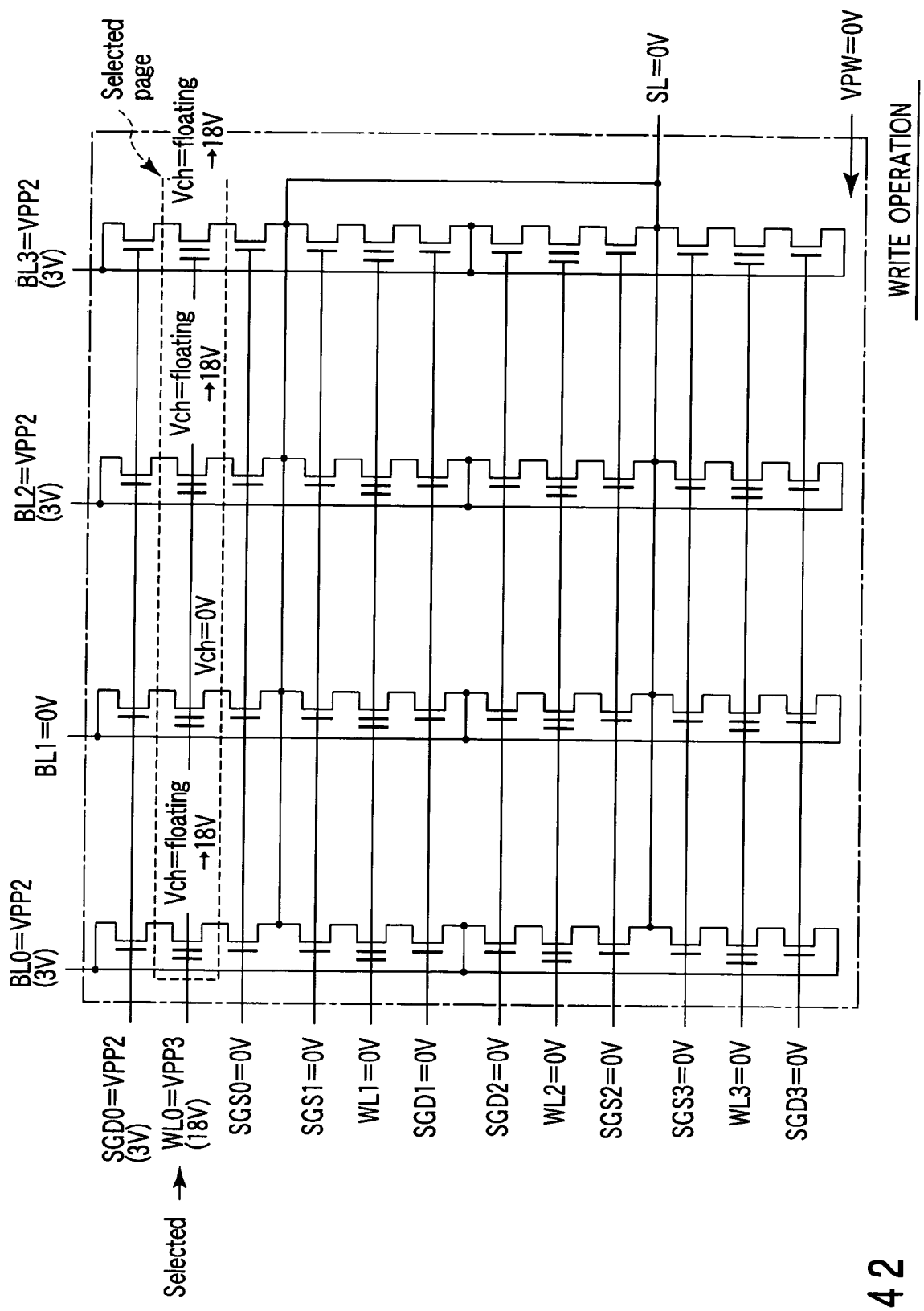
FIG. 42 is a circuit diagram to help explain the state of the memory cell array in a write operation of the 3Tr-NAND flash memory according to the third embodiment.

A write operation will be explained by reference to FIG. 33 and FIG. 42. FIG. 42 is a circuit diagram of the memory cell array 10 of the 3Tr-NAND flash memory 3. For simplification, FIG. 42 shows a case where the number of memory cells is (4×4). Data is written simultaneously into all of the memory cell transistors connected to any one of the word lines. Either "0" data or "1" data is written, depending on whether electrons are injected into the floating gate of a memory cell transistor MT. Electrons are injected into the floating gate by FN tunneling. In FIG. 42, it is assumed that data is written into the memory cell transistors MT connected to word line WL0. Of the memory cell transistors MT, "0" data is written into the memory cell transistor MT connected to bit line BL1 and "1" data is written into the memory cell transistors MT connected to bit lines BL0, BL2, BL3.

First, the CPU 2 inputs write data ("1" or "0"). Then, the latch circuit 53 in the write circuit 50 latches the write data on a bit line basis. If "1" data is input, the latch circuit 53 applies VPP2 (e.g., 3V). to the bit line. Conversely, if "0" data is input, the latch circuit 51 applies 0V to the bit line. That is, as shown in FIG. 42, the latch circuit 51 applies VPP2 to bit lines BL0, BL1, BL3 and 0V to bit line BL1.

Then, the row decoder 130 selects any one of the select gate lines SGD and applies VPP2 to the selected select gate line SGD and 0V to the unselected select gate lines SGD and all of the select gate lines SGS. That is, as shown in FIG. 42, the row decoder 130 selects select gate line SGD0 and applies VPP2 to the selected select gate line SGD0 and 0V to the other select gate lines SGS0 SGD1, SGS1, SGD2, SGS2, SGD3, SGS3.

As a result, of the select transistors ST1 connected to the selected select gate line SGD, the select transistor ST1 connected to the bit line BL to which VPP2 is applied is in the cut-off state. On the other hand, the select transistor ST1 connected to the bit line BL to which 0V is applied is in the on state.

Furthermore, the row decoder 130 selects any one of the word lines and applies VPP3 (18V) to the selected word line WL. In addition, the row decoder 130 applies 0V to all of the unselected word lines. Here, the word line WL selected is the one connected to the memory cell MC including the selected select gate line SGD. As a result, a channel region is formed in the memory cell transistor MT connected to the selected word line WL. Since the select transistor ST1 connected to the selected select gate line SGD and the bit line to which VPP2 is applied is in the cut-off state, the channel potential of the memory cell transistor MT connected to the select transistor ST1 is in the floating state. Then, coupling with the word line WL, the channel potential rises to about 18V. On the other hand, since the select transistor ST1 connected to the selected select gate line SGD and the bit line to which 0V is applied is in the on state, the channel potential of the memory cell transistor MT connected to the select transistor ST1 is at 0V.

Specifically, as shown in FIG. 42, the row decoder 130 not only selects word line WL0 and applies VPP3 to the selected word line WL0 but also applies 0V to the unselected word lines WL1 to WL3. Therefore, a channel region is formed in the memory cell transistors MT connected to word line WL0. Then, since 0V is applied to bit line BL1, the channel potential Vch of the memory cell transistors MT in the memory cell including the select transistor ST1 connected to bit line BL1 is 0V. On the other hand, since VPP2 is applied to bit lines BL0, BL2, BL3, the channel potential Vch of the memory cell transistors MT in the memory cell including the select transistors ST1 connected to bit lines BL0, BL2, BL3 rises to about 18V as a result of coupling with the word line WL0.

Moreover, the row decoder 130 applies 0V to the p-well region 202 in which memory cells have been formed.

As a result, in the memory cell transistor MT in the memory cell including the select transistor ST1 cut off, since the potential difference between the gate and channel is insufficient, no electron is injected into the floating gate. That is, the threshold value of the memory cell connected to the bit line applied with Vcc1 and the selected word line WL (or the memory cell into which "1" data is to be written) remains negative. In the example of FIG. 42, no electron is injected into the floating gate of the memory cell transistors MT connected to bit lines BL0, BL2, BL3 and word line WL0. In other words, "1" data is written into the memory cell transistors MT connected to bit lines BL0, BL2, BL3 and the selected word line WL0.

On the other hand, in the memory cell transistor MT in the memory cell including the select transistor ST1 connected to the selected select gate line SGD and to the bit line BL applied with 0V, since the potential difference between the gate and channel is 18V, electrons are injected into the floating gate by FN tunneling. As a result, the threshold value of the memory cell transistor MT changes to positive. That is, "0" data is written. In the example of FIG. 42, VPP3 is applied to word line WL0, with the result that the potential difference between the gate and channel of the memory cell transistor MT connected to bit line BL1 and word line WL0 is 18V. Therefore, electrons are injected into the floating gate of the memory cell transistor MT connected to bit line BL1 and word line WL0. The threshold value of the memory cell transistor MT into which electrons have been injected changes to positive, which means that "0" data has been written.

As described above, the data is written into one page of memory cell transistors simultaneously.

<Erase Operation>

Figure 43:
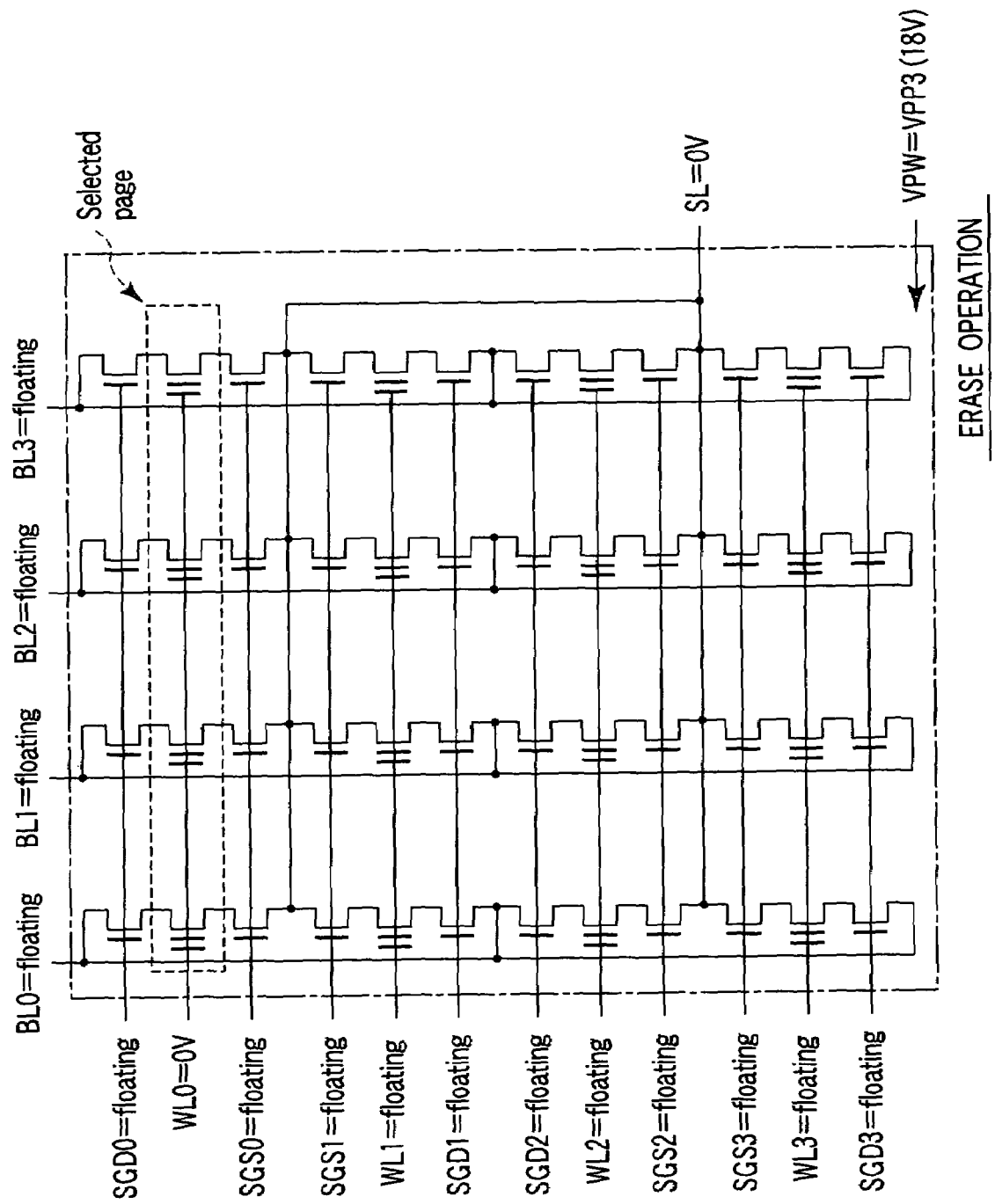
FIG. 43 is a circuit diagram to help explain the state of the memory cell array in an erase operation of the 3Tr-NAND flash memory according to the third embodiment.

An erase operation will be explained by references to FIGS. 33 and 43. FIG. 43 is a circuit diagram of the memory cell array 10 of the 3Tr-NAND flash memory 3. For simplification, FIG. 43 shows a case where the number of memory cells is (4×4). Data is erased in pages simultaneously. An erase operation is carried out by pulling electrons out of the floating gate by FN tunneling. FIG. 43 shows a case where the data is erased from the memory cell transistors connected to word line WL0.

Before an erase operation, all of the bit lines BL are brought into the floating state. In addition, the row decoder 130 brings all of the select gate lines SGD, SGS into the floating state. Then, the row decoder 130 not only selects any one of the word lines and applies 0V to the selected word line WL but also brings the unselected word lines WL into the floating state. In addition, the row decoder 130 applies VPP3 (18V) to the p-type semiconductor substrate 200 in which memory cells have been formed. That is, as shown in FIG. 43, 0V is applied to the selected word line WL0 and the unselected word lines WL1 to WL3 are brought into the floating state. Moreover, all of the select gate lines SGD0, SGS0, SGD1, SGS1 are brought into the floating state.

Then, the potential difference between the memory cell transistors MT connected to the selected word line WL and the well region 200 is 18V, causing the electrons in the floating gates to be pulled out into the well region 200 by FN tunneling. As a result, the data is erased from the memory cell transistors MT connected to the selected word line, with the result that the threshold value of the memory cell transistors MT becomes negative. That is, as shown in FIG. 43, electrons are pulled out of the floating gates of all the memory cell transistors MT connected to word line WL0 into the semiconductor substrate, thereby erasing the data.

In the memory cell transistors MT connected to the unselected word lines, the potentials of the word lines WL rise to about 18V as a result of coupling with the semiconductor substrate. Thus, electrons are not pulled out of the floating gates, with the result that the data is not erased. That is, as shown in FIG. 43, the potentials of the word lines WL1 to WL3 rise by coupling. As a result, the data is not erased from all of the memory cell transistors MT connected to word lines WL1 to WL3. Similarly, the potentials of the select gate lines also rise to about 18V by coupling, which prevents voltage stress from being applied to the gate insulating films of the select transistors ST.

As described above, the data is erased simultaneously from the selected page. In the example of FIG. 43, while the data has been erased from (one page of) the memory cell transistors connected to one word line, the data may be erased simultaneously from the memory cell transistors connected to a plurality of word lines. In this case, the row decoder 130 applies 0V to a plurality of word lines.

<Read Operation>

Figure 44:
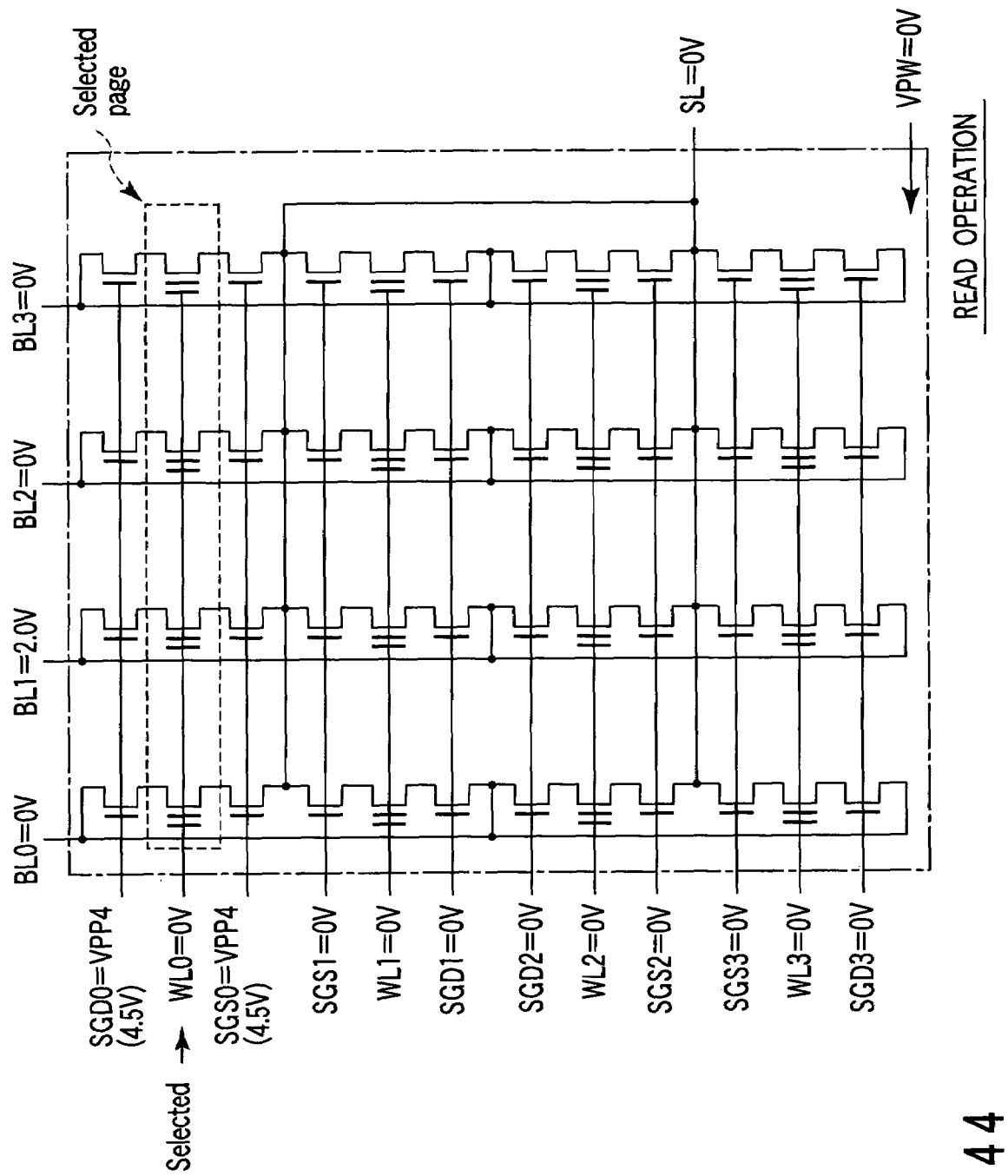
FIG. 44 is a circuit diagram of the memory cell array in the read operation of the 3Tr-NAND flash memory according to the third embodiment.

A read operation will be explained by reference to FIGS. 33 and 44. FIG. 44 is a circuit diagram of the memory cell array 10 of the 3Tr-NAND flash memory 3. For simplification, FIG. 44 shows a case where the number of memory cells is (4×4). FIG. 44 shows a case where the data is read from the memory cell transistor MT connected to bit line BL1 and word line WL0.

First, the row decoder selects select gate lines SGD, SGS to which a memory cell to be read from is connected and applies VPP4 (e.g., 4.5V) to the selected select gate lines SGD, SGS. In addition, the row decoder makes unselected the other select gate lines SGD, SGS and applies 0V to the unselected select gate lines SGD, SGS. As a result, the select transistors ST1, ST2 connected to the selected select gate lines SGD, SGS are brought into the on state. Then, the row decoder applies 0V to all of the word lines WL. That is, as shown in FIG. 44, VPP4 is applied to the selected select gate lines SGD0, SGS0 and 0V is applied to the unselected select gate lines SGD1 to SGD3, SGS1 to SGS3. As a result, the select transistors ST1, ST2 connected to the selected select gate lines SGD0, SGS0 are brought into the on state. In addition, 0V is applied to all of the word lines WL0 to WL3.

Since the memory cell transistor MT has a negative threshold value if the data written in it is "1," the transistor MT is in the on state. Since the memory cell transistor MT has a positive threshold value if the data written in it is "0," the transistor MT is in the off state.

In addition, the precharge circuit 63 precharges the selected bit line BL to, for example, 2.0V. Then, if the data written in the memory cell transistor MT connected to the selected select gate lines SGD, SGS is "1," current flows from the bit line to the source line. On the other hand, if the data written in the memory cell transistor M is "0," no current flows. In the example of FIG. 44, 2.0V is applied to the selected bit line BL1. Then, if the data written in the memory cell transistor MT connected to word line WL0 and the selected bit line BL1 is "1," current flows from bit line BL1 to the source line SL. On the other hand, if the data written in the memory cell transistor M is "0," no current flows.

As described above, the bit line potential varying with the current flowing from the bit line to the source line is amplified by the sense amplifier 64, thereby reading the data. While the data has been read from one bit line in the example of FIG. 44, a potential may be applied to a plurality of bit lines, thereby reading the data from a plurality of memory cell transistors simultaneously.

As described above, the flash memory according to the third embodiment produces the effects in item (1) to item (3) explained in the first embodiment. Hereinafter, the effects in item (1) and item (2) produced by the third embodiment will be explained. Since the effect in item (3) is the same as that in the first embodiment, its explanation will be omitted.

(1) Erroneous reading can be prevented.

This will be explained using FIGS. 45 and 46. FIG. 46 is an equivalent circuit of select gate lines SGS, SGD and a word line WL and their driver circuits. FIG. 46 is a sectional view of a memory cell according to the third embodiment.

As shown in FIG. 45, the select gate line SGS, word line WL, and select gate line SGD have wiring resistances Rparas1, Rparas2, and Rparas3 respectively. A parasitic capacitance Cparas1 exists between a select gate line SGS and a word line WL. A parasitic capacitance Cparas2 exists between a select gate line SGD and a word line WL.

As shown in FIG. 46, each of the select transistors ST1, ST2 has a multilayer gate structure of polysilicon layers 410, 430, with the polysilicon layer 430 electrically in a floating state. A memory cell transistor MT also has a multilayer gate structure of polysilicon layers 410, 430. The control gate CG of the memory cell transistor MT sandwiched between the select transistors ST1, ST2 has parasitic capacitances Ccs, Cfc, and Ccf between itself and the polysilicon layers 410, 430 of the select transistors ST1, ST2 and the floating gate FG, respectively. There is a parasitic capacitance Cfs between the polysilicon layers 410, 430 of the select transistors ST1, ST2. These parasitic capacitances Ccs, Cfc, Cfs existing between the control gate and the select transistor ST1 correspond to the parasitic capacitance Cparas1 in FIG. 45. In addition, the parasitic capacitances Ccs, Cfc, Cfs existing between the control gate and the select transistor ST2 correspond to the parasitic capacitance Cparas2 in FIG. 45.

For example, when select gate lines SGD0, SGS0 are selected in a read operation, the select gate line driver applies VPP4 (about 4.5V) to select gate lines SGD0, SGS0. Word line WL0 is at 0V. Then, the potential of select gate line SGD0 rises, with the result that the potential of word line WL0 fluctuates under the influence of the coupling of the parasitic capacitance Cparas2. Moreover, the potential of select gate line SGS0 rises, with the result that the potential of word line WL0 fluctuates under the influence of the coupling of the parasitic capacitance Cparas1. Specifically, in the case of the 3Tr-NAND flash memory, the effect of the coupling of the parasitic capacitance Ccs on the word line and the effect of the coupling of the parasitic capacitances Cfs, Cfc on the word line are twice as great as that in the 2Tr flash memory explained in the first embodiment.

In this respect, the flash memory 3 of the third embodiment has the shunt wires 240 for the word lines as shown in FIG. 46. The shunt wires 240, which are made of material whose resistance is lower than that of polysilicon, are in contact with the word lines at a plurality of places. Therefore, the row address decode signal supplied from the row decoder 130 can be transmitted to the control gates CG at high speed. In other words, the wiring resistance Rparas2 of the word line WL can be made lower. Accordingly, the control gate CG of the memory cell transistor MT is less liable to be influenced by coupling. The reason is that the lower wiring resistance Rparas2 of the word line means that the driving capability of the row decoder 130 is improved. Specifically, for example, in a read operation, the control gate CG of the memory cell transistor MT is fixed heavily to 0V by the shunt wire 240. Therefore, the control gate CG is less liable to be influenced by coupling due to a change in the potential of the select gate line.

As described above, since a fluctuation in the potential of the control gate CG can be suppressed, it is possible to prevent the data from being read from the memory cells erroneously.

(2) The operating speed can be improved.

For the same reason explained in item (1), the read operation speed and write operation speed can be improved. This is the same as explained using FIG. 30 in the first embodiment.

As described above, as the potential of the select gate line fluctuates, the potential of the control gate fluctuates as a result of coupling with the fluctuation. However, with the configuration of the third embodiment, the effect of coupling can be made smaller than in the prior art, which enables the potential of the control gate to be stabilized in a shorter time than in the prior art. Therefore, the write or read operation can be started faster than in the prior art, which enables the operating speed of the flash memory to be improved.

Furthermore, as explained in the first embodiment, the operating speed of the flash memory can be improved because excessive writing is not needed when "0" is written and the select gates SGS, SGD are also provided with shunt wires 280, 281.

Figure 47:
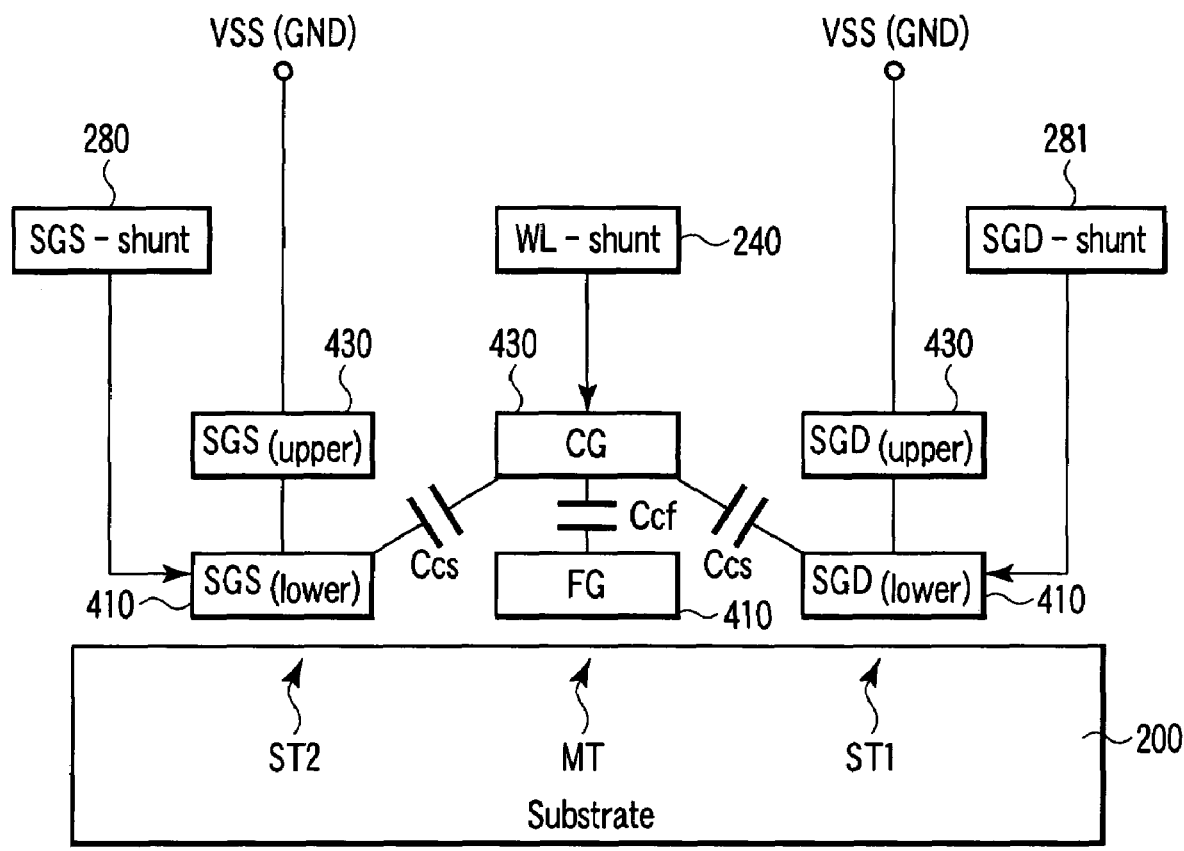
FIG. 47 is a sectional view schematically showing a memory cell included in a 3Tr-NAND flash memory according to a fourth embodiment of the present invention.

Next, a semiconductor memory device according to a fourth embodiment of the present invention will be explained. The fourth embodiment is such that the second embodiment is applied to the 3Tr-NAND flash memory of the third embodiment. Since the configuration of the flash memory is the same as that in the third embodiment, its explanation will be omitted. FIG. 47 is a schematic sectional view of a memory cell according to the fourth embodiment.

As shown in FIG. 47, each of the select transistors ST1, ST2 of the 3Tr-NAND flash memory 3 according to the fourth embodiment has a multilayer gate structure of polysilicon layers 410, 430. As in the third embodiment, the shunt wires 280, 281 of the select gate lines SGS, SGD are connected to the polysilicon layer 410 and are not connected to the polysilicon layer 430. Instead, the polysilicon layers 430 of the select transistors ST1, ST2 are connected to a specific potential VSS (e.g., GND), thereby fixing the potential.

As described above, the configuration of the fourth embodiment produces not only the effects in item (1) to item (3) in the third embodiment but also the effect in item (7) explained in the second embodiment. The effect in item (7) in the fourth embodiment will be explained below.

(7) Erroneous reading can be prevented more effectively and the operating speed can be improved more.

In the configuration of the fourth embodiment, the polysilicon layers 430 of the select transistors ST1, ST2 are fixed at a specific potential. Therefore, when a voltage is applied to the polysilicon layers 410 via the shunt wires 280, 281, the effect of the parasitic capacitances Cfs, Cfc explained using FIG. 46 in the third embodiment can be made very small. Consequently, the parasitic capacitances Cparas1, Cparas2 explained in FIG. 45 are determined almost only by the parasitic capacitance Ccs as shown in FIG. 47. Therefore, the parasitic capacitance Cparas1 between the select gate line SGS and the word line WL and the parasitic capacitance Cparas2 between the select gate line SGD and the word line WL can be made much smaller than in the third embodiment. As a result, as explained in the effects in item (1) and item (2) in the third embodiment, the suppression of erroneous reading and a greater improvement in the operating speed can be realized.

Figure 48:
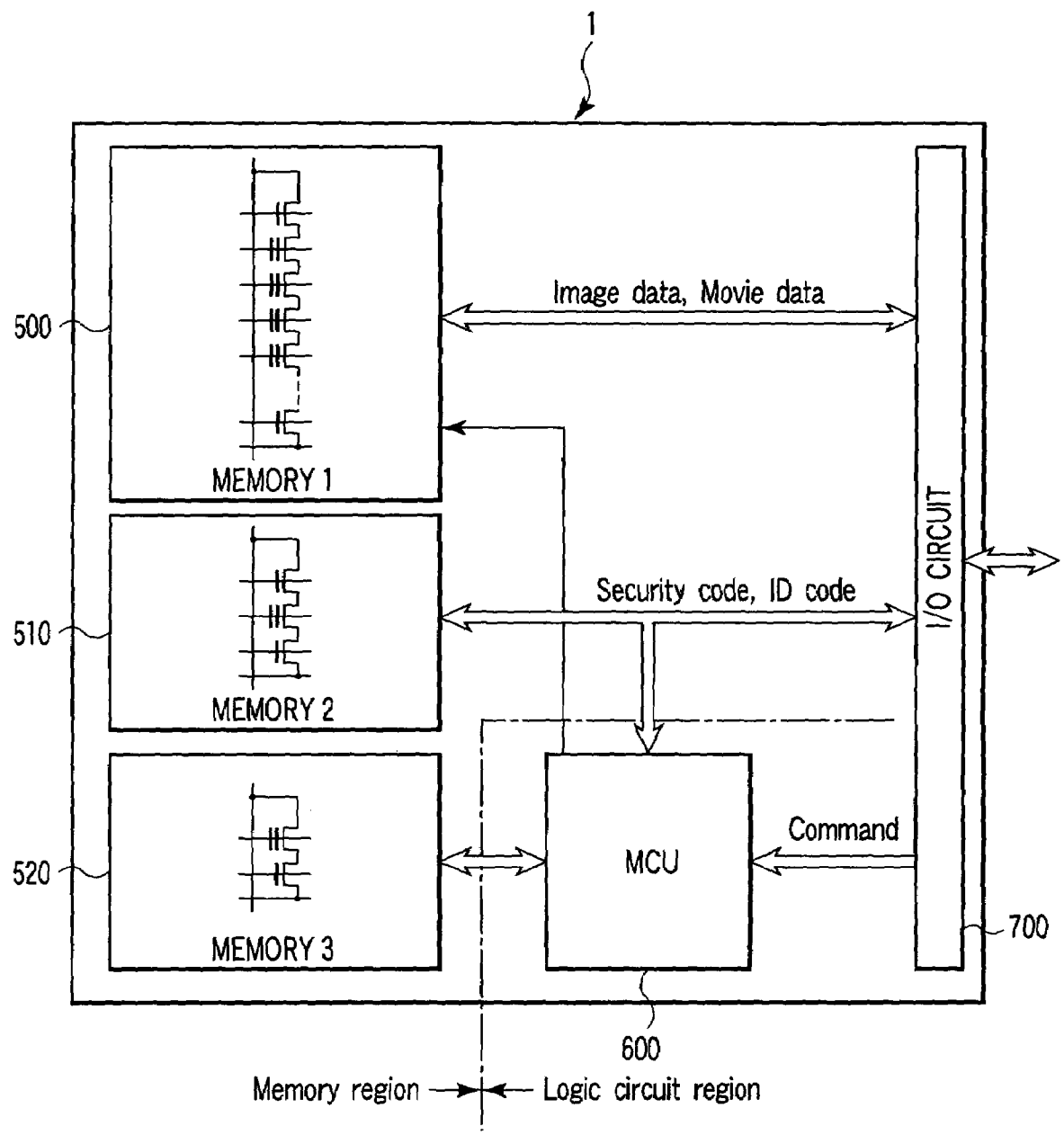
FIG. 48 is a block diagram of a system LSI according to a fifth embodiment of the present invention.

Next, a semiconductor memory device according to a fifth embodiment of the present invention will be explained. The fifth embodiment is such that the flash memories explained in the first to fourth embodiments are mounted in a single chip of an LSI on which other semiconductor memories are also embedded. FIG. 48 is a block diagram of a system LSI according to the fifth embodiment.

As shown in FIG. 48, a system LSI 1 comprises a NAND flash memory 500, a 3Tr-NAND flash memory 510, a 2Tr flash memory 520, an MCU 600, and an I/O circuit 700 formed on a single semiconductor substrate.

The NAND flash memory 500 is used as a storage memory for storing image data or video data.

The 3Tr-NAND flash memory 510 holds an ID code for accessing the LSI 1 and a security code. The configuration of the 3Tr-NAND flash memory 510 is as explained in the third and fourth embodiments.

The 2Tr flash memory 520 holds program data for the MCU 600 to operate. The configuration of the 2Tr flash memory 520 is as explained in the first and second embodiments.

The MCU 600 does processing on the basis of the program read from the 2Tr flash memory 520, in response to various commands externally input. At this time, the MCU 600 accesses the 2Tr flash memory 520 directly without intervention of an SRAM (Static Random Access Memory) or the like. The processing done by the MCU 600 includes the compression or decompression of the data input to the NAND flash memory 500 and control of an external device. In addition, the MCU 600 reads specific data from the 3Tr-NAND flash memory 510, when the data held in the NAND flash memory 500 is accessed from the outside. Then, the MCU 600 checks the read-out data against the externally input ID code and security data. If they coincide with each other, the MCU 600 permits access to the NAND flash memory 500. When access to the NAND flash memory 500 is permitted, the data in the NAND flash memory 500 is accessed from the outside (host). Specifically, the MCU 600 triggers the NAND flash memory 500 in response to the command received from the outside, thereby reading (or writing) the data.

The I/O circuit 700 controls the exchange of signals between the LSI 1 and the outside.

Next, the configuration of each of the three semiconductor memories included in the LSI 1 will be explained below.

<NAND Flash Memory>

The NAND flash memory 500 is such that the configuration of the memory cell array 10 is replaced with the configuration of FIG. 49 in FIG. 33 explained in the third embodiment. FIG. 49 is a circuit diagram of the memory cell array 10 included in the NAND flash memory 500.

As shown in FIG. 49, the memory cell array has a plurality of NAND cells arranged in a matrix. Each of the NAND cells includes eight memory cell transistors MT and select transistors ST1, ST2. A memory cell transistor MT has a stacked-gate structure that includes a floating gate formed on a semiconductor substrate with a gate insulating film interposed therebetween and a control gate formed on the floating gate with an inter-gate insulating film interposed therebetween. The number of memory cell transistors MT is not limited to 8 and may be 16 or 32. The number is illustrative and not restrictive. The adjoining ones of the memory cell transistors MT share their source or drain. They are arranged in such a manner that their current paths are connected in series between the select transistors ST1, ST2. The drain region at one end of the series connection of the memory cell transistors MT is connected to the source region of the select transistor ST1. The source region at the other end is connected to the drain region of the select transistor ST2. That is, a NAND cell is such that a plurality of memory cell transistors MT are used in a 3Tr-NAND flash memory.

The control gates of the memory cell transistors MT in a same row are connected commonly to any one of word lines WL0 to WL*m*. The gates of the select transistors ST1, ST2 in the same row are connected commonly to select gate lines SGD, SGS, respectively. Word lines WL0 to WL*m* and select gate lines SGS, SGD are connected to the row decoder 130. The drains of the select transistors ST1 in a same column are connected commonly to any one of bit lines BL0 to BL*n*. Bit lines BL0 to BL*n* are connected to the write circuit 50 and read circuit 60. The sources of the select transistors ST2 are connected commonly to a source line SL and then connected to a source line driver 70. Both of the select transistors ST1, ST2 are not necessarily needed. Only one of them may be used, provided that it can select a NAND cell.

Figure 50:
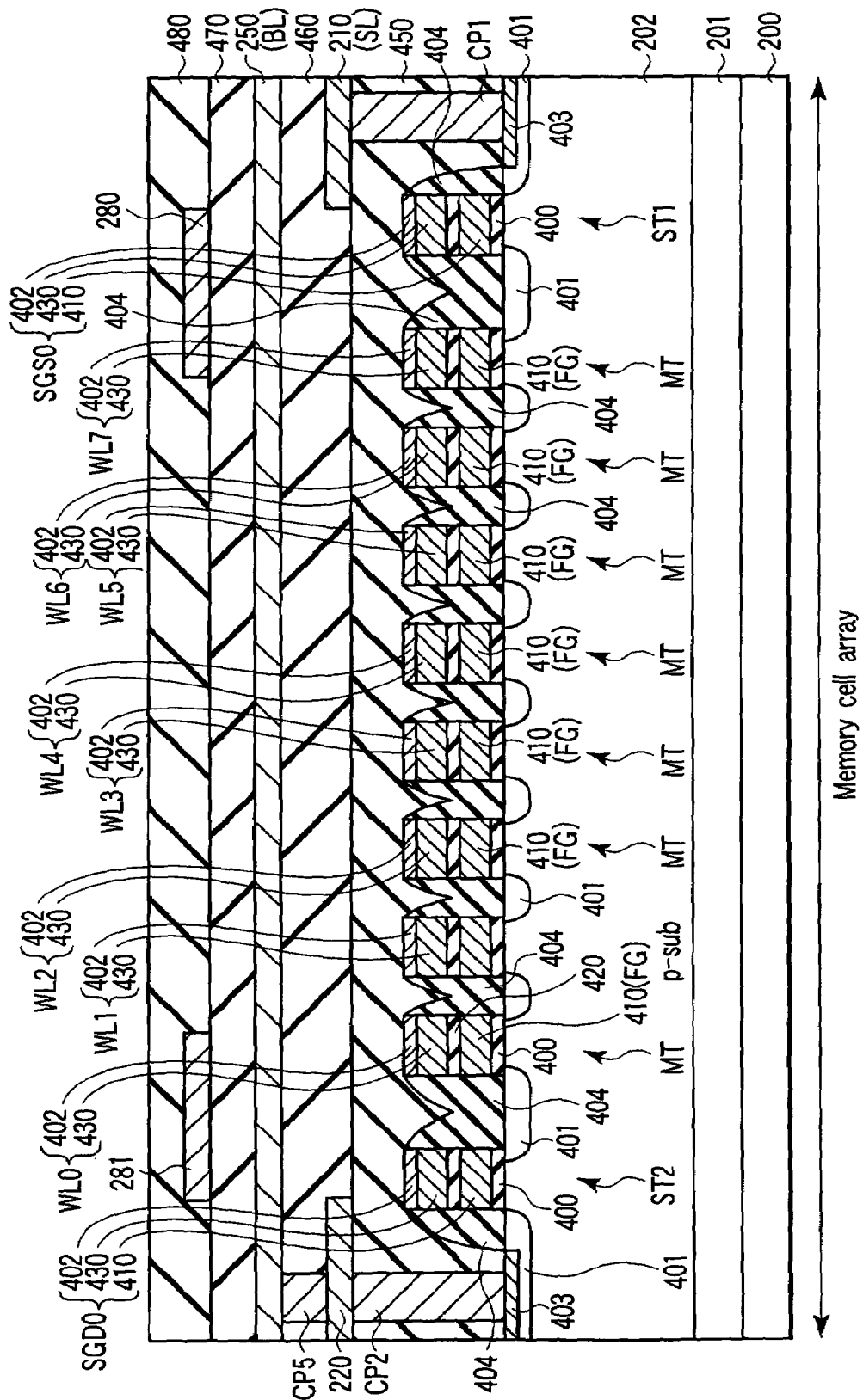
FIG. 50 is a sectional view of the memory cell array of a NAND flash memory according to the fifth embodiment.

FIG. 50 is a sectional view, taken along a bit line, of a memory cell array included in the NAND flash memory 500. As shown in FIG. 50, on the p-type semiconductor (silicon) substrate 200, a gate insulating film 400 is formed. On the gate insulating film 400, the gate electrodes of a memory cell transistor MT and transistors ST1, ST2 are formed. Each of the gate electrodes of the memory cell transistor MT and select transistors ST1, ST2 includes a polysilicon layer 410 formed on the gate insulating film 400, an inter-gate insulating film 420 formed on the polysilicon layer 410, a polysilicon layer 430 formed on the inter-gate insulating film 420, and a silicide layer 402 formed on the polysilicon layer 430. The inter-gate insulating film 420 is made of, for example, a silicon oxide film, or an ON film, NO film, or ONO film having a stacked structure of a silicon oxide film and a silicon nitride film. In a memory cell transistor MT, the polysilicon layers 410, which are separated from one another between adjacent element regions AA adjoining in the word line direction, function as floating gates (FG). The polysilicon layers 430 and silicide layers 402 function as control gate (or word lines WL). The polysilicon layers 430 are connected to one another between element regions AA adjoining in the word line direction. In the select transistors ST1, ST2, a part of the inter-gate insulating film 420 is removed in a shut region (not shown), which connects the polysilicon layers 410, 430 electrically. The polysilicon layers 410, 430 and silicide layers 402 function as select gate lines SGD, SGS. In the select transistors ST1, ST2, the polysilicon layers 410 and polysilicon layers 430 are not separated from one another between element regions AA adjoining in the word line direction and are connected to one another.

At the surface of the semiconductor substrate 200 located between adjacent gate electrodes, impurity diffused layers 401 functioning as source or drain region are formed. An impurity diffused layer 401 is shared by adjacent transistors. Specifically, an impurity diffuse layer 401 between two adjacent select transistors ST1 functions as the drain region of the two select transistors ST1. An impurity diffused layer 401 between two adjacent select transistors ST2 functions as the source region of the two select transistors ST2. An impurity diffuse layer 401 between two adjacent memory cell transistors MT functions as the source or drain region of the two memory cell transistors MT. Moreover, an impurity diffuse layer 401 between a memory cell transistor MT and a select transistor ST1 adjoining each other functions as the drain region of the memory cell transistor MT and the source region of the select transistor ST1. An impurity diffuse layer 401 between a memory cell transistor MT and a select transistor ST2 adjoining each other functions as the source region of the memory cell transistor MT and the drain region of the select transistor ST2. Then, at the surface of the drain region 401 of the select transistor ST1 and at the surface of the source region 401 of the select transistor ST2, a silicide layer 403 is formed. No silicide layer is formed in the source-drain region 401 of the memory cell transistor MT, the source region of the select transistor ST1, and the drain region 401 of the select transistor ST2. On the sidewalls of the gate electrodes (stacked gates) of the memory cell transistor MT and select transistors ST1, ST2, a sidewall insulating film 404 is formed. The sidewall insulating film 404 is formed on both sides of the stacked gate, that is, the side facing the source region of the stacked gate and the side facing its drain region. The region between the stacked gates of the memory cell transistors MT and the memory cell transistors ST1, ST2 is filled with the sidewall insulating film 406. Thus, the top of the source-drain region of the memory cell transistor MT, the top of the source region of the select transistor ST1, and the top of the drain region of the select transistor ST2 are covered with the sidewall insulating film 404.

Then, on the semiconductor substrate 200, an interlayer insulating film 450 is formed so as to cover the memory cell transistor MT and select transistors ST1, ST2. In the interlayer insulating film 450, a contact plug CP1 reaching the silicide layer 403 formed in the source region 401 of the select transistor ST2 is formed. On the interlayer insulating film 450, a metal wiring layer 210 connected to the contact plug CP1 is formed. The metal wiring layer 210 functions as a source line SL. Further in the interlayer insulating film 450, a contact plug CP2 reaching the silicide layer 403 formed in the drain region 401 of the select transistor ST1 is formed. On the interlayer insulating film 450, a metal wiring layer 220 to be connected to the contact plug CP2 is formed.

On the interlayer insulating film 450, an interlayer insulating film 460 is formed so as to cover the metal wiring layers 210, 220. In the interlayer insulating film 460, a contact plug CP5 reaching the metal wiring layer 220 is formed. On the interlayer insulating film 460, a metal wiring layer 250 equally connected to a plurality of contact plugs CP5 are formed. The metal wiring layers 250 function as the bit lines BL.

On the interlayer insulating film 460, an interlayer insulating film 470 is formed so as to cover the metal wiring layers 250. On the interlayer insulating film 470, metal wiring layers 280, 281 are formed. The metal wiring layers 280, 281, which are connected to the silicide layers 402 in the select transistors ST2, ST1 in a region (not shown), function as shunt wires for the select gate lines SGS, SGD. Then, on the interlayer insulating film 470, an interlayer insulating film 480 is formed so as to cover the metal wiring layers 280, 281.

As explained in the first to fourth embodiments, shunt wires for the word lines WL may be provided in the NAND flash memory.

<3Tr-NAND Flash Memory>

The configuration of the 3Tr-NAND flash memory 510 is as explained in the third and fourth embodiments. As shown in FIG. 51, on the polysilicon layer 430 and at the surface of the impurity diffused layer 401, silicide layers 402, 403 may be formed respectively. Then, a sidewall insulating film 404 may be formed on the sidewalls of the stacked gate. In a memory cell transistor MT, the polysilicon layer 430 and silicide layer 402 function as a control gate (or word line WL).

No silicide layer is formed in the source and drain regions 401 of the memory cell transistor MT, in the source region 401 of the select transistor ST1, and in the drain region 401 of the select transistor ST2. The region between the stacked gates of the memory cell transistor MT and select transistors ST1, ST2 is filled with the sidewall insulating film 404. Thus, the top of the source and drain regions of the memory cell transistor MT, the top of the source region of the select transistor ST1, and the top of the drain region of the select transistor ST2 are covered with the sidewall insulating film 404.

<2Tr Flash Memory>

Figure 52:
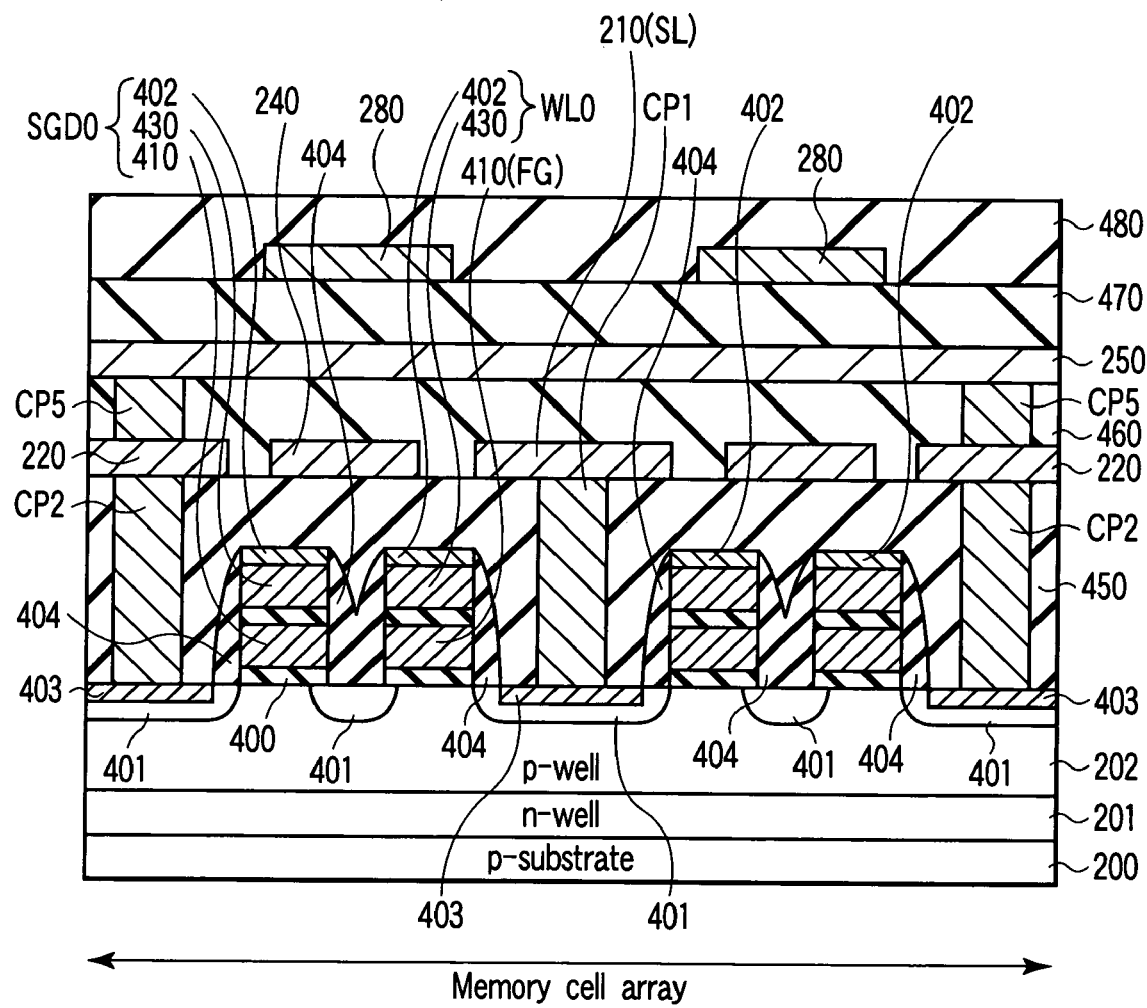
FIG. 52 is a circuit diagram of the memory cell array of a 2Tr-flash memory according to the fifth embodiment.

The configuration of the 2Tr flash memory 520 is as explained in the first and second embodiments. As shown in FIG. 52, on the polysilicon layer 430 and at the surface of the impurity diffused layer 401, silicide layers 402, 403 may be formed respectively. Then, a sidewall insulating film 404 may be formed on the sidewalls of the stacked gate. In a memory cell transistor MT, the polysilicon layer 430 and silicide layer 402 function as a control gate (or word line WL).

No silicide layer is formed in the source region 401 of the memory cell transistor MT and in the drain region 401 of the select transistor ST. The region between the stacked gates of the memory cell transistor MT and select transistor ST is filled with the sidewall insulating film 404. Thus, the top of the source region of the memory cell transistor MT and the top of the drain region of the select transistor ST are covered with the sidewall insulating film 404.

As described above, the system LSI of the embodiment produces not only the effects in item (1) to item (7) explained in the first to fifth embodiments but also the effects described below.

(8) It is possible to embed a plurality of types of flash memories in a single chip, while suppressing the manufacturing cost.

With the configuration of this embodiment, the memory cell transistors MT and select transistors ST1, ST2, ST included in the NAND flash memory 500, 3Tr-NAND flash memory 510, and 2Tr flash memory 520 are formed in the same processes. That is, the individual MOS transistors are formed in the same oxidizing process, film-forming process, impurity implanting process, photolithographic etching process. As a result, the gate insulating film, inter-gate insulating film, the floating gates and control gates of the memory cell transistors MT, and the select gates of the select transistors are the same in the three flash memories 500, 510, 520. In such a manufacturing method, the memory cell arrays of the three flash memories can be formed by the number of processes required to form a single flash memory. Therefore, the manufacturing cost of a system LSI including three types of semiconductor memories can be reduced.

All of the processes are not necessarily shared by the three memories. Sharing even part of all of the processes produces the effect in item (8).

(9) The performance of the system LSI can be made higher.

The system LSI of the embodiment has the NAND flash memory 500, 3Tr-NAND flash memory 510, and 2Tr flash memory 520 as described above.

Unlike the NAND flash memory 500 and 3Tr-NAND flash memory 510, the 2Tr flash memory 520 uses a positive voltage (VPP=12V) and a negative voltage (VBB1=−7V, VBB2=−8V) in a write and an erase operation. That is, the potential difference applied across the gate insulating film of the MOS transistor used in the row decoder is 12V, −7V or −6V. Therefore, the gate insulating film of the MOS transistors used in the row decoder included in the 2Tr flash memory 520 may be thinner than that of the MOS transistors used in the row decoders included in the NAND flash memory 500 and 3Tr-NAND flash memory 510. Thus, the row decoder of the 2Tr flash memory can be made more compact. In addition, the operating speed of the row decoder can be made faster than that of the row decoders in the NAND flash memory 500 and 3Tr-NAND flash memory 510.

In the sixth embodiment, the program data for the MCU 600 to operate is stored in the 2Tr flash memory 520. Thus, the 2Tr flash memory can operate at high speed as described above. The data can be read directly from the 2Tr flash memory 520 without the intervention of the MCU 600 or RAM. As a result, a RAM or the like is not needed, which helps simplify the configuration of the system LSI and improve the operating speed.

In addition, the 3Tr-NAND flash memory 510 holds an ID code and a security code. These code data are not so large in the amount of data, but are frequently changed and updated. Thus, the memory to hold the code data is required to operate at some high speed. In this respect, the 3Tr-NAND flash memory 510 uses a smaller erase unit than that in the NAND flash memory 500 and can rewrite the data in pages. Therefore, it can be said that the 3Tr-NAND flash memory 510 is the preferable semiconductor memory to hold the code data.

A conventional LSI including a NAND flash memory requires the following controller to prevent rewriting from concentrating on a specific block. The controller converts addresses input in ware leveling or logic form into physical addresses or, when a block malfunctions, determines the block to be faulty and performs control to prevent the faulty block from being used. In the sixth embodiment, however, such a controller is not needed. The reason is that the 2Tr flash memory 520 is caused to hold a firmware program to control the blocks in the NAND flash memory 500 and the MCU 600 is caused to perform such control. The MCU 600 performs the control in an interval of time between its original jobs (such as the process of controlling an external device or the process of computing the data input to the NAND flash memory 500). Of course, when the comparison of the capacity of the MCU 600 with the amount of work the MCU 600 has to process has shown that the amount of work has exceeded the capacity, a hardware sequencer or the like may be provided to control the NAND flash memory 500.

As described above, the flash memory according to each of the first to fifth embodiments has the shunt wires for the word lines. The shunt wires, which are made of material whose resistance is lower than that of polysilicon of which the word lines are made, are in contact with the word lines at a plurality of places. Therefore, the shunt wires enable the row address decode signal to be transmitted at high speed. That is, as compared with the prior art, the driving capability of the decode circuit can be increased relatively without changing its configuration. Therefore, it is possible to effectively prevent the potentials of the word lines from fluctuating as a result of coupling with a change in the potential of the select gate lines in a write and a read operation. Accordingly, the reliability of the write and read operations can be improved and the operating speed can be improved.

The shunt wires for the word lines are formed at the same level as the source lines. That is, the shunt wires are formed of metal wiring lines at the level of the lowest one of the multilayer metal wiring layer. Thus, in the manufacturing processes, the charge produced in the plasma process can be allowed to escape surely into the semiconductor substrate. As a result, it is possible to suppress charge damage done to the gate insulating films, which improves the reliability of the flash memory.

Figure 53:
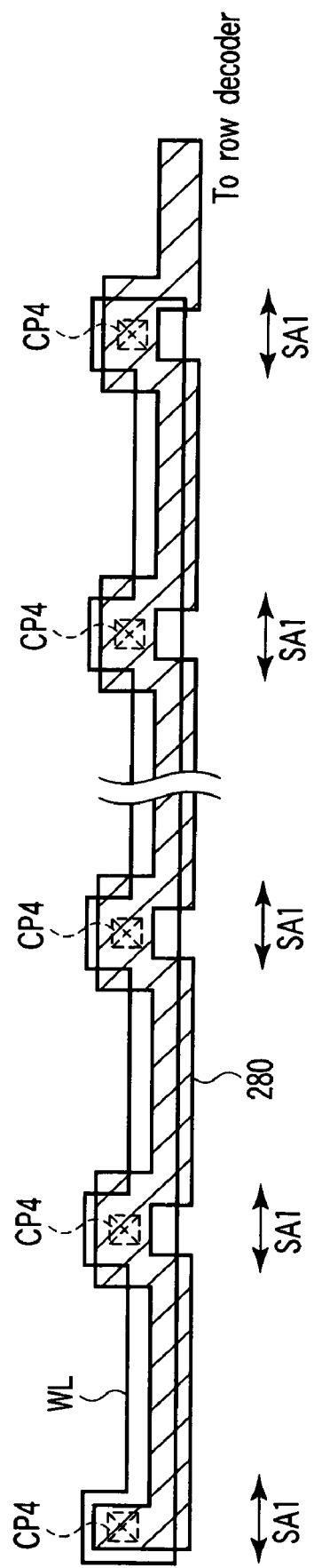
FIG. 53 is a plan view of a word line shunt wire included in a flash memory according to a first modification of the first to fifth embodiments.

The pattern of shunt wires for the word lines is not limited to the configurations of FIGS. 7 and 36 explained in the first and third embodiments. The shunt wires have only to be connectable to the shunt regions for the word lines and separable from the metal wiring layers 210 functioning as source lines and the metal wires 220, 230. As shown in FIG. 36, making the wiring pattern of the shunt wires for the word lines axisymmetric with a source line improves the reliability of the patterning process of shunt wires (including the lithographic process and RIE process). At the ends of the word lines, the shunt wires 280 may have such a plane pattern as shown in FIG. 53. That is, the shunt regions may be provided at the ends of the word lines. The pattern of the shunt wires 280 at the ends of the word lines may differ from the pattern excluding the ends of the word lines as shown in FIG. 53.

Figure 54:
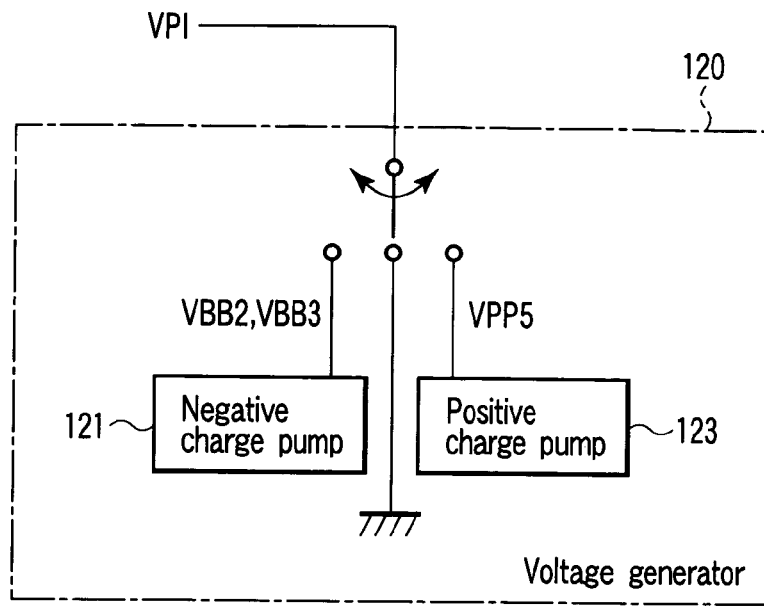
FIG. 54 is a block diagram of the voltage generator included in a flash memory according to a second modification of the first to fifth embodiments.
Figure 55:
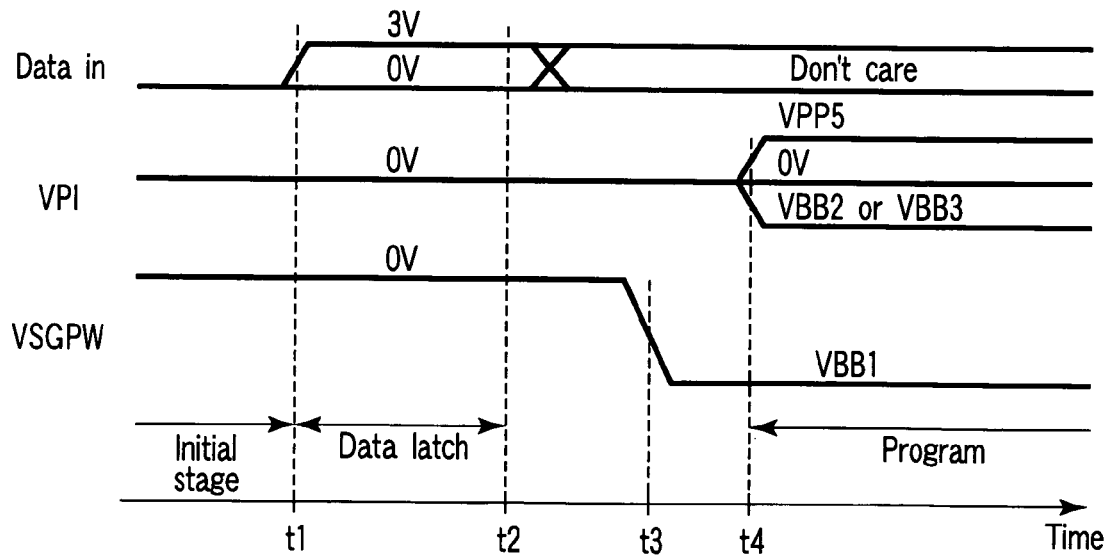
FIG. 55 is a timing chart for various signals in the write operation of the flash memory according to the second modification of the first to fifth embodiments.

Furthermore, in the 2Tr flash memory according to each of the first and second embodiments, only a negative voltage has been used as the write inhibit voltage VPI. Instead of the negative voltage, a positive voltage or 0V may be used as the write inhibit voltage VPI. FIG. 54 shows a circuit configuration in such a case. FIG. 55 is a timing chart for VPI and VNEGPRG.

As shown in the figures, the charge pump circuit 120 includes a charge pump circuit 121 which generates a negative potential and a charge pump circuit 122 which generates a positive potential. A charge pump circuit 131 generates negative potentials VBB2, VBB3. A charge pump circuit 132 generates a positive potential VPP5. The output nodes of these voltages and the ground potential node are connected to VPI node by a switch suitably, which enables the voltage best suited to the situation to be used as the write inhibit voltage VPI.

Furthermore, in the above embodiment, a 2Tr flash memory which includes the write decoder 20 and select gate decoder 30 has been explained. As in a 3Tr-NAND flash memory or a NAND flash memory, a single row decoder 130 may select a word line and a select gate line. Moreover, in an erase operation, the decode circuit may apply a positive voltage equal to VPW to the select gate lines.

Although a polysilicon layer has been used as a material for the gate electrodes, the present invention is not limited to polysilicon. In addition, while in the above embodiment, electrons have been injected into the charge accumulation layer by FN tunneling, the present invention may be applied to a semiconductor memory where electrons are injected into the charge accumulation layer by another method.

Furthermore, in the 2Tr flash memory of the above embodiment, the bit lines have been hierarchized, the present invention is not restricted to this.

Figure 56:
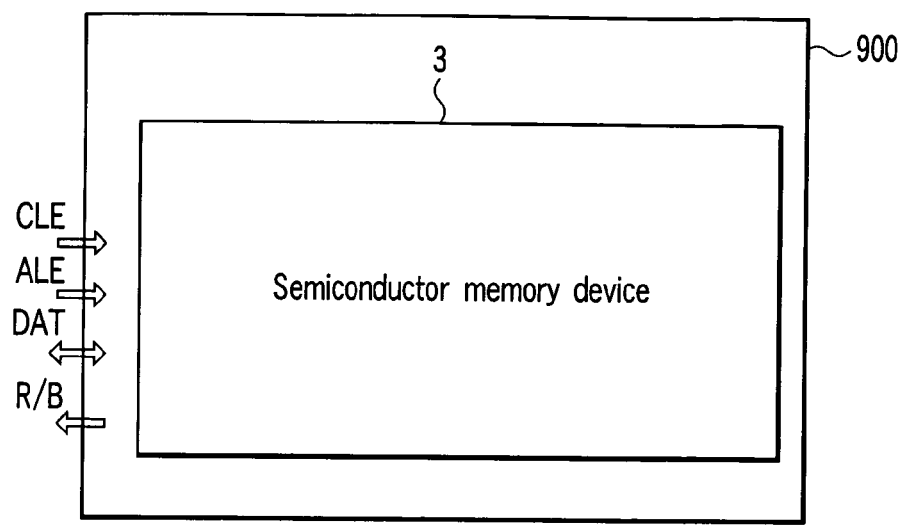
FIG. 56 is a block diagram of a memory card including a flash memory according to the first to sixth embodiments.

Next, an application of the flash memory will be explained. FIG. 56 shows an example of a memory card. As shown in FIG. 56, the memory card 900 includes a flash memory 3 (3Tr-NAND flash memory, NAND flash memory, or 2Tr flash memory) explained in the above embodiments. The flash memory 3 receives specific controls signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 900 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Figure 57:
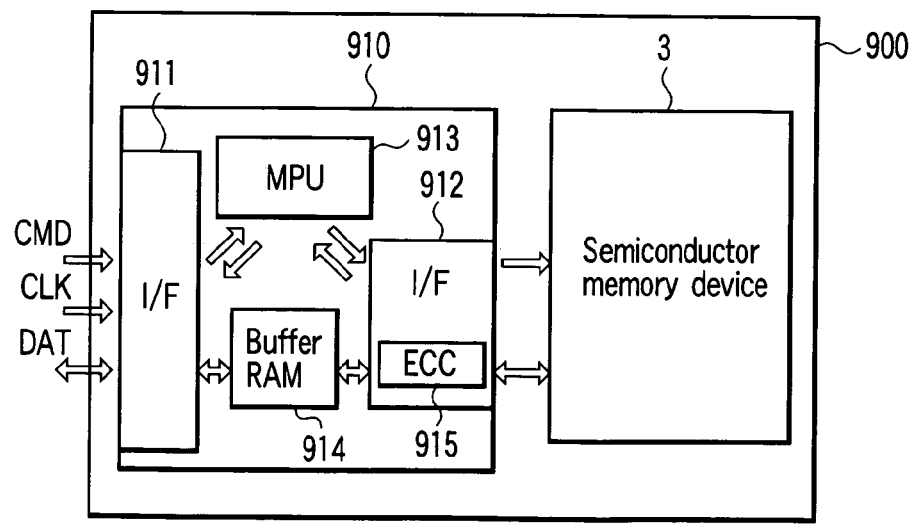
FIG. 57 is a block diagram of a memory card including a flash memory according to the first to sixth embodiments.

Another exemplary implementation is shown in FIG. 58. The memory card shown in FIG. 57 differs from the memory card presented in FIG. 56 in that the memory card of FIG. 57 includes, in addition to the memory device, a controller 910 which controls the flash memory 3 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/ to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

FIG. 58 shows another application. As shown in FIG. 58, the memory card 900 is inserted into a cardholder 920, which is then connected to electronic equipment (not shown). The cardholder 920 may have a part of the function of the controller 910.

FIG. 59 shows another application. As shown in FIG. 59, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

Figure 60:
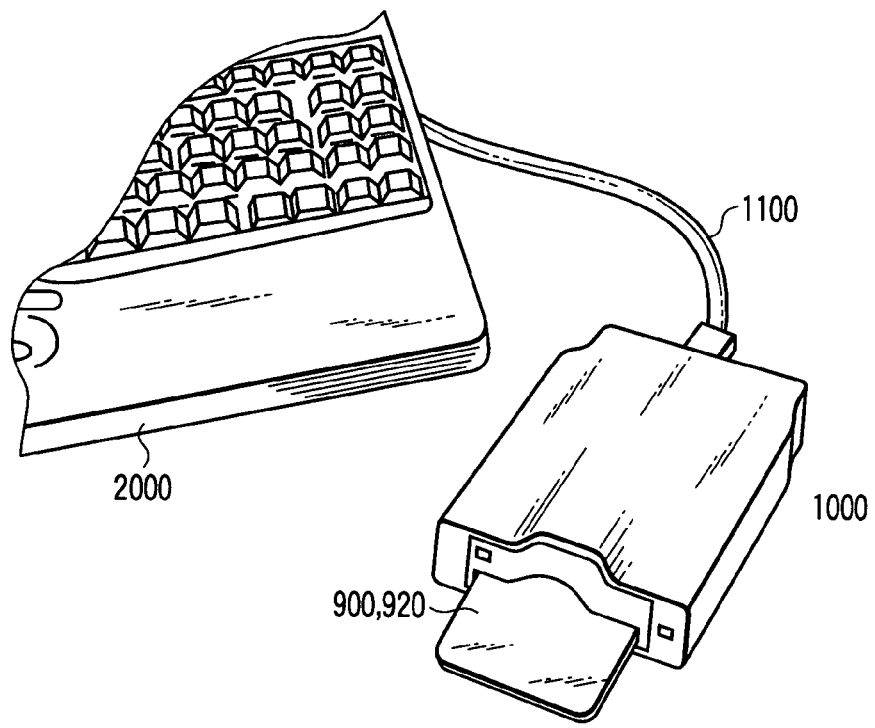
FIG. 60 is the outward appearance of a connection unit which enables connection with a memory card including a flash memory according to the first to sixth embodiments.

FIG. 60 shows another application. The memory card 900 or the cardholder 920 in which the memory card 900 has been inserted is inserted into the connection unit 1000. The connection unit 1000 is connected to a personal computer 2000 via the connection cable 1100.

Figure 61:
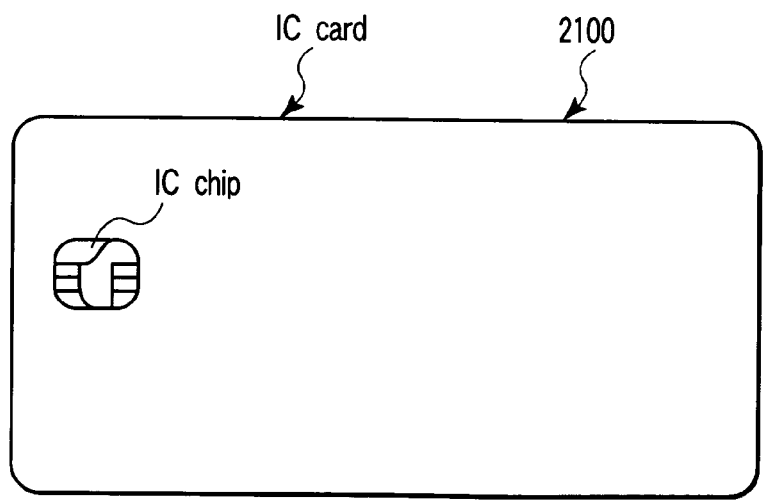
FIG. 61 is the outward appearance of an IC card including a flash memory according to the first to sixth embodiments.
Figure 62:
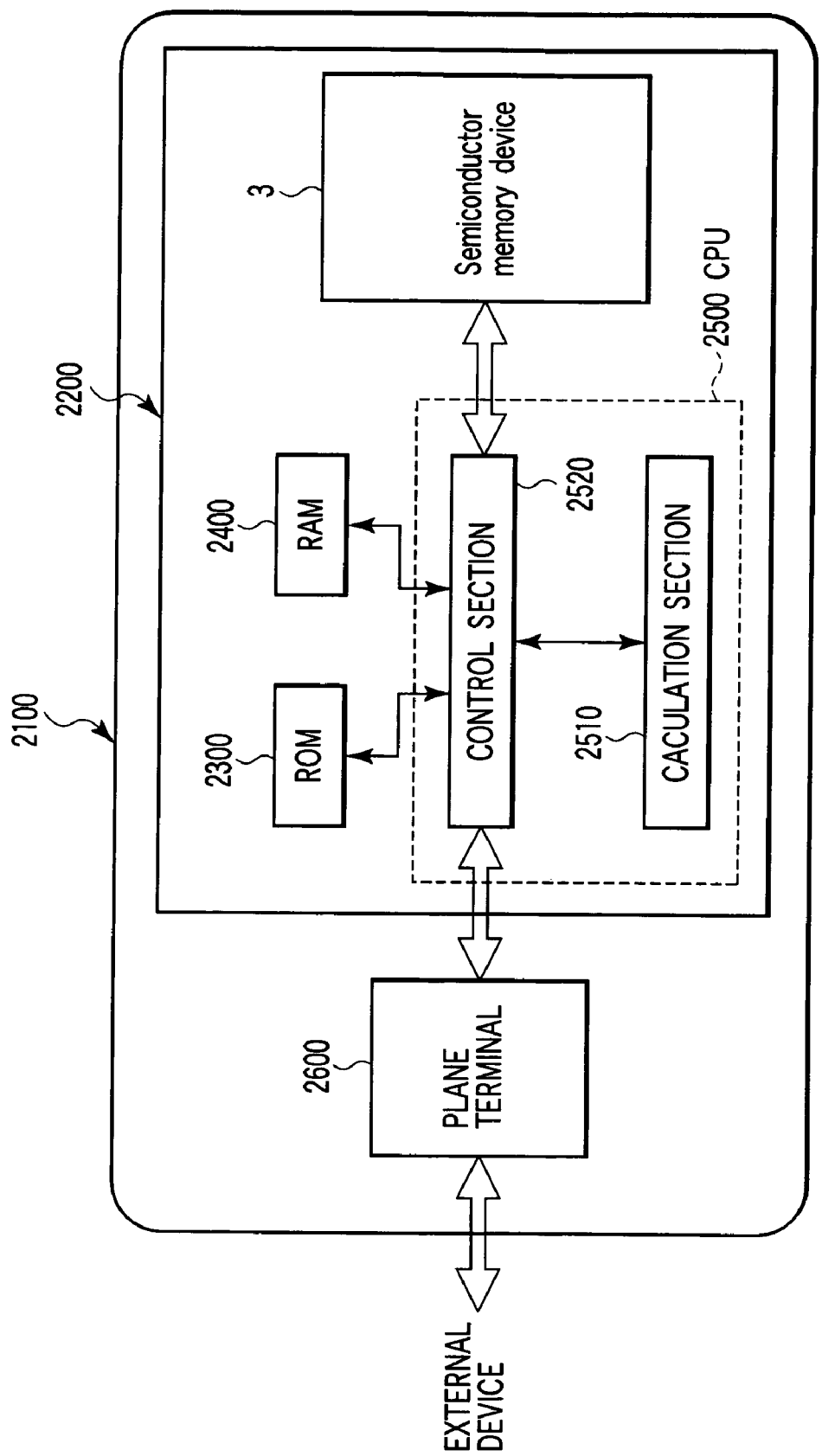
FIG. 62 is a block diagram of an IC card including a flash memory according to the first to sixth embodiments.

FIGS. 61 and 62 show another application. As shown in FIGS. 61 and 62, an IC card 2100 includes an MCU 2200. The MCU 2200 includes the flash memory 3 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of memory cells each of which includes a first MOS transistor having a charge accumulation layer and a control gate and a second MOS transistor having a drain connected to a source of the first MOS transistor;
a memory cell array in which the memory cells are arranged in a matrix on a semiconductor substrate;
bit lines each of which connects the drains of the first MOS transistors in a same column;
word lines each of which is formed by connecting commonly the control gates of the first MOS transistors in a same row;
select gate lines each of which is formed by connecting commonly the gates of the second MOS transistors in a same row;
a row decoder which selects any one of the word lines and any one of the select gate lines;
first metal wiring layers which are provided for the word lines in a one-to-one correspondence and which are electrically connected to the corresponding ones of the word lines and transmit a first row select signal for the row decoder to select one of the word lines;
an interlayer insulating film which is formed on the semiconductor substrate so as to cover the memory cells; and
metal wiring lines which are formed at a plurality of levels in the interlayer insulating film, the first metal wiring layers being made of the metal wiring lines located at the level of the lowest layer.

2. The semiconductor memory device according to claim 1, further comprising:
second metal wiring layers which are provided for the select gate lines in a one-to-one correspondence and which are electrically connected to the corresponding ones of the select gate lines and transmit a second row select signal for the row decoder to select one of the select gate lines,
wherein the memory cell array includes
a plurality of first regions each of which includes a plurality of columns of the memory cells, and
second regions each of which is provided between adjacent ones of the first regions and in which the word lines are connected to the first metal wiring layers and the select gate lines are connected to the second metal wiring layers.

3. The semiconductor memory device according to claim 1, wherein the gate of each of the second MOS transistors includes a first gate electrode layer formed on the semiconductor substrate with a gate insulating film interposed therebetween and a second gate electrode layer formed on the first gate electrode with an inter-gate insulating film interposed therebetween, the first gate electrode layer being connected to the second metal wiring layer and the second semiconductor layer being connected to ground potential.

4. The semiconductor memory device according to claim 1, further comprising
source line which connects commonly the sources of the second MOS transistors and which is made of the metal wiring line located at the same level as that of the first metal wiring layer.

5. The semiconductor memory device according to claim 1, wherein the memory cells arranged in a matrix in the memory cell array are arranged in such a manner that memory cells adjoining in the column direction share the drain of the first MOS transistor or the source of the second MOS transistor,
at least part of the source lines are formed above the sources of the MOS transistors so as to connect the sources of the second MOS transistors adjoining in the row direction to one another, and
two of the first metal wiring layers which adjoin one of the source lines sandwiched between the two layers have a plane pattern axisymmetric with the source line.

6. The semiconductor memory device according to claim 1, wherein the first metal wiring layers are made of material with resistance lower than that of the word lines and are connected to the word lines at a plurality of places.

7. The semiconductor memory device according to claim 2, wherein the row decoder includes a write decoder which is connected to the first and second metal wiring layers and outputs the first row select signal to the first metal wiring layers, and a select gate decoder which is connected to the second wiring layers and outputs the first row select signal to the second metal wiring layers, and
the write decoder, in a write operation, applies a positive voltage as the first row select signal to the first metal wiring layer corresponding to the selected word line and a negative voltage to the second metal wiring layers and, in a read operation, is electrically isolated from the second metal wiring layers, and the select gate decoder, in the read operation, applies a positive voltage as the second row select signal to the second metal wiring layer corresponding to the selected select gate line and, in a write operation, is electrically isolated from the second metal wiring layers.

8. A semiconductor memory device comprising:

a plurality of memory cells each of which includes a first MOS transistor having a charge accumulation layer and a control gate and into which data is written by injecting electrons into the charge accumulation layer;

a memory cell array in which the memory cells are arranged in a matrix on a semiconductor substrate;

bit lines each of which electrically connects commonly the drain regions of the first MOS transistors of the memory cells in a same column;

word lines each of which connects commonly the control gates of the first MOS transistors of the memory cells in a same row;

a row decoder which selects any one of the word lines;

first metal wiring layers which are provided for the word lines in a one-to-one correspondence and which are electrically connected to the corresponding ones of the word lines and transmit a row select signal for the row decoder to select one of the word lines; and an interlayer insulating film which is formed on the semiconductor substrate so as to cover the memory cells, and metal wiring lines which are formed at a plurality of levels in the interlayer insulating films, wherein the first metal wiring layers are made of the metal wiring lines located at the level of the lowest layer.

9. The semiconductor memory device according to claim 8, further comprising source line which connects commonly the source regions of two or more of the first MOS transistors and which are made of the metal wiring lines at the same level as that of the first metal wiring layers.

10. The semiconductor memory device according to claim 9, wherein the memory cells arranged in a matrix in the memory cell array are arranged in such a manner that memory cells adjoining in the column direction share the connection with the bit lines or the connection with the source lines, at least part of the source lines are formed so as to connect commonly the memory cells adjoining in the row direction, and two of the first metal wiring layers which adjoin one of the source lines sandwiched between the two layers have a plane pattern axisymmetric with the source line.

11. The semiconductor memory device according to claim 8, wherein each of the memory cells further includes a second MOS transistor having a drain connected to the source of the first MOS transistor, and select gate lines each of which is formed by connecting commonly the gates of the second MOS transistors in a same row.

12. The semiconductor memory device according to claim 11, further comprising:

second metal wiring layers which are provided for the select gate lines in a one-to-one correspondence and which are electrically connected to the corresponding ones of the select gate lines and transmit a second row select signal for the row decoder to select one of the select gate lines, wherein the memory cell array includes a plurality of first regions each of which includes a plurality of columns of the memory cells, and second regions each of which is provided between adjacent ones of the first regions and in which the word lines are connected to the first metal wiring layers and the select gate lines are connected to the second metal wiring layers.

13. The semiconductor memory device according to claim 11, wherein the gate of each of the second MOS transistors includes a first gate electrode layer formed on the semiconductor substrate with a gate insulating film interposed therebetween and a second gate electrode layer formed on the first gate electrode layer with an inter-gate insulating film interposed therebetween, the first gate electrode layer being connected to the second metal wiring layer and the second semiconductor layer being connected to ground potential.

14. The semiconductor memory device according to claim 12, wherein the row decoder includes a write decoder which is connected to the first and second metal wiring layers and outputs the first row select signal to the first metal wiring layer, and a select gate decoder which is connected to the second wiring layers and outputs the first row select signal to the second metal wiring layers, and the write decoder, in a write operation, applies a positive voltage as the first row select signal to the first metal wiring layer corresponding to the selected word line and a negative voltage to the second metal wiring layers and, in a read operation, is electrically isolated from the second metal wiring layers, and the select gate decoder, in the read operation, applies a positive voltage as the second row select signal to the second metal wiring layer corresponding to the selected select gate line and, in the write operation, is electrically isolated from the second metal wiring layers.

15. The semiconductor memory device according to claim 8, wherein each of the memory cells further includes a second MOS transistor having a drain connected to the corresponding one of the bit lines and a source connected to the drain of the first MOS transistor, a third MOS transistor having a drain connected to the source of the first MOS transistor, first select gate lines each of which is formed by connecting commonly the gates of the second MOS transistors in a same row, and second select gate lines each of which is formed by connecting commonly the gates of the third MOS transistors in a same row.

16. The semiconductor memory device according to claim 15, further comprising second metal wiring layers which are provided for the first select gate lines in a one-to-one correspondence and which are electrically connected to the corresponding ones of the first select gate lines and transmit a second row select signal for the row decoder to select one of the first select gate lines, and third metal wiring layers which are provided for the second select gate lines in a one-to-one correspondence and which are electrically connected to the corresponding ones of the second select gate lines and transmit a third row select signal for the row decoder to select one of the second select gate lines, wherein the memory cell array includes a plurality of first region each of which includes a plurality of columns of the memory cells, and second regions each of which is provided between adjacent ones of the first regions and in which the word lines are connected to the first metal wiring layers, the first select gate lines are connected to the second metal wiring layers, and the second select gate lines are connected to the third metal wiring layers.

17. The semiconductor memory device according to claim 15, wherein the gate of each of the second MOS transistors includes a first gate electrode layer formed on the semiconductor substrate with a gate insulating film interposed therebetween and a second gate electrode layer formed on the first semiconductor layer with an inter-gate insulating film interposed therebetween, the gate of each of the third MOS transistors includes a third gate electrode layer formed on the semiconductor substrate with a gate insulating film interposed therebetween and a fourth gate electrode layer formed on the third gate electrode layer with an inter-gate insulating film interposed therebetween, and the first semiconductor layer is connected to the second metal wiring layer, the third gate electrode layer is connected to the third metal wiring layer, and the second and fourth gate layers are connected to ground potential.

18. A memory card comprising a semiconductor memory device recited in claim 1.

19. The memory card according to claim 18, further comprising a control device which controls the semiconductor memory device.

* * * * *